US011014816B2

(12) United States Patent
Tour et al.

(10) Patent No.: US 11,014,816 B2
(45) Date of Patent: May 25, 2021

(54) LASER-INDUCED GRAPHENE (LIG) AND LASER INDUCED GRAPHENE SCROLLS (LIGS) MATERIALS

(71) Applicant: WILLIAM MARSH RICE UNIVERSITY, Houston, TX (US)

(72) Inventors: James M. Tour, Bellaire, TX (US); Duy X. Luong, Houston, TX (US); Ajay Subramanian, Fort Collins, CO (US)

(73) Assignee: William Marsh Rice University, Houston, TX (US)

(*) Notice: Subject to any disclaimer, the term of this patent is extended or adjusted under 35 U.S.C. 154(b) by 0 days.

(21) Appl. No.: 16/312,837

(22) PCT Filed: Jun. 21, 2017

(86) PCT No.: PCT/US2017/038574
§ 371 (c)(1),
(2) Date: Dec. 21, 2018

(87) PCT Pub. No.: WO2017/223217
PCT Pub. Date: Dec. 28, 2017

(65) Prior Publication Data

US 2020/0002174 A1 Jan. 2, 2020

Related U.S. Application Data

(60) Provisional application No. 62/352,744, filed on Jun. 21, 2016.

(51) Int. Cl.
*C01B 32/184* (2017.01)
*C01B 32/18* (2017.01)
*C08G 73/10* (2006.01)
*H01M 4/62* (2006.01)
*B01D 71/02* (2006.01)
*H01G 11/36* (2013.01)
*H01M 4/96* (2006.01)

(52) U.S. Cl.
CPC ............ *C01B 32/184* (2017.08); *C01B 32/18* (2017.08); *C08G 73/10* (2013.01); *H01M 4/625* (2013.01); *B01D 71/021* (2013.01); *B01D 2323/34* (2013.01); *H01G 11/36* (2013.01); *H01M 4/96* (2013.01)

(58) Field of Classification Search
CPC ....... C01B 32/18; C01B 32/184; C08G 73/10; H01M 4/96; H01M 4/625; H01G 11/36; B01D 2323/34; B01D 71/021
See application file for complete search history.

(56) References Cited

PUBLICATIONS

Ye, Xiaohui, et al. "Direct laser fabrication of large-area and patterned graphene at room temperature." Carbon 68 (2014): 784-790.*

(Continued)

*Primary Examiner* — Richard M Rump
(74) *Attorney, Agent, or Firm* — Dickinson Wright PLLC; Ross Spencer Garsson

(57) ABSTRACT

Laser-induced graphene (LIG) and laser-induced graphene scrolls (LIGS) materials and, more particularly to LIGS, methods of making LIGS (such as from polyimide (PI)), laser-induced removal of LIG and LIGS, and 3D printing of LIG and LIGS using a laminated object manufacturing (LOM) process.

29 Claims, 72 Drawing Sheets

(56) References Cited

PUBLICATIONS

Lin, Jian, et al. "Laser-induced porous graphene films from commercial polymers." Nature communications 5.1 (2014): 1-8.*

Jian Lin; Laser-induced porous graphene films from commercial polymers; Jun. 10, 2015, XP055405756, Retrieved from the Internet: URL:https://www.ncbi.nlm.nih.gov/pmc/artic les/PMC4264682; 11 pages.

R. Sahin; Nanoscale patterning of graphene through femtosecond laser ablation; Applied Physics Letters, vol. 104, No. 5, Feb. 7, 2014, XP012181720, ISSN: 0003-6951, DOI: 10.1063/1.4864616; 4 pages.

Clifford Lekahena; International Search Report and Written Opinion; PCT/US2017/038574; dated Sep. 18, 2017; 17 pages.

Athina Nickitas-Etienne; International Preliminary Report on Patentability; PCT/US2017/038574; dated Jan. 3, 2019; 12 pages.

* cited by examiner

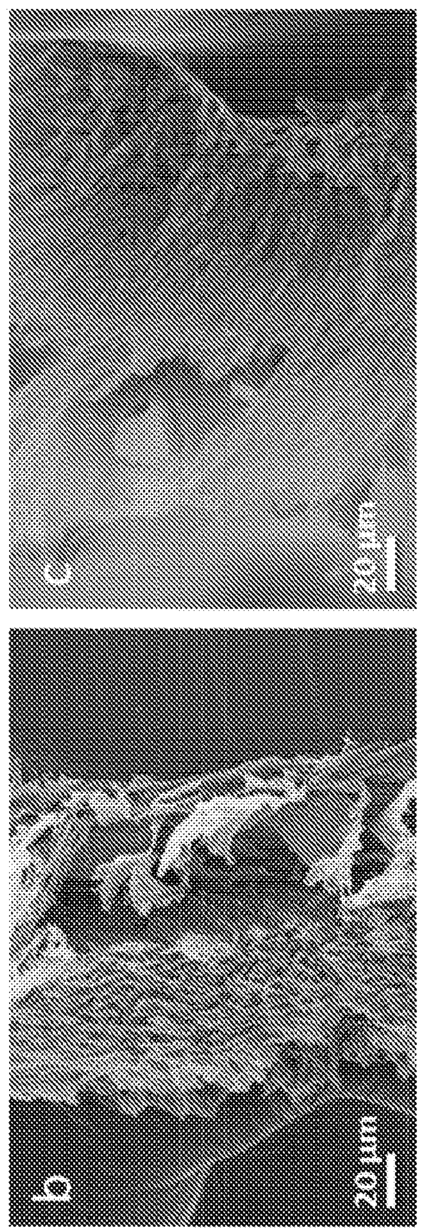
FIG. 7B
FIG. 7C
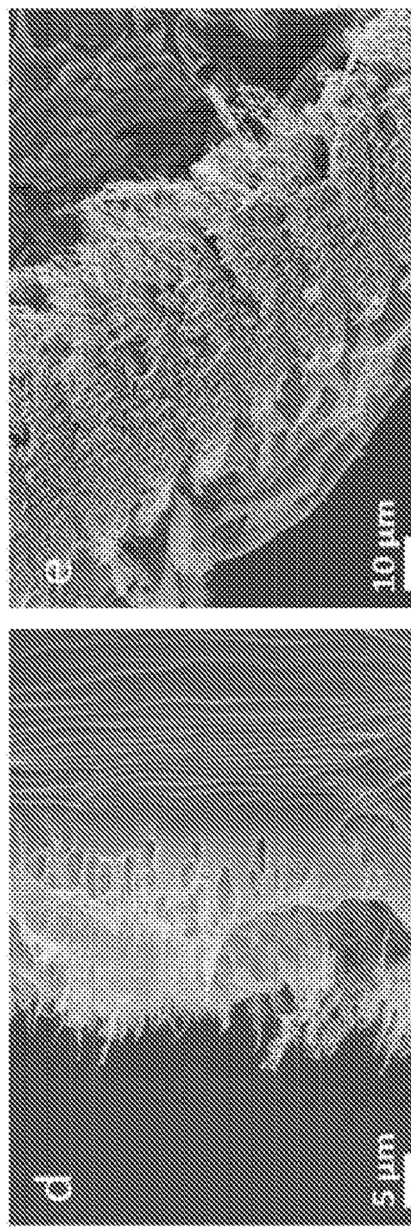
FIG. 7D
FIG. 7E

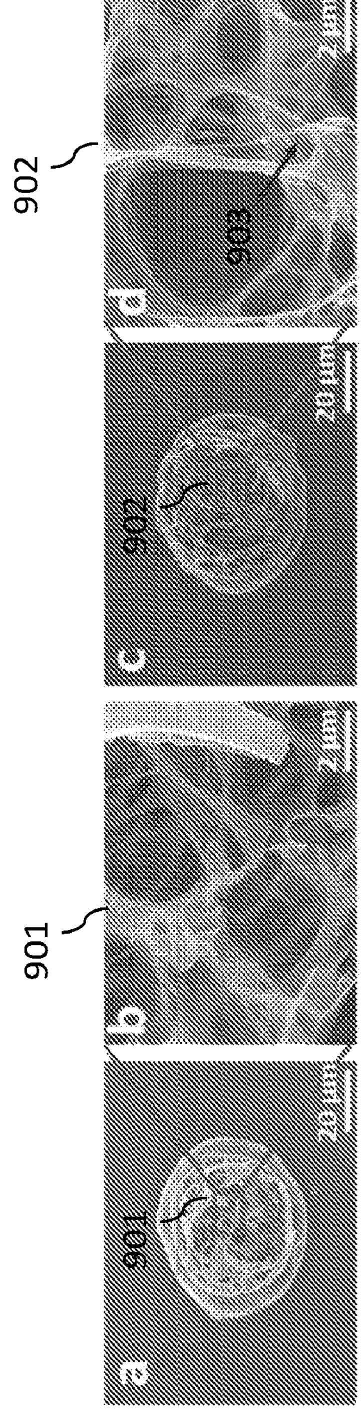
FIG. 9A
FIG. 9B
FIG. 9C
FIG. 9D
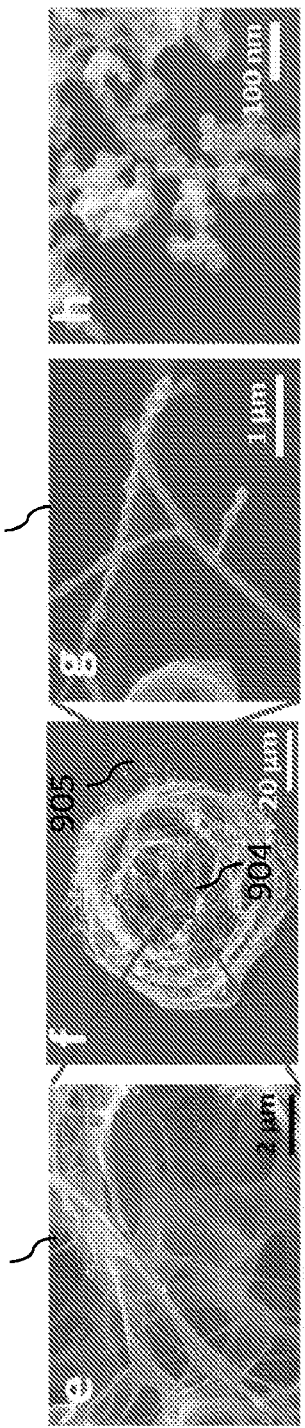
FIG. 9E
FIG. 9F
FIG. 9G
FIG. 9H

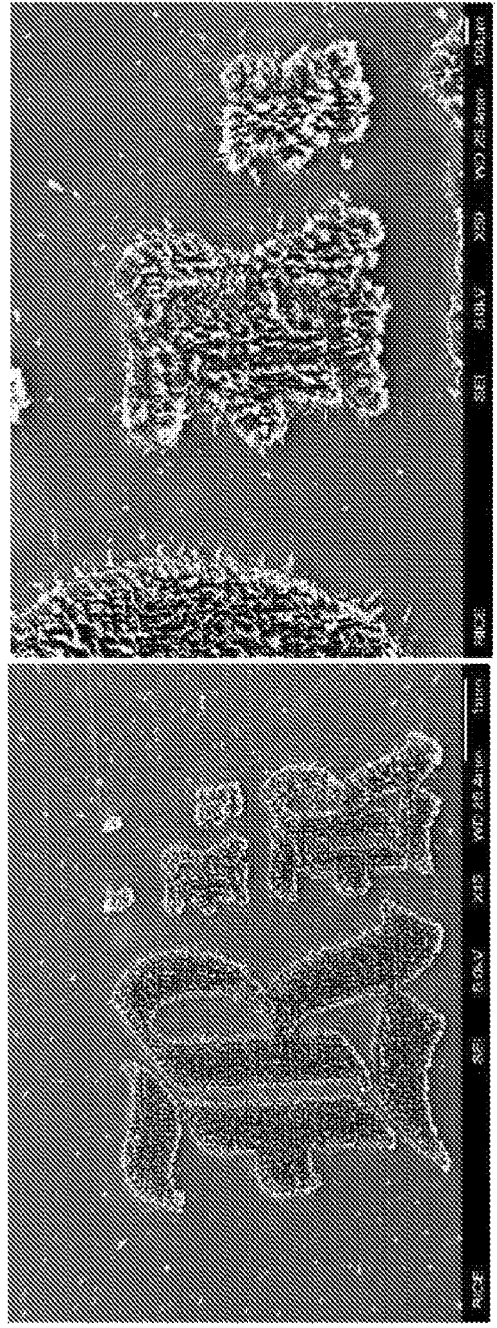
FIG. 24A
FIG. 24B
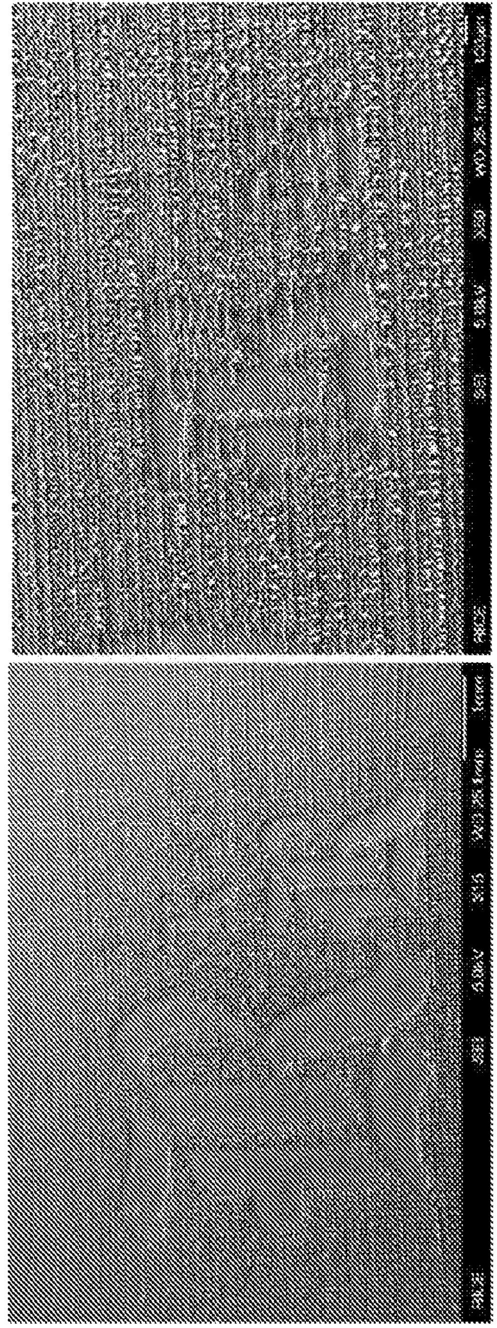
FIG. 24C
FIG. 24D

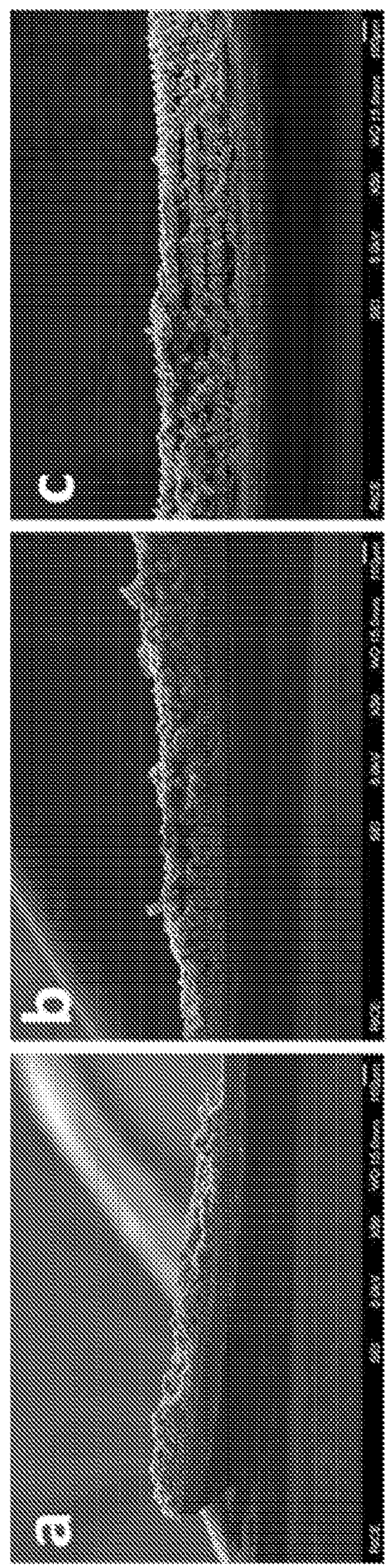
FIG. 27A
FIG. 27B
FIG. 27C
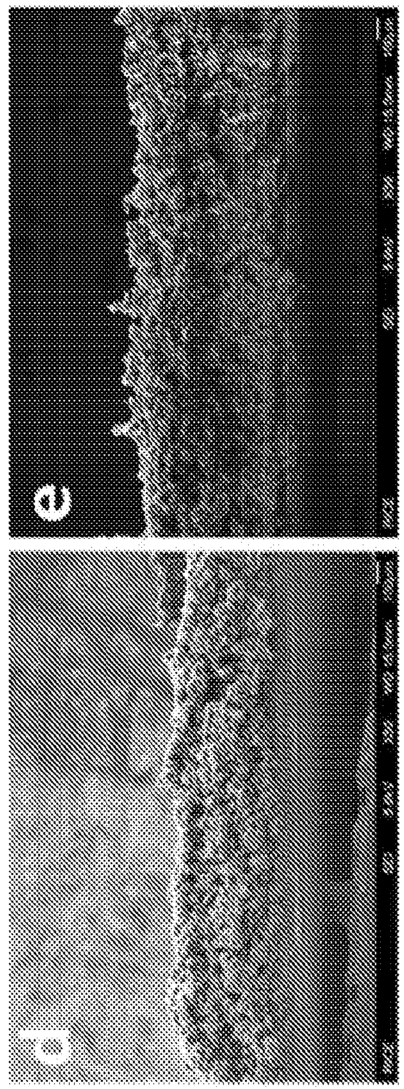
FIG. 27D
FIG. 27E

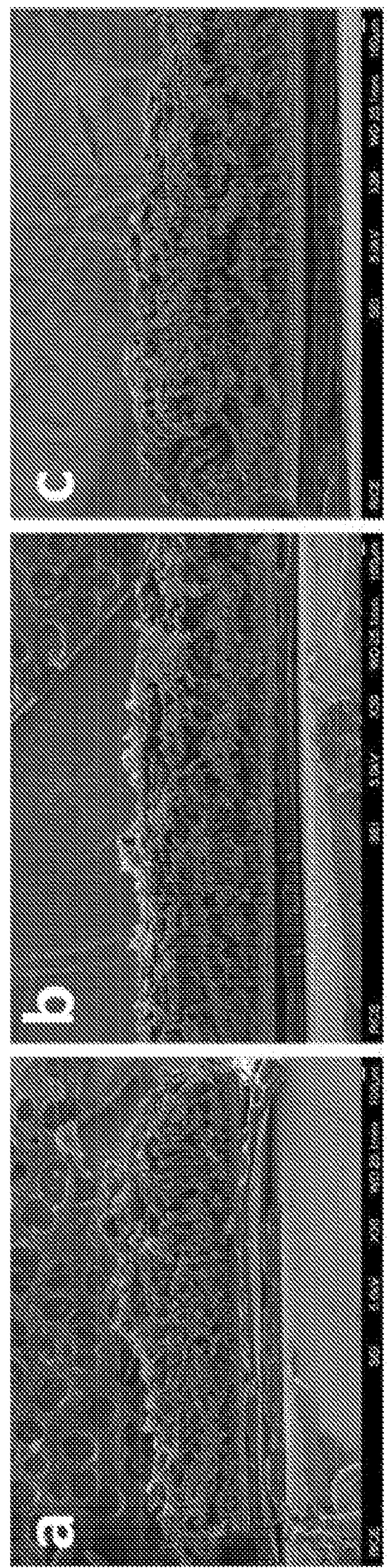
FIG. 29A
FIG. 29B
FIG. 29C
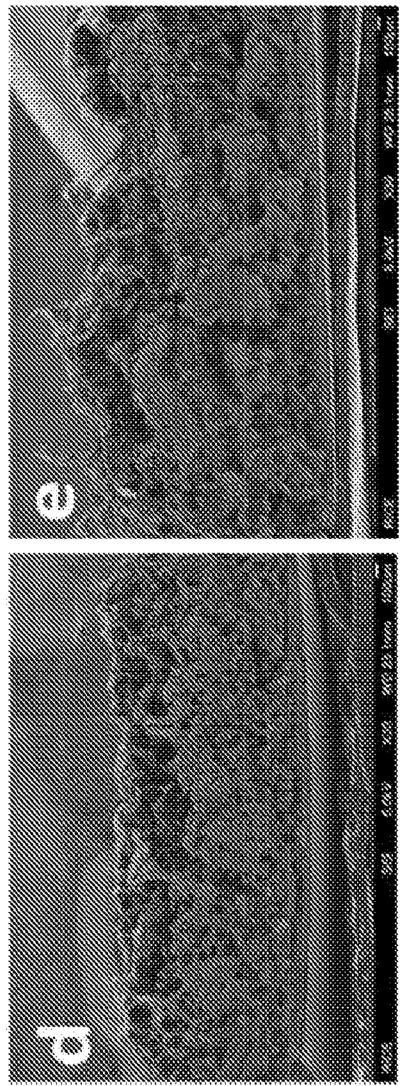
FIG. 29D
FIG. 29E

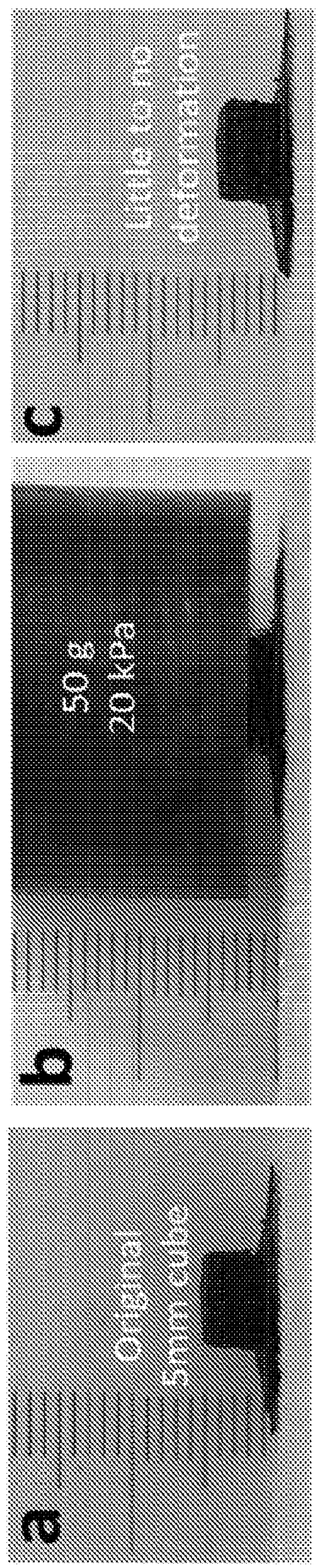
FIG. 31A
FIG. 31B
FIG. 31C
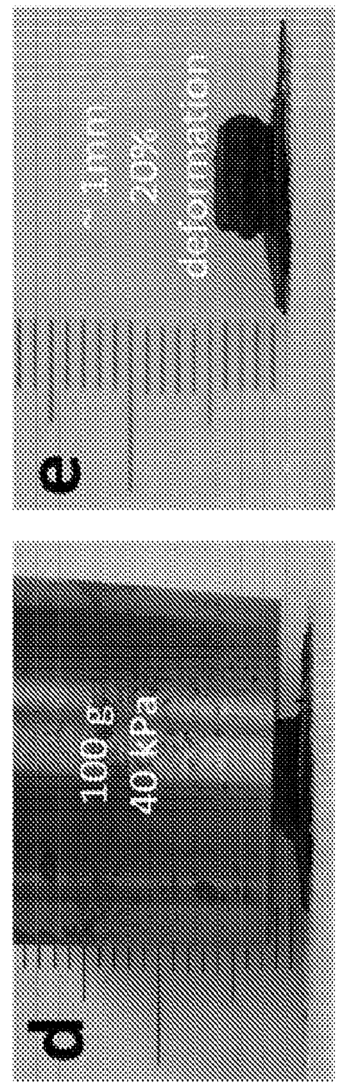
FIG. 31D
FIG. 31E

FIG. 33

LASER-INDUCED GRAPHENE (LIG) AND LASER INDUCED GRAPHENE SCROLLS (LIGS) MATERIALS

CROSS-REFERENCE TO RELATED PATENT APPLICATIONS

This application is the 35 U.S.C § 371 national application of International PCT Application No. PCT/US17/38574, filed on Jun. 21, 2017, entitled "Laser-Induced Graphene (Lig) And Laser-Induced Graphene Scrolls (Ligs) Materials," which designated the U.S., and which claims priority to U.S. Patent Appl. Ser. No. 62/352,744, filed Jun. 21, 2016, entitled "Laser-Induced Graphene Nanoscrolls (LIGS) From Polyimide (PI)," which patent applications are commonly owned by the owner of the present invention.

This application is also related to PCT Patent Application No. PCT/US2015/062832, filed on Nov. 27, 2015, entitled "Laser Induced Graphene Hybrid Materials For Electronic Devices," (which published as PCT Patent Publ. No. WO/2016/13351 on Aug. 25, 2016) ("the Tour '351 PCT Application") and PCT Patent Application No. PCT/US2015/016165, filed on Feb. 17, 2015, entitled "Laser Induced Graphene Materials And Their Use In Electronic Devices," (which published as PCT Patent Publ. No. WO/2015/175060 on Nov. 19, 2015) ("the Tour '060 PCT Application").

These patent applications are hereby incorporated by reference in their entirety for all purposes.

GOVERNMENT INTEREST

This invention was made with government support under Grant Nos. FA9550-14-1-0111 and FA9550-12-1-0035, awarded by the United States Department of Defense/Air Force Office of Scientific Research. The government has certain rights in the invention.

FIELD OF INVENTION

The present invention relates to laser-induced graphene (LIG) and laser-induced graphene scrolls (LIGS) materials and, more particularly to LIGS, methods of making LIGS (such as from polyimide (PI)), laser-induced removal of LIG and LIGS, and 3D printing of LIG and LIGS using a laminated object manufacturing (LOM) process.

BACKGROUND OF INVENTION

The discovery of carbon based nanomaterials such as the fullerenes [Kyoto 1985], carbon nanotubes (CNTs) [Iijima 1991], and graphene [Novoselov 2013] has led to large investments in carbon-based nanotechnology research. Carbon nanomaterials have been extensively studied, revealing their outstanding chemical, physical, electrical, mechanical, optical, and thermal properties, many of which are not possible to achieve using other materials [De Voider 2013; Zhang 2013; Jariwala 2013; Baughman 2002; Allen 2009]. Because of their extraordinary performances, these carbon nanomaterials have been widely used in numerous applications such as in transistors [Cao 2013; Liu 2014; Schweirz 2010; Heinze 2002], biological and chemical sensors [Shao 2010; Rodrigo 2015], energy generation/storage devices [Ren 2013; Habisreutinger 2014; Bonaccorso 2015; El-Kady 2013; Yoo 2008; Kaempgen 2009], and polymer nanocomposites [Mittal 2015; Hu 2014].

In order to fully realize their potential in different applications, various derivatives and morphologies of these carbon nanomaterials have been developed such as graphene oxide (GO) [Marcano 2010], vertically aligned CNTs [Hata 2004], and graphene nanoribbons (GNRs) [Kosynkin 2009]. Additionally, synthesis of these carbon nanomaterials from inexpensive precursors [Yan 2012] using cost-effective processes [Yan 2011] is highly desired for industrial production. Recently, inventors of the present invention developed a simple and effective method to make porous graphene from commercial available polyimide (PI) sheets by laser induction under ambient conditions [Lin 2014]. In these studies, the resulting product, laser-induced graphene (LIG), was found to contain few-layer graphene with high electrical conductivity, high thermal stability, high thermal conductivity [Smith 2016] and outstanding electrochemical performance. Wetting properties of LIG can be alternated from superhydrophobic to superhydrophilic by conducting the laser process under different controlled atmospheres [Li 2017]. A major application of LIG is for microsupercapacitors (MSCs) that have an in-plane interdigitated shape or sandwiched structure [Peng 2015 A]. The capacitance of the first generation of LIG-MSCs was 4 mF/cm$^2$, comparable to other carbon based MSCs. Follow-up studies increased the capacitance to 16 mF/cm$^2$ by the use of a solid-state electrolyte and boron doping [Peng 2015 B]. Additional research introduced pseudocapacitive materials into LIG devices by electrochemical deposition, and the capacitance value further increased to 950 mF/cm$^2$ [Li 2016]. Another application of metal-salt-containing PI films resulted in LIG that contained metal oxide nanoparticles suitable as oxygen reduction reaction (ORR) catalysts [Ye 2015].

Before the development of LIG, carbonization of PI was shown to afford a porous structure by ultraviolet exposure [Schumann 1991; Srinivasan 1994], but graphene was not disclosed and there have been no studies on the parameters required to afford the various possible morphologies. Accordingly, a desire for parameters for the controlled formation of varying LIG morphologies remains.

SUMMARY OF INVENTION

A new form of LIG nanomaterials, namely, laser-induced graphene scrolls ("LIGS"), has been discovered. The present invention also relates to methods of making LIGS (such as from polyimide (PI)).

The present invention further relates to a new process for laser-induced removal of LIG, partially or completely, such as with 50 W 1.06 μm wavelength fiber laser.

The present invention further relates to a new process for 3D printing of LIG and LIGS using a laminated object manufacturing (LOM) process.

In general, in one embodiment, the invention features a method that includes exposing a graphene precursor material to a laser source to form laser-induced graphene scrolls (LIGS) material. The LIGS material is derived from the graphene precursor material.

Implementations of the invention can include one or more of the following features:

The graphene precursor material can include a polymer.

The polymer can be selected from a group consisting of polymer films, polymer fibers, polymer monoliths, polymer powders, polymer blocks, optically transparent polymers, homopolymers, vinyl polymers, chain-growth polymers, step-growth polymers, condensation polymers, random polymers, ladder polymers, semi-ladder polymers, block co-polymers, carbonized polymers, aromatic polymers, cyclic polymers, doped polymers, polyimide (PI), polyetherimide (PEI), polyether ether ketone (PEEK), polyamide (PA), polybenzoxazole (PBO), polyaramids, and polymer composites and combinations thereof.

The polymer can include polyimide.

The step of exposing can include tuning one or more parameters of the laser source.

The tuning of the one or more parameters of the laser source can include modifying the laser wavelength so that the laser wavelength is at an absorption band of the graphene precursor material.

The one or more parameters of the laser source can be selected from a group consisting of laser wavelength, laser power, laser energy density, laser pulse width, gas environment, gas pressure, gas flow rate, direction of gas flow relative to the lasing head, and combinations thereof.

The laser source can be a $CO_2$ laser source.

The laser source can have a wavelength ranging from about 20 nm to about 100 μm.

The laser source can include near-field scanning optical microscopy.

The laser source can include a laser having a beam that is diffused with a lens or series of lenses.

The laser can have a high powered beam that can cover an exposed area that is a large area or line such that the diffused energy has a fluence capable to form the LIGS over the entire exposed area.

The laser having the high powered beam can be at least a 1 MegaWatt laser.

The laser source can have a power ranging from about 1 W to about 100 W.

The polymer can include a doped polymer.

The doped polymer can include a dopant selected from a group consisting of heteroatoms, metals, metal oxides, metal chalcogenides, metal nanoparticles, metal salts, organic additives, inorganic additives, metal organic compounds, and combinations thereof.

The polymer can include a boron doped polymer.

The LIGS material can be a porous material.

The LIGS material can include a doped LIGS material.

The doped graphene can include a dopant selected from a group consisting of heteroatoms, metals, metal oxides, metal nanoparticles, metal chalcogenides, metal salts, organic additives, inorganic additives, and combinations thereof.

The laser source can have a laser fluence of at least about 20 J/cm$^2$. The laser source can have a wavelength of at least about 9.3 μm.

The laser source can have a laser fluence of more than about 40 J/cm$^2$. The laser source can have a wavelength of at least about 10.6 μm.

The laser source can have a laser fluence of more than about 40 J/cm$^2$.

The laser fluence can be from about 40 J/cm$^2$ to about 200 J/cm$^2$.

The laser fluence can be from about 80 J/cm$^2$ to about 170 J/cm$^2$.

The LIGS material can have a thickness of at least about 20 μm.

The thickness of the LIGS material can be at least about 30 μm.

The thickness of the LIGS material can be at least about 100 μm.

The thickness of the LIGS material can be at least about 500 μm.

The thickness of the LIGS material can be at least about 1 mm.

The LIGS material can include nanoscrolls of graphene having an average diameter in a range from about 10 nm to about 500 nm.

The average diameter can be in the range from about 20 nm to about 100 nm.

The laser source can have a wavelength in the range between 9 μm and 11 μm.

The LIGS material can be formed in a one-step laser thermolysis process at a radiation level of at least about 20 J/cm$^2$.

The LIGS material can be formed in a one-step laser thermolysis process at a radiation level of at least about 40 J/cm$^2$.

The laser source can be being operable above its critical fluence point needed to initiate carbonization of the graphene precursor material.

The critical fluence point of the laser can be at least about 5 J/cm$^2$.

The laser source can have a wavelength at least about 10.6 μm and a critical fluence point at least about 4.9 J/cm$^2$.

The laser source can have a wavelength at least about 9.3 μm and a critical fluence point at least about 2.1 J/cm$^2$.

The laser source can be a laser that is being operated in raster mode.

The laser source can be a laser that is being operated in vector mode.

The laser source can have a pulse density such that the pulses do not overlap.

The method can further include a step of incorporating the LIGS material into an electronic device.

The electronic device can include an electrode comprising the LIGS material.

The electronic device can be a flexible electronic device.

The electronic device can be an energy storage device or an energy generation device.

The electronic device can be selected from a group consisting of supercapacitors, micro-supercapacitors, pseudo capacitors, batteries, micro batteries, lithium-ion batteries, sodium-ion batteries, magnesium-ion batteries, electrodes, conductive electrodes, sensors, lithium ion capacitors, photovoltaic devices, electronic circuits, fuel cell devices, thermal management devices, biomedical devices, and combinations thereof.

The electronic device can be a micro-supercapacitor.

The step of incorporating can include stacking a plurality of LIGS materials. The stacking can result in formation of a vertically stacked electronic device.

The step of incorporating can result in formation of at least one of vertically stacked electronic devices, in-plane electronic devices, symmetric electronic devices, asymmetric electronic devices, and combinations thereof.

The LIGS material can be utilized as at least one of an electrode, current collector, or additive in the electronic device.

The method can further include a step of associating the electronic device with an electrolyte.

The electrolyte can be selected from a group consisting of solid state electrolytes, liquid electrolytes, aqueous electrolytes, organic salt electrolytes, ion liquid electrolytes, and combinations thereof.

The electrolyte can be a solid state electrolyte.

In general, in another embodiment, the invention features a material that includes a plurality of concentric nanoscrolls of graphene.

Implementations of the invention can include one or more of the following features:

The nanoscrolls of graphene can have an average diameter in a range from about 10 nm to about 500 nm.

The average diameter can be in the range from about 20 nm to about 100 nm.

In general, in another embodiment, the invention features a LIGS material made by a method set forth above.

In general, in another embodiment, the invention features an electronic device made by a method set forth above.

In general, in one embodiment, the invention features a method that includes selecting a laser-induce material selected from a group consisting of laser-induced graphene (LIG) materials, laser-induced graphene scrolls (LIGS) materials, and combinations thereof (LIG/LIGS materials). The method further includes exposing the laser-induced material to a first laser source having a first wavelength to remove a first portion of LIG or LIGS from the laser-induced material.

Implementations of the invention can include one or more of the following features:

The laser-induced material can be formed by exposing a graphene precursor material to a second laser source having a second wavelength. The first wavelength and the second wavelength can be different.

The first wavelength can be less than 2 μm. The second wavelength can be greater than 5 μm.

The removal of the first portion of the LIG or LIGS from the laser-induced material can be performed in a predetermined pattern.

The method can further include re-exposing the laser-induced material to the first laser source to remove a second portion of the LIG or the LIGS from the laser-induced material.

The method can create a gap or trench in the laser-induced material. The gap or trench in the laser-induced material can divide laser-induced material into a first part and a second part that are not electronically connected to one another with the LIG or LIGS in the laser-induced material.

The gap or trench can be at least about 40 μm in width.

The gap or trench can be between about 40 μm and about 100 μm in width.

The laser-induced material can be formed by exposing a graphene precursor material to a second laser source and conductivity between the first part and the second part is around the same as conductivity of the graphene precursor material.

The first wavelength can be about 1.06 μm.

The laser-induce material can include a LIG material.

The laser-induce material can include a LIGS material.

The laser-induce material can include a composite LIG/LIGS material.

The method can form a 3D object.

The step of selecting a laser-induce material can include selecting a laser-induced material that is entirely coated with LIG, LIGS, or both. The step of exposing the laser-induced material to a first laser source can selectively remove multiple regions of the LIG, LIGS, or both from the laser-induced material to form the 3D object.

The step of selecting a laser-induce material can include selecting a material that is entirely coated with LIG, LIGS, or both. The step of exposing the laser-induced material to a first laser source can selectively remove the LIG, LIGS, or both from the laser-induced material to form the 3D object.

The graphene precursor material can include a polymer.

The polymer can be selected from a group consisting of polymer films, polymer fibers, polymer monoliths, polymer powders, polymer blocks, optically transparent polymers, homopolymers, vinyl polymers, chain-growth polymers, step-growth polymers, condensation polymers, random polymers, ladder polymers, semi-ladder polymers, block co-polymers, carbonized polymers, aromatic polymers, cyclic polymers, doped polymers, polyimide (PI), polyetherimide (PEI), polyether ether ketone (PEEK), polyamide (PA), polybenzoxazole (PBO), polyaramids, and polymer composites and combinations thereof.

The method can further include a step of incorporating the laser-induced material into an electronic device, after the step of exposing the laser-induced material to the first laser source.

In general, in one embodiment, the invention features a laser-induced material made by a method set forth above.

In general, in one embodiment, the invention features an electronic device made by a method set forth above.

In general, in one embodiment, the invention features a methods to produce an object. The method is a laminated object manufacturing process. The object is an LIG, LIGS, or LIG/LIGS object.

In general, in one embodiment, the invention features a method. The method includes selecting a first substrate having a first laser-induce material disposed on a first side of the first substrate. The first substrate is a first graphene precursor material that can be formed in to the first laser-induced material. The first laser-induced material is selected from a group consisting of laser-induced graphene (LIG), laser-induced graphene scrolls (LIGS) materials, and combinations thereof (LIG/LIGS). The method further includes selecting a second substrate having a first side and a second side. The second substrate is a second graphene precursor material that can be formed in to a second laser-induced material. The second laser-induced material is selected from a group consisting of LIG, LIGS, and LIG/LIGS. The method further includes contacting the first laser-induced material on the first side of the first substrate with the first side of the second substrate. The method further includes exposing the second side of the second substrate to a first laser source to form a layer of the second laser-induced material upon the first laser-induced material.

Implementations of the invention can include one or more of the following features:

Before contacting the first laser-induced material to the first side of the second substrate, the method can further include a step of depositing a wetting liquid on one or both of (i) the first laser-induced material on the first side of the first substrate and (ii) the first side of the second substrate.

The second substrate can have the second laser-induce material disposed on the first side of the second substrate before contacting the first laser-induced material to the first side of the second substrate.

The second substrate can have the second laser-induce material disposed on the first side of the second substrate before contacting the first laser-induced material to the first side of the second substrate.

The method can be a laminated object manufacturing process.

The step of selecting a first substrate having a first laser-induce material disposed on a first side of the first substrate can include selecting the first substrate and exposing the first substrate to a second laser source to form the first laser-induce material disposed on the first side of the first substrate.

The second substrate can be a thin second substrate having a thickness of at most about 0.005 inches.

The thickness of the second substrate can be at most about 0.001 inches.

The thickness of the second substrate can be at most 3 mm.

The thickness of the second substrate can be at most 1 mm.

The step of selecting a second substrate, contacting, and exposing can be repeated to form additional layers.

At least ten layers can be formed.

The first graphene precursor material can be a first polymer. The second graphene precursor material can be a second polymer. The first polymer and the second polymer can be the same polymer or different polymers.

Each of the first polymer and the second polymer can be selected from a group consisting of polymer films, polymer fibers, polymer monoliths, polymer powders, polymer blocks, optically transparent polymers, homopolymers, vinyl polymers, chain-growth polymers, step-growth polymers, condensation polymers, random polymers, ladder polymers, semi-ladder polymers, block co-polymers, carbonized polymers, aromatic polymers, cyclic polymers, doped polymers, polyimide (PI), polyetherimide (PEI), polyether ether ketone (PEEK), polyamide (PA), polybenzoxazole (PBO), polyaramids, and polymer composites and combinations thereof.

The wetting solution can include ethylene glycol and water.

The wetting solution can include a solution of water and at least one of ethylene glycol, propylene glycol, and glycerin.

The second laser-induced material can be LIG. The first laser source can have a duty cycle that is between about 1.5% and about 2%.

The second laser-induced material can be LIGS. The first laser source can have a duty cycle that is between about 10% and about 15%.

The method can further include a step of annealing to remove the wetting liquid.

The step of annealing can be at a temperature of at least 170° C. for 30 minutes in air.

One or both of the first substrate and the second substrate can further include carbon nanotubes.

The method can fabricate a 3D graphene object.

The 3D graphene object can have a thickness of at least 1 mm.

The 3D graphene object can have a mass of at least about 3.5 mg. The 3D graphene object can have a porosity of at least about 1.3%.

The 3D graphene object can be capable of having a 20 kPa stress applied in a first direction without any permanent deformation of the 3D graphene object.

The 3D graphene object can maintain the original porous structure of the LIG and LIGS in the 3D graphene object.

One or both of the first substrate and the second substrate can further include carbon nanotubes.

The carbon nanotubes can be operable to reinforce the 3D graphene object.

The 3D object can be selected from the group consisting of mechanical dampeners, conductive mechanical dampeners, heat conduction blocks, lightweight conductive blocks, templates for growth of biological cells, and composites for bone and neuron growth.

The biological cells can be eukaryote or plant cells.

The method can further include a step of incorporating the 3D graphene object into an electronic device.

The electronic device can be selected from a group consisting of super capacitors, micro-supercapacitors, pseudo capacitors, batteries, micro batteries, lithium-ion batteries, sodium-ion batteries, magnesium-ion batteries, electrodes, conductive electrodes, sensors, lithium ion capacitors, photovoltaic devices, electronic circuits, fuel cell devices, thermal management devices, biomedical devices, and combinations thereof.

The electronic device can be a micro-supercapacitor.

In general, in one embodiment, the invention features a 3D graphene object made by a method set forth above.

In general, in another embodiment, the invention features the 3D graphene object set forth above.

In general, in another embodiment, the invention features the electronic device set forth above.

In general, in another embodiment, the invention features a method that includes a first process and a second process. The first process is a method to make a laser-induced material. The first process includes selecting a first substrate having a first laser-induce material disposed on a first side of the first substrate. The first substrate is a first graphene precursor material that can be formed in to the first laser-induced material. The first laser-induced material is selected from a group consisting of laser-induced graphene (LIG), laser-induced graphene scrolls (LIGS) materials, and combinations thereof (LIG/LIGS). The first process further includes selecting a second substrate having a first side and a second side. The second substrate is a second graphene precursor material that can be formed in to a second laser-induced material. The second laser-induced material is selected from a group consisting of LIG, LIGS, and LIG/LIGS. The first process further includes contacting the first laser-induced material on the first side of the first substrate with the first side of the second substrate. The first process further includes exposing the second side of the second substrate to a first laser source to form a layer of the second laser-induced material upon the first laser-induced material. The second process is a method to remove a first portion of LIG or LIGS from the laser induced material. The second process includes the step of selecting the laser-induce material made from the first process. The laser induced material is selected from a group consisting of LIG materials, LIGS materials, and LIG/LIGS materials. The second process further includes exposing the laser-induced material to a second laser source having a first wavelength to remove a first portion of LIG or LIGS from the laser-induced material.

Implementations of the invention can include one or more of the following features:

The second process can be a method to remove a first portion of LIG or LIGS from the laser induced material set forth above.

The first process can be a method to make a laser-induced material set forth above.

The method further includes a step of incorporating the 3D graphene object into an electronic device.

In general, in another embodiment, the invention features a 3D graphene object made by the method set forth above.

In general, in one embodiment, the invention features the electronic device set forth above.

The foregoing has outlined rather broadly the features and technical advantages of the invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the invention. It should also be realized by those skilled in the art that such equivalent constructions do not depart from the spirit and scope of the invention as set forth in the appended claims.

It is also to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

FIGS. 1C-1H are SEM images of: (FIG. 1C) LIG induced by 117 J/cm$^2$ laser fluence made at 1000 PPI image density setting; (FIG. 1D) 500 PPI, 46 J/cm$^2$ LIGS surface; (FIG. 1E) LIGS of FIG. 1F at higher magnification; (FIG. 1F) 166 J/cm$^2$ LIGS with thickness of ~1 mm made at 500 PPI image density setting; (FIG. 1G) LIG at the interface of LIGS and PI (shown in higher magnification of FIG. 1F); and (FIG. 1H) "R" shape patterned LIGS. Insets of FIGS. 1C and 1F are schematics for 1000 PPI and 500 PPI, respectively.

FIGS. 7B-7C are SEM images of the edge of the starting cut. FIG. 7B is a view from the z direction. FIG. 7C is a view from the x direction. (The growth direction of the LIG/LIGS in the starting cut is z).

FIG. 7D-7E are SEM images of the edge of the ending cut. FIG. 7D is a view from the z direction. FIG. 7E is a view from x direction. (The growth direction of LIG/LIGS in the starting cut is x).

FIGS. 9A-9H are SEM images of PI samples as the laser fluence was increased, with FIGS. 9A-9B at 3.5 J/cm$^2$; FIG. 9C-9D at 4.0 J/cm$^2$; and FIG. 9E-9H at 5.8 J/cm$^2$. The laser induction is performed with a 10.6 μm 75 W laser in vector mode.

FIGS. 10C-10D at 4.0 J/cm$^2$; FIGS. 10E-10F at 4.4 J/cm$^2$; FIGS. 10G-10H at 4.6 J/cm$^2$; and FIGS. 10I-10L at 5.8 J/cm$^2$. Scale bars for FIGS. 10A, 10C, 10E and 10G are 20 μm. Scale bars for FIGS. 10B, 10D, 10F, 10H and 10I are 2 μm. Scale bar for FIG. 10K is 1 μm. Scale bare for FIG. 10L is 100 nm.

FIG. 11B at 4.4 J/cm$^2$; and FIG. 11C at 5.6 J/cm$^2$.

FIG. 15A is in focus, diameter of 60 μm. FIG. 15B is 0.25 mm overfocussed, diameter of 65 μm. FIG. 15C is 0.75 mm overfocussed, elliptical axis 75 and 90 μm. FIG. 15D is 1 mm overfocussed (which was too inhomogeneous to be reliable). The scale bar for FIGS. 15A-15D is 50 μm.

FIG. 16A is in focus. FIG. 16B is 0.25 mm overfocussed. The scale bar for FIGS. 16A-16B is 50 μm.

FIGS. 24A-24F are SEM images of "R" letters from LIG on a PI substrate generated by three different approaches. FIGS. 24A-24B are SEM images resulting from the first approach.

FIGS. 24C-24D are SEM images resulting from the second approach. FIGS. 24E-24F are SEM images resulting from the third approach.

FIGS. 27A-27E are SEM images of cross-sections of 3D printed LIG with, respectively, 1-5 3D printed layers.

FIGS. 29A-29B are SEM images of cross-sections of 3D printed LIGS with, respectively, 1-5 3D printed layers.

FIGS. 31A-31E are optical images taken during a stress test for a 5×5×5 mm LIGS cube made by 3D printing.

FIG. 33 is an optical image of an "R" letter of LIG made by 3D printing.

FIG. 35A is for the anode (337.61 mAh/g).

FIG. 35B is for the cathode (60.66 mAh/g).

DETAILED DESCRIPTION

Laser-Induced Graphene Scrolls ("LIGS")

Figures 1A, 1B:
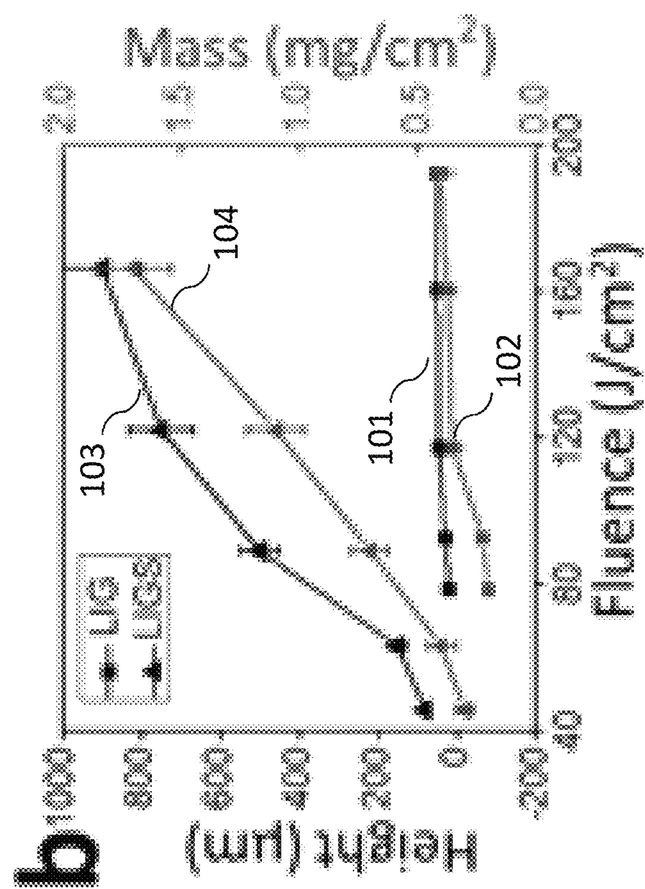
FIG. 1A is a schematic of laser in raster mode.
FIG. 1B is a graph showing LIG and LIGS height and mass dependence on laser fluence.

The present invention to LIGS and the method of making LIGS. In some embodiments, LIGS are fabricated by exposing a precursor material (e.g., a polymer, such as a polyimide) to a laser source to form the LIGS from the precursor material. In some embodiments, the LIGS of the present disclosure are fabricated by the adjusting methods for the fabrication of LIG from commercial polyimide films [Lin 2014]. Such methods to fabricate LIG were disclosed and taught in the Tour '351 PCT Application and the Tour '060 PCT Application.

Various laser parameters may be used. By tuning the laser parameters (operational modes, PPI, duty cycle) LIGS have been produced. The fluid dynamics process of the carbon-forming event can be captured in the solidified material. Such better understanding of the laser parameters provided control over the carbon morphology, thus enabling the fabrication of millimeter-scale vertical aligned LIGS forests. The details of the graphene scrolling structure of LIGS have been examined. The application of LIGS in micro-supercapacitor (MSC) results in two times capacitance of LIG-LIGS-MSC over LIG-MSC, reflecting the potential of LIGS in flexible electronic device configurations.

For instance, in some embodiments, the laser source has a laser fluence of more than about 40 $J/cm^2$. In some embodiments, the laser source has a laser fluence ranging from about 40 $J/cm^2$ to about 200 $J/cm^2$. In some embodiments, the laser source has a laser fluence ranging from about 80 $J/cm^2$ to about 170 $J/cm^2$.

Such methods may be utilized to fabricate various LIGS. For instance, in some embodiments, the LIGS are generated from the LIG disclosed and taught in the Tour '351 PCT Application and the Tour '060 PCT Application. In other embodiments, the LIGS include graphenes that scroll up to form fibers with small diameters (e.g., diameters of at most around 100 nm). In some embodiments, the LIGS have diameters ranging from about 10 nm to about 500 nm. In embodiments, the LIGS of the present disclosure have diameters ranging from about 20 nm to about 100 nm.

In some embodiments, the LIGS of the present disclosure grow in bundles to form forests with long heights (e.g., heights of up to 1 mm, as opposed to the 20 micron thicknesses of prior LIG). In some embodiments, the LIGS of the present disclosure have thicknesses of more than about 20 more than about 30 more than about 100 more than about 500 and more than about 1 mm.

LIGS can be made by lowering the consecutive laser pulse stacking density. LIGS can be formed by a one-step laser thermolysis process at a radiation energy >40 $J/cm^2$.

By applying a commercial laser $CO_2$ raster mode, the vertical growth of a forest of LIGS with a height of 1 mm was afforded in one step. The effect of a 9.3 μm wavelength laser was compared to the previously used 10.6 μm wavelength laser and parameters have been discovered to reliably control the LIG versus LIGS morphologies for device optimization. Interdigitated microsupercapacitors (MSCs) from LIGS and LIGS-LIG hybrids have also been fabricated. MSC devices fabricated from LIGS and LIGS-LIG hybrids show two times the specific areal capacitance of MSC made entirely from LIG, showing that LIGS can be utilized in flexible device applications.

Figures 1C, 1D:
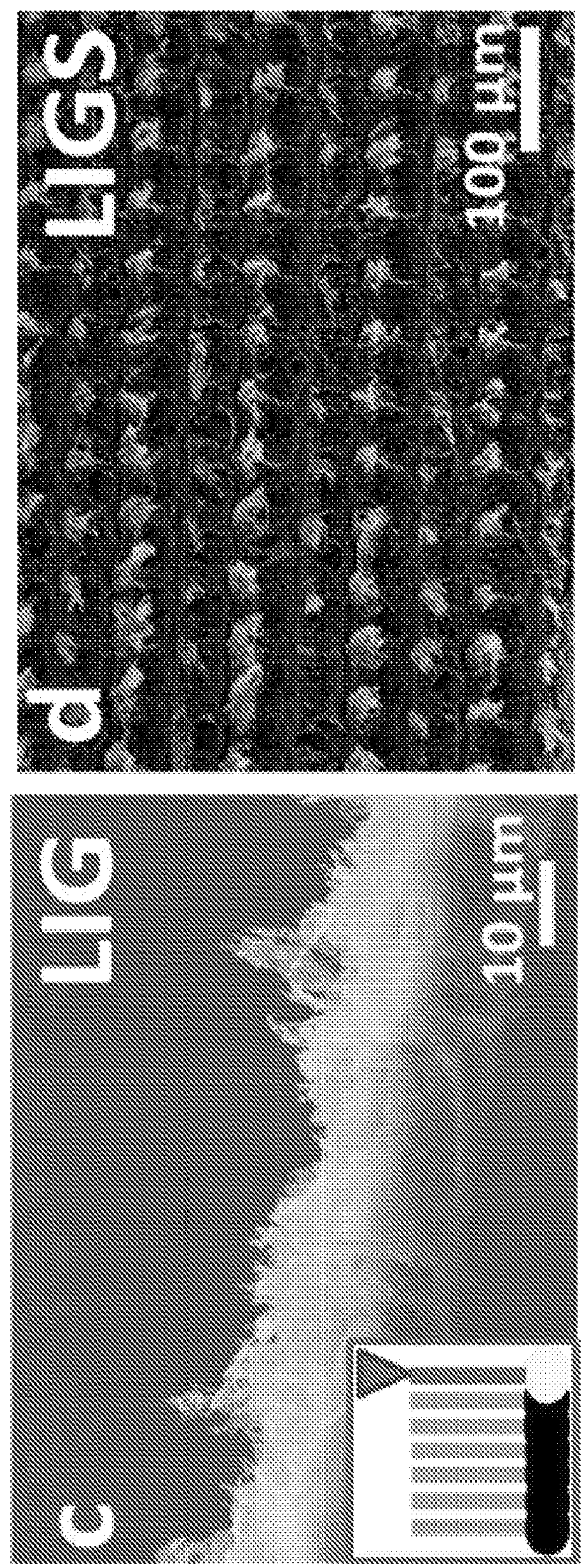

Commercial laser cutting systems have two modes, vector and raster. In vector mode, the laser follows a pattern in both the x and y direction. As shown in the schematic of FIG. 1A, in the raster mode, the laser scans the 2D pattern in the x-direction only. The laser induction process was changed from vector mode to raster mode in order to prepare a large area of LIG material. Fluence is measured as accumulated energy over a unit area. Similar to other commercial laser systems, the image density is controlled by the following two factors: the pulse width modulation or pulses per inches (PPI), and the lines per inch (LPI), both an indication of the density of the laser lines. As in the previous reports of the inventors, lasering for LIG was done at 1000 PPI×1000 LPI (pulse separation 25.4 μm) with a laser spot size of ~100 μm, resulting in a LIG thickness of ~30 μm [Lin 2014]. In that case, the laser spots induced on the PI surface overlapped, leading to overheating and destruction of the top LIG layers, thus resulting in the remaining LIG layers having thickness <50 μm regardless of the fluence. See FIG. 1B (showing (a) LIG height and mass dependence on laser fluence by plots 101 and 102, respectively, and (b) LIG height and mass dependence on laser fluence by plots 103 and 104, respectively) and FIG. 1C.

Figures 1E, 1F, 1G:
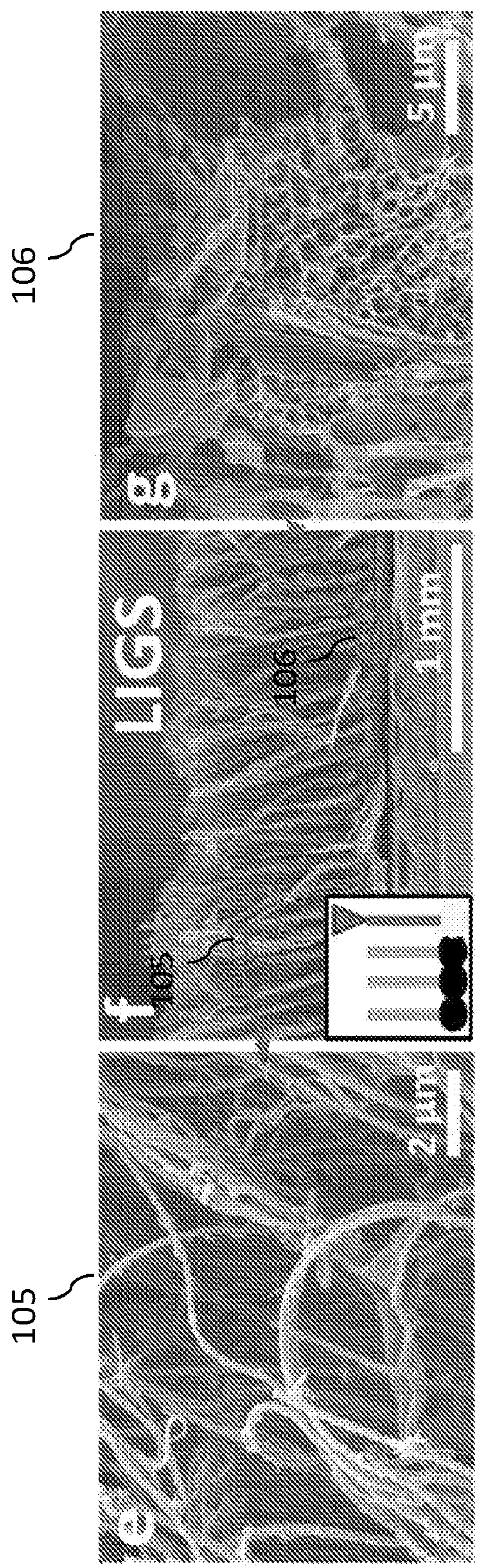

In order to preserve the LIG layers, which turned out to be LIGS, an image density of 500 PPI×500 LPI (pulse separation 50.8 μm) with a laser spot size of ~60 μm was used to ensure that each pulse was well-separated from its neighboring pulse. See FIG. 1D. The resulting height-controllable and tubular nanostructure LIGS has a vertically aligned forest morphology. The laser system provides a lateral resolution of 2 μm that provides high resolution spacing between each column and row. As shown in FIGS. 1E-1G, using a laser pulse with fluence of 166 $J/cm^2$, a LIGS forest with ~1 mm height was synthesized before the 120-μm-thick PI substrate was entirely converted to LIGS. FIG. 1E is an SEM image of the LIGS in higher magnification from area 105 of FIG. 1F. FIG. 1G is an SEM image of the LIGS in higher magnification from area 106 of FIG. 1F (at the interface of LIGS and PI).

It should be noted that the laser treatment process was relatively fast: 1 min for a 1 $cm^2$ pattern even at low raster speed. A thin LIG layer of ~30 μm was also found at the interfaces between the LIGS and PI. See FIG. 1G. As discussed below, a conductivity test showed seamless electrical conductance between the interfacial LIG and LIGS forest.

Figure 1H:
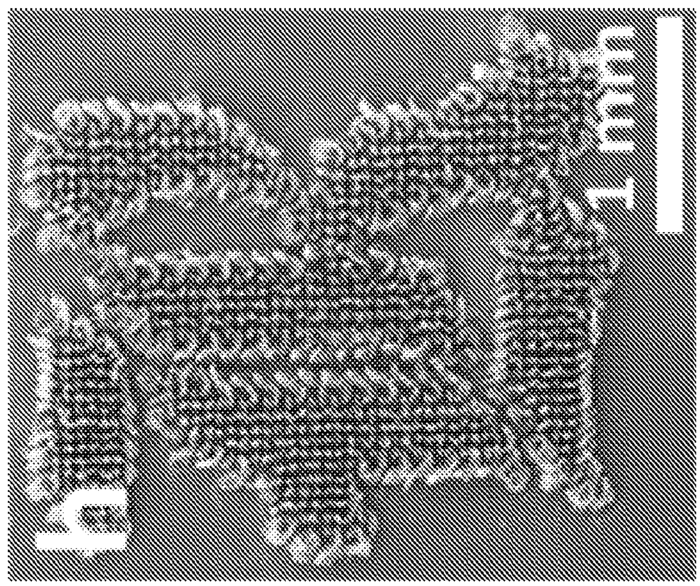

It has been found that the LIGS forest can be patterned with a resolution of the laser spot size (~60 μm). The optical system can be improved for higher resolution but the limitation of the pattern resolution is the diffraction limit (~5 μm, half of the 10.6 μm wavelength). As shown in FIG. 1H, an "R" shape patterned LIGS was made to demonstrate the laser system resolution capability.

Accordingly, various methods may be utilized to fabricate LIGS. In some embodiments (e.g., embodiments where synthesis of large areas of LIGS are desired), a laser that operates in raster mode can be utilized. In some embodiments, image density is changed by pulses per inch (PPI) and lines per inch (LPI, the density of laser lines).

In some embodiments, the LIGS can be fabricated by making each pulse well-separated (e.g., pulse separation of 50.8 μm with a laser spot size of 50 μm), thereby resulting in height controllable tubule nanostructures that are vertically aligned in a forest. In some embodiments, the LIGS can be fabricated by utilizing an image density of 500 PPI×500 LPI with a pulse separation of 50.8 μm and a laser spot size of 50 In some embodiments, the LIGS can be fabricated by utilizing an image density that is less than 1000 PPI×1000 LPI. In some embodiments, the LIGS can be fabricated by utilizing a pulse separation of more than 25.4 In some embodiments, the LIGS can be fabricated by utilizing a laser spot size of less than ~100 μm.

As illustrated in FIG. 1F, using laser pulses with a fluence of 80 $J/cm^2$, LIGS forest have been created with heights up to 1 mm before the 120-μm PI substrate could be carbonized to amorphous carbon. The LIGS grow in bundles created by each laser pulse.

As shown in FIG. 1G, a thin LIG layer of about 30 μm can be prepared and interfaced between LIGS and the PI.

Laser spots overlapping resulted in LIG layers with thicknesses under 50 regardless of the fluence. It is believe that, in that circumstance, the laser has vaporized the LIGS product from the prior pulse. The LIGS forest can be patterned with resolutions of approximately the laser spot size (~75 μm). Optical systems can be improved for higher resolution. However, the initial limitation of the pattern resolution can be the diffraction limit (~5 μm, half of the 10.6 μm wavelength). In some embodiments, advanced optical schemes developed for use in the lithography industry can be used for improved performance.

For example, for the formation of LIGS, the pulse density should be performed so that each of the pulses do not overlap. As compared to 1000 PPI in the laser utilized, the 500 PPI was better at focusing in term of the pulse density to generate LIGS. Furthermore, a certain amount of fluence (energy density) was needed to initiate the formation of LIGS. For 10.6 μm and 9.3 μm laser they are ~40 $J/cm^2$ and ~20 $J/cm^2$, respectively (in laser system parameter, that was 500 PPI, raster speed of 6 in/s, duty cycle of 2% and 1% respectively). Still further, depending on the laser, there is a maximum height of LIGS that can be generated because excessive laser radiation will ablate the previous formed LIGS and decrease the final height of the forest.

LIGS Elemental Composition

Figure 2A:
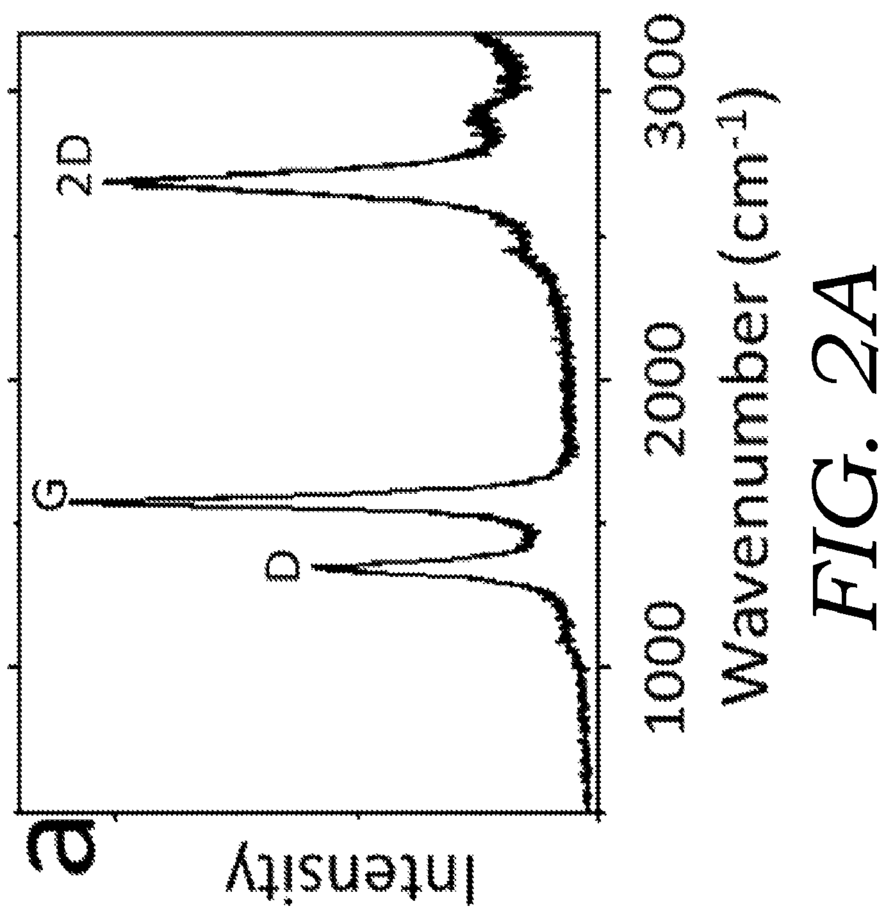
FIG. 2A is a Raman spectrum of LIGS showing the D, G and 2D peaks.

To confirm the graphitic nature and elemental composition of the obtained LIGS, Raman spectra, X-ray diffraction (XRD) and X-ray photoelectron spectroscopy (XPS) spectra of LIGS were obtained for a sample made with a fluence of 122 $J/cm^2$. In FIG. 2A, Raman spectra show a strong D peak at ~1350 $cm^{-1}$ induced by defects or symmetry broken sites [Ferrari 2007]. A sharp 2D peak at ~2700 $cm^{-1}$ with ~1.25 $I_G/I_{2D}$ ratio indicates a few-layer graphene structure [Sun 2012].

Figure 2B:
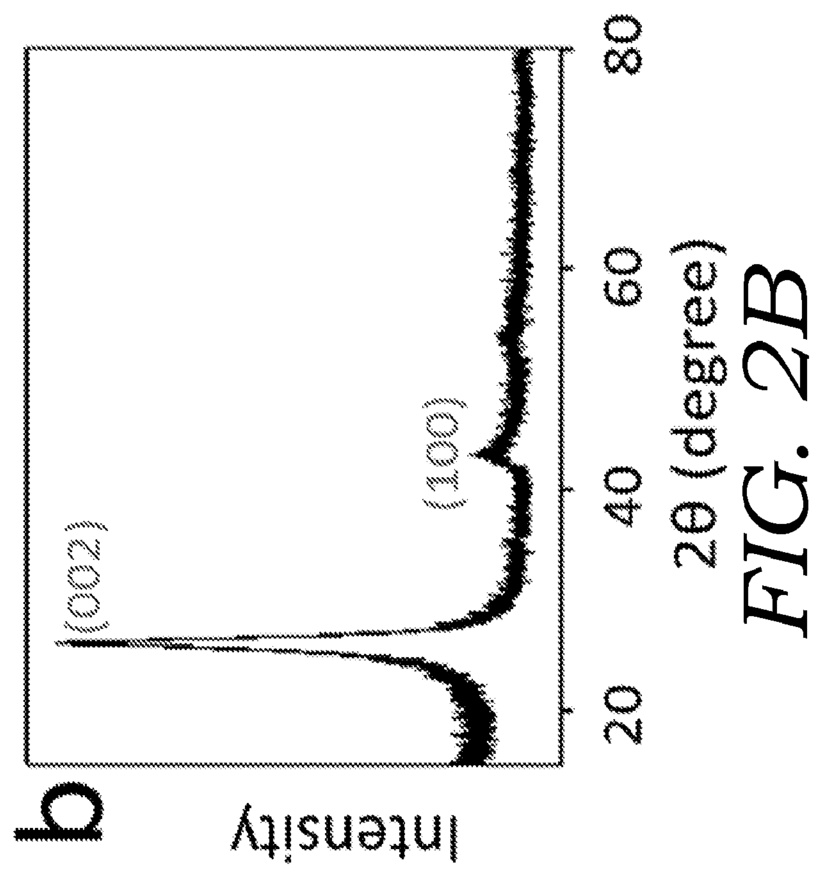
FIG. 2B shows the X-ray diffraction with an XRD prominent peak shown at ~26°.

In the XRD shown in FIG. 2B, a prominent peak is observed at ~26°, representing the (002) graphitic crystal planes. This gives an interlayer spacing of ~3.4 Å, well-matched with the graphitic phase. A (100) graphitic crystal phase is also shown at an angle of ~43°.

Figure 2C:
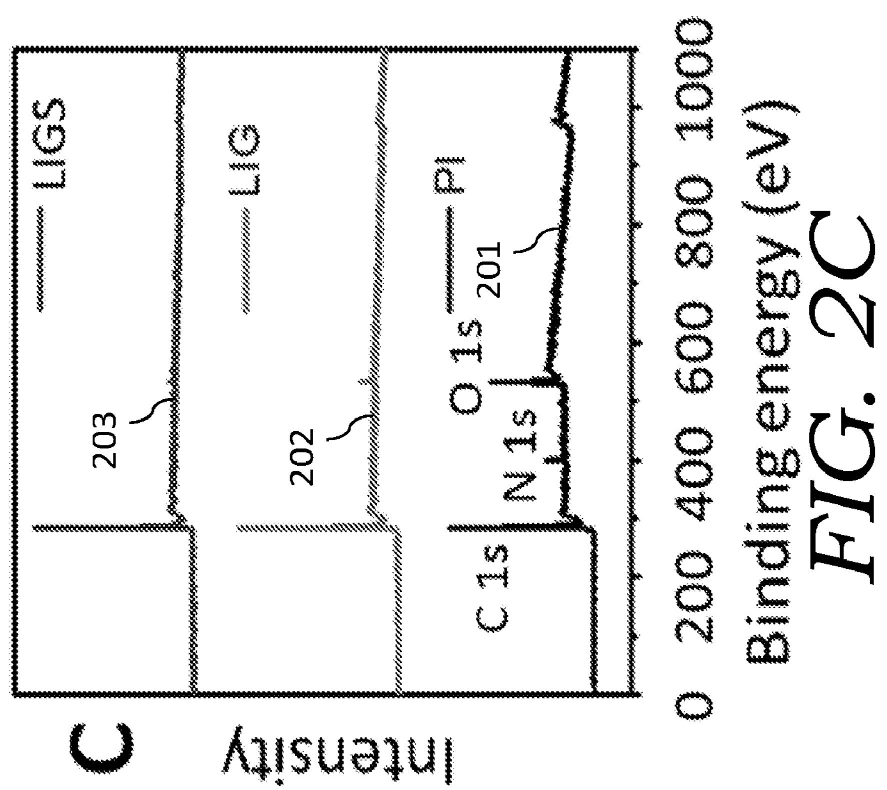
FIG. 2C is an XPS survey spectra of PI (201), LIG (202), and LIGS (203).
Figure 2D:
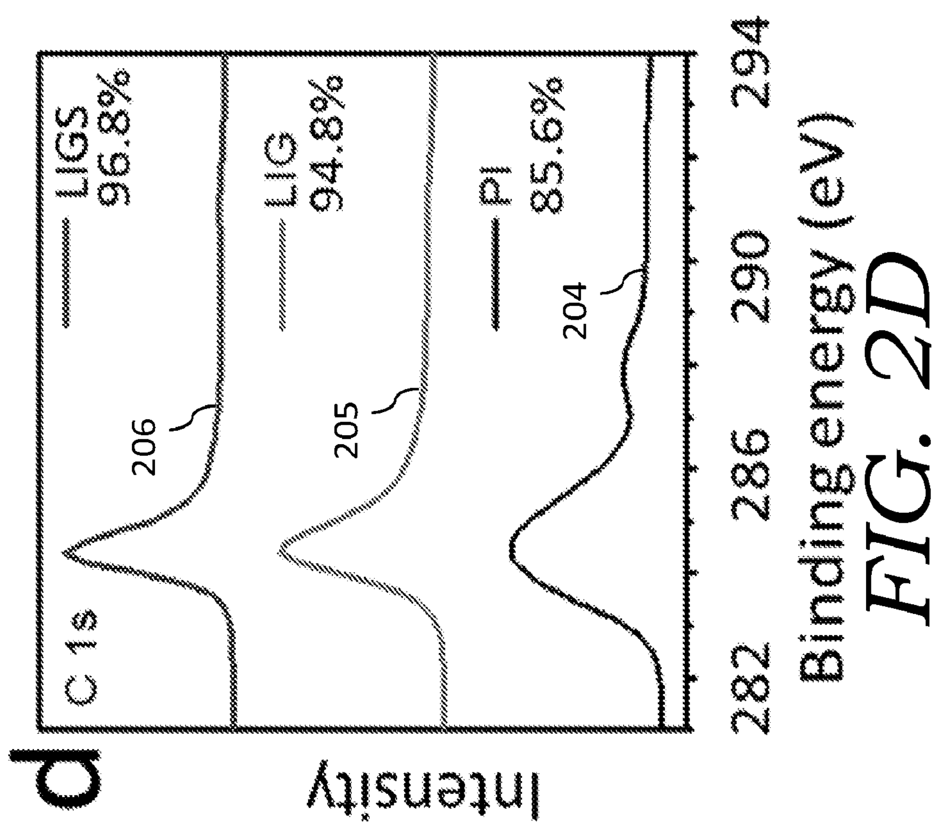
FIG. 2D is XPS of C is content of PI (204), LIG (205), and LIGS (206).
Figure 2E:
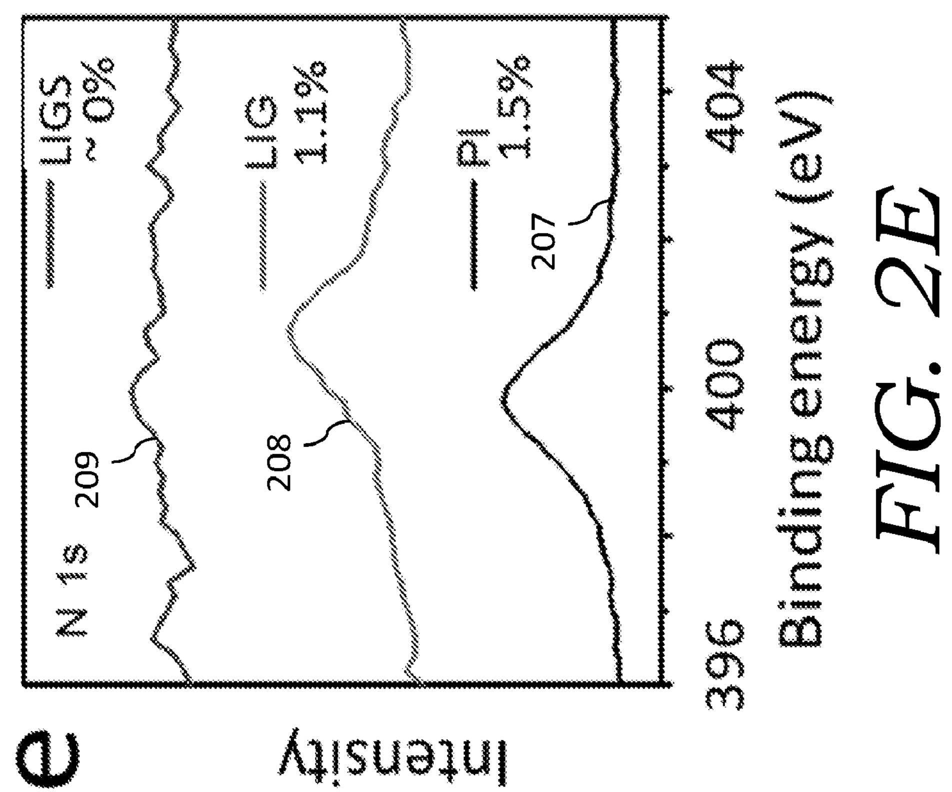
FIG. 2E is XPS of N 1s content of PI (207), LIG (208), and LIGS (209).
Figure 2F:
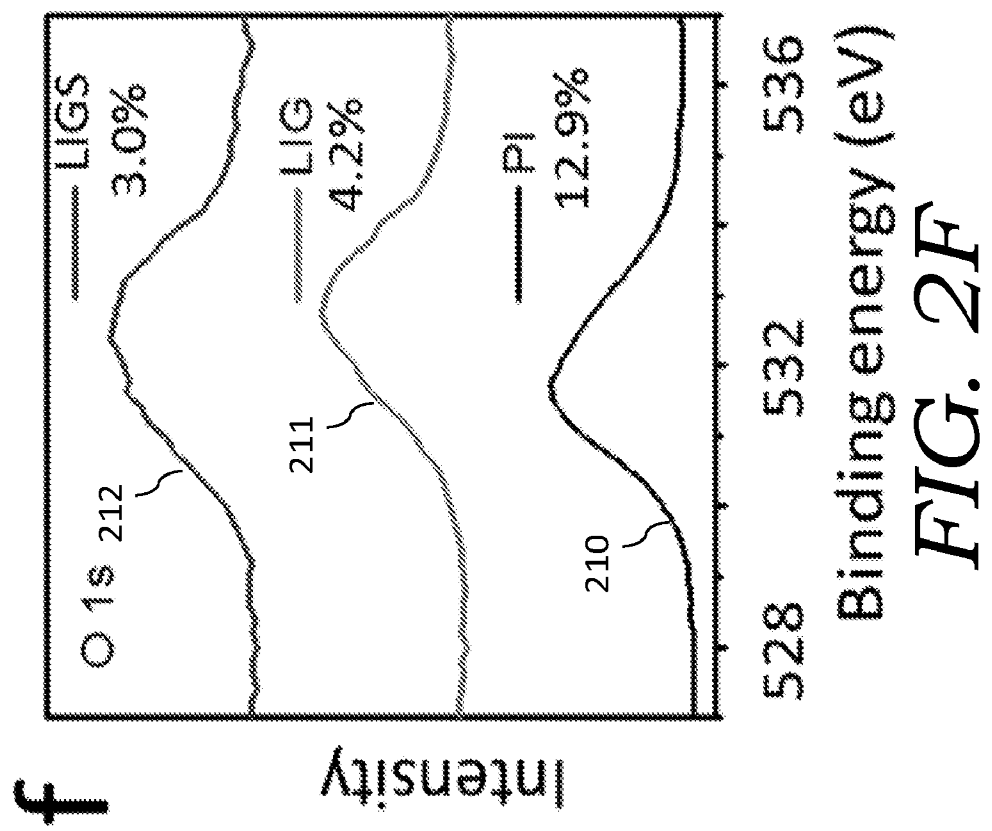
FIG. 2F is XPS of O 1s content of PI (210), LIG (211), and LIGS (212).

FIG. 2C is an XPS survey spectra of PI (201), LIG (202), and LIGS (203). FIG. 2D is XPS of C is content of PI (204), LIG (205), and LIGS (206). FIG. 2E is XPS of N 1s content of PI (207), LIG (208), and LIGS (209). FIG. 2F is XPS of O 1s is content of PI (210), LIG (211), and LIGS (212). These show that the content of oxygen in LIGS is 3% without XPS-detectible nitrogen content. This is lower than the LIG made with a fluence of 29 J/$cm^2$, which has 1.1% nitrogen and 4.2% oxygen.

LIGS Structure

Figure 3A:
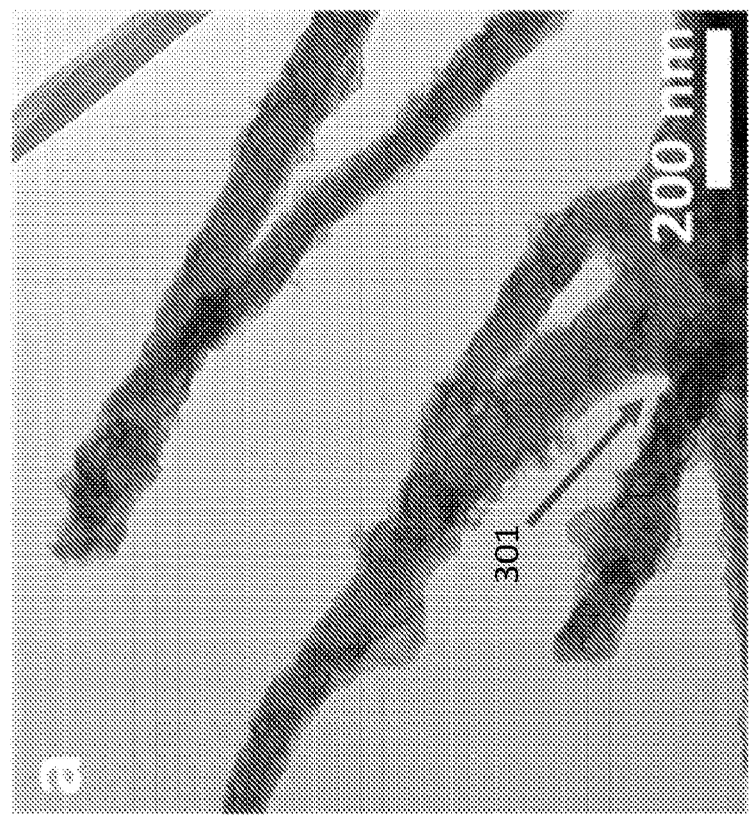
FIG. 3A is a TEM images of LIGS.

To further investigate the structure of LIGS, a LIGS/$CHCl_3$ suspension was dropped onto a lacey carbon grid for transmission electron microscopy (TEM) characterization. FIG. 3A represents a typical TEM image and shows 50-100 nm diameter LIGS emanating from LIG. LIGS are entangled together, but the alignment is roughly preserved even after solution bath sonication.

Figure 3B:
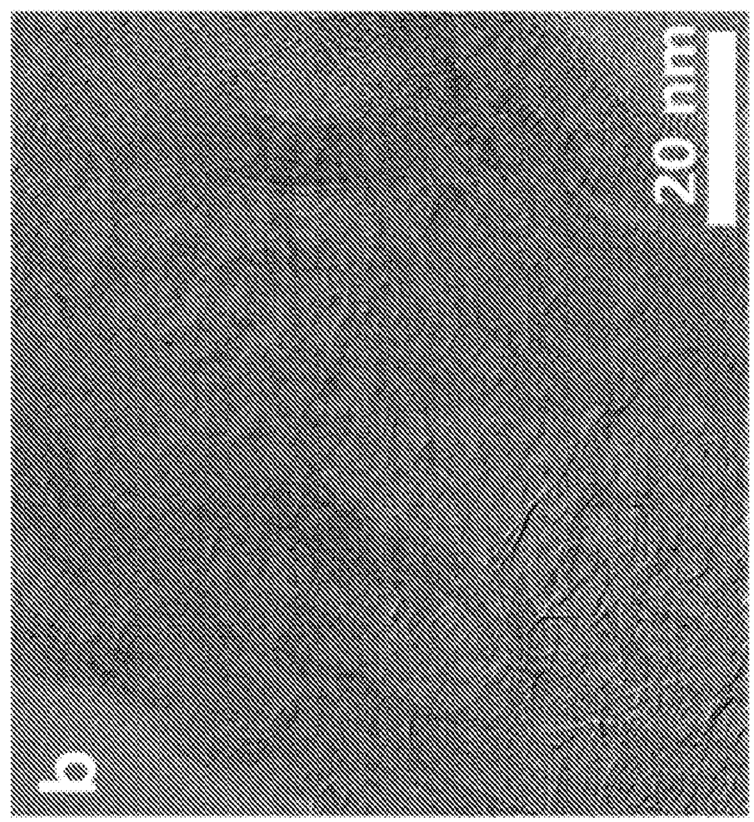
FIGS. 3B-3D are HRTEM images of LIGS.
Figure 3C:
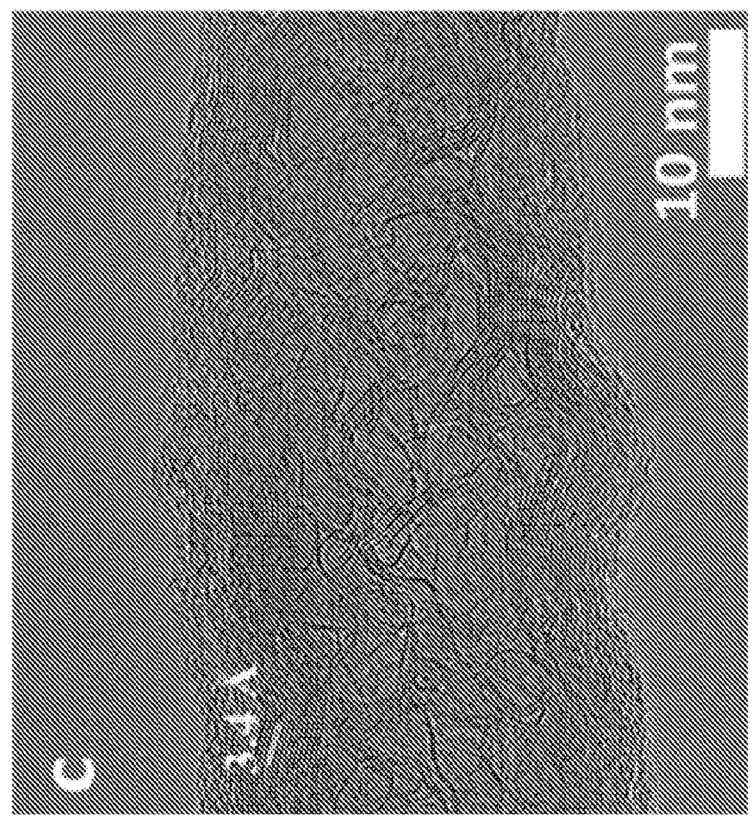
Figure 3D:
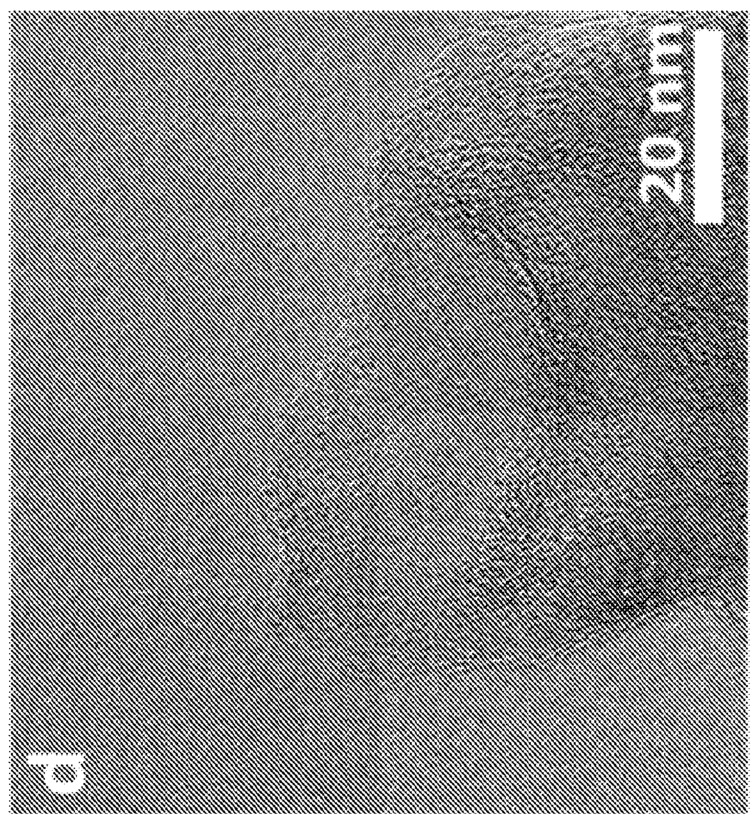

From high-resolution TEM (HRTEM) images in FIGS. 3B-3C, LIGS showed a few-layer graphene structure with disordered fringes found on the focal plane and ordered fringes near the edge of LIGS. FIG. 3B is a typical LIGS ordered fringes. FIG. 3C shows LIGS with size of 40-50 nm also observed with ordered fringes on the edges with distances of 3.4 Å. The highly disordered structure observed in the HRTEM agrees well with the high $I_D/I_G$ ratio seen in the Raman spectra. The concentration of ordered fringes at the edges suggest graphitic curves at the edges of the LIGS, resulting from the scrolling of LIG to form LIGS. The point that LIG tears and scrolls into LIGS is indicated by arrow 301 in FIG. 3A. This can also be seen in the SEM image of FIG. 3D (where LIG scrolls into LIGS. The scrolling of LIGS can also be seen in FIG. 3D that shows the tip of a LIGS with its hollow structure (a tip of a single LIGS with an open end).

Figure 3E:
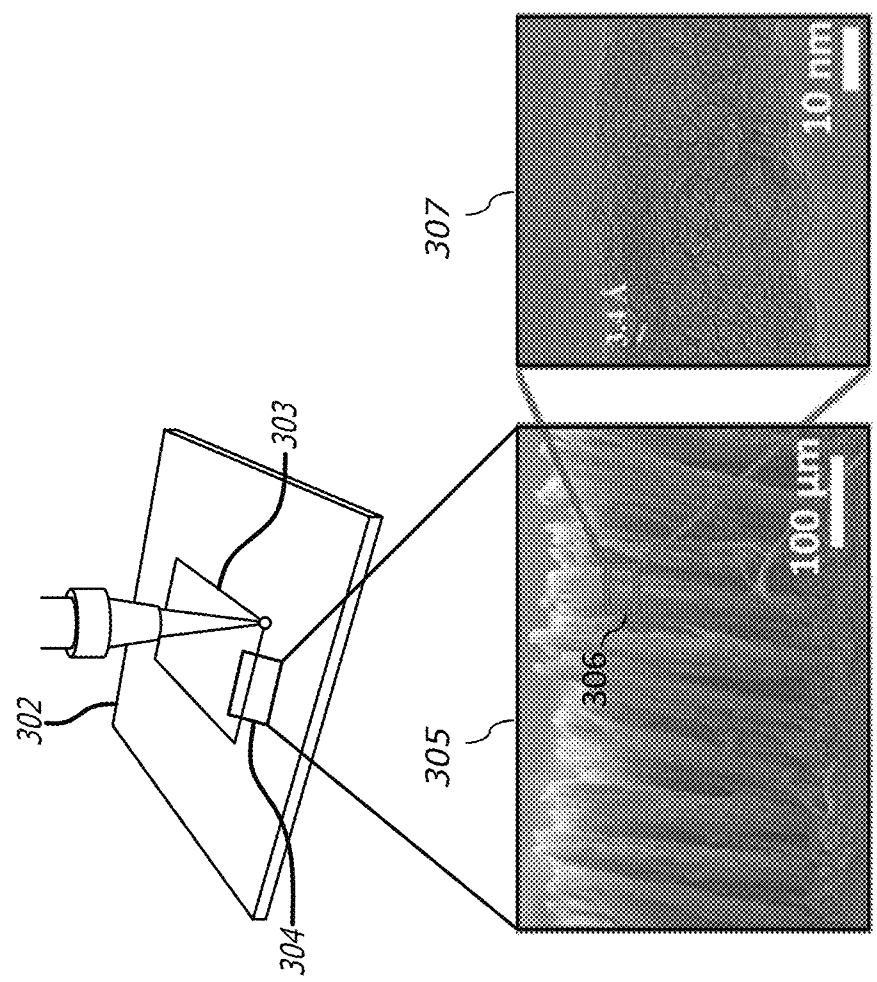
FIG. 3E shows a schematic of laser in raster mode with an SEM and HRTEM images of LIGS.

FIG. 3E shows a schematic 302 of laser in raster mode that has made LIGS on PI 303. (Schematic 302 is similar to the schematic as shown in FIG. 1A and described above). Image 305 is an SEM image of LIGS, such as LIGS formed in area 304 shown in schematic 302. Image 307 is an HRTEM image of box 306 in SEM image 305. (HRTEM image 307 is the same HRTEM image as shown in FIG. 3C and as described above).

Conductivity

Figure 4A:
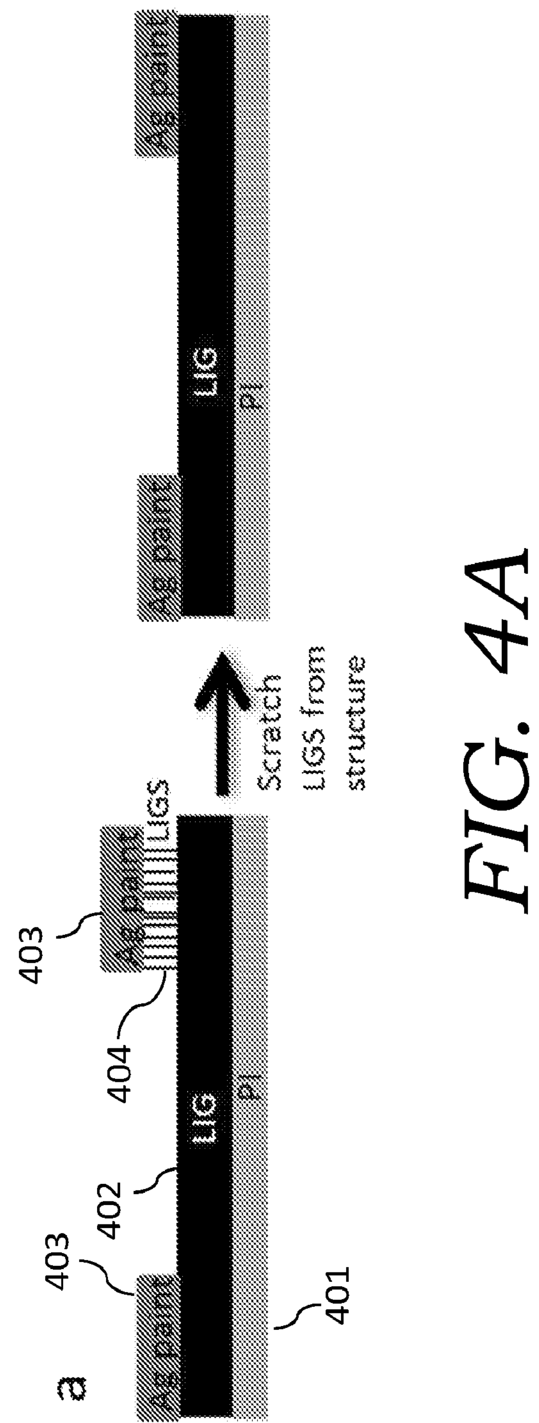
FIG. 4A is a scheme of LIGS/LIG contact resistance measurement.

Conductivity tests were performed to measure the electrical conductance between the interfacial LIG and LIGS forest. FIG. 4A is a scheme of LIGS/LIG contact resistance measurement. First, 1×1, 1×2, 2×2 and 2×3 $cm^2$ LIGS forests (having PI 403, LIG 402, and LIGS 404) were made in conjunction with 1×2 or 2×4 $cm^2$ LIG (having PI 403 and LIG 402), then silver paint 403 was applied on top of the LIGS forest area and 1×1 and 2×2 $cm^2$ of LIG to measure the resistivity. The LIGS layer then was removed to reveal the LIG beneath and silver paint was applied again to measure the resistivity.

Figures 4B, 4C:
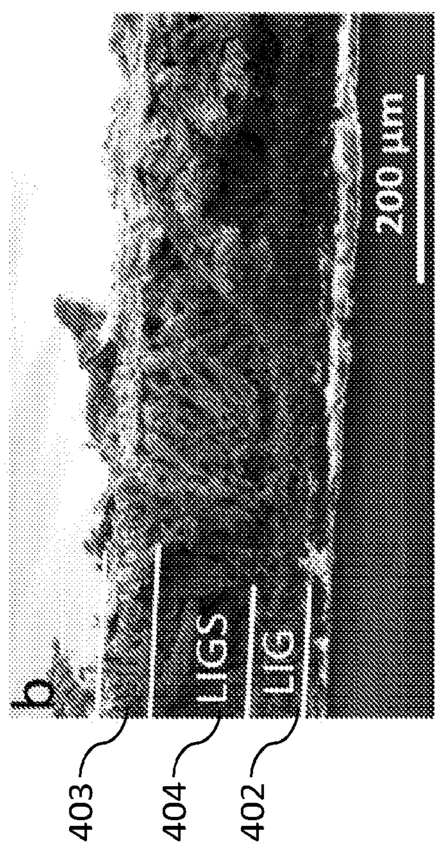
FIGS. 4B-4C are, respectively, SEM images of the LIGS forest before and after the LIGS layer was removed.

FIG. 4B shows there is no pathway between the top silver paint 403 layer and the LIG 402 layer (which is beneath the LIGS 404 layer) that would lead to an electrical short. FIG. 4C shows that the silver paint 403 layer to the LIG 402 layer after the LIGS layer was removed.

Resistance was measured between 2 silver paste electrodes before and after removing the LIGS, which measurements are reflected in Table 1, below. These measurements show little to no contact resistance between LIG and LIGS.

TABLE 1

| | LIGS forest area ($cm^2$) | | | |
|---|---|---|---|---|
| Material | 1 × 1 | 1 × 2 | 2 × 2 | 2 × 3 |
| Ag/LIG/LIGS/Ag (Ω) | 502 | 398 | 135 | 102 |
| Ag/LIG/Ag (Ω) | 499 | 397 | 135 | 102 |

This shows showed seamless electrical conductance between the interfacial LIG and LIGS forest.

Carbonization

Applicant has discovered parameters for the controlled formation of varying LIG morphologies. When changing the total radiation energy per unit area on LIG, it was found that a critical fluence point of ~5 J/$cm^2$ and ~2.1 J/$cm^2$ was needed to initiate the carbonization process in PI using a 10.6 μm and 9.3 μm laser, respectively. This decrease in the critical fluence point of 2.3 times agreed well the decrease in absorption of the PI at 10.6 μm infrared and 9.3 μm laser infrared, which is also 2.3 times. When increasing the radiation energy, the physical formation of LIG follows a fluid dynamics process in that the morphology of the LIG progressively changes from sheets to filaments and finally to droplets.

Raman spectroscopy was used as a tool to determine when carbonization began, with confirmation from optical microscopy. A commercial Universal Laser System XLS10MWH laser cutter platform was used as the laser source operated in pulse width modulation (PWM) and equipped with two 10.6 μm wavelength lasers at 75 W and 10 W and one 50 W 9.3 μm wavelength laser. In a previous report from the inventors [Lin 2014], a porous LIG structure with a few-layer graphene structure can be generated during laser induction under ambient conditions at room temperature when a $CO_2$ laser (10.6 μm) is focused on the surface of polyimide (PI) sheets with a laser power of 60 W in 4% to 10% duty cycles at a frequency of 6 kHz and 1000 pulses per inch (PPI). Under such conditions, the thickness of the LIG on the surface of PI sheets was <50 μm regardless of the duty cycle.

The interaction of individual laser pulses upon PI from the 10.6 μm 75 W laser was determined. To single out each pulse, the laser pattern was set in vector mode (in which the laser moves in a line pattern) with pulse separation from 30 to 400 PPI. The laser radiation energy density, or fluence, was measured by averaging many pulses. The laser parameters utilized are discussed below.

Figures 5A, 5B, 5C, 5D:
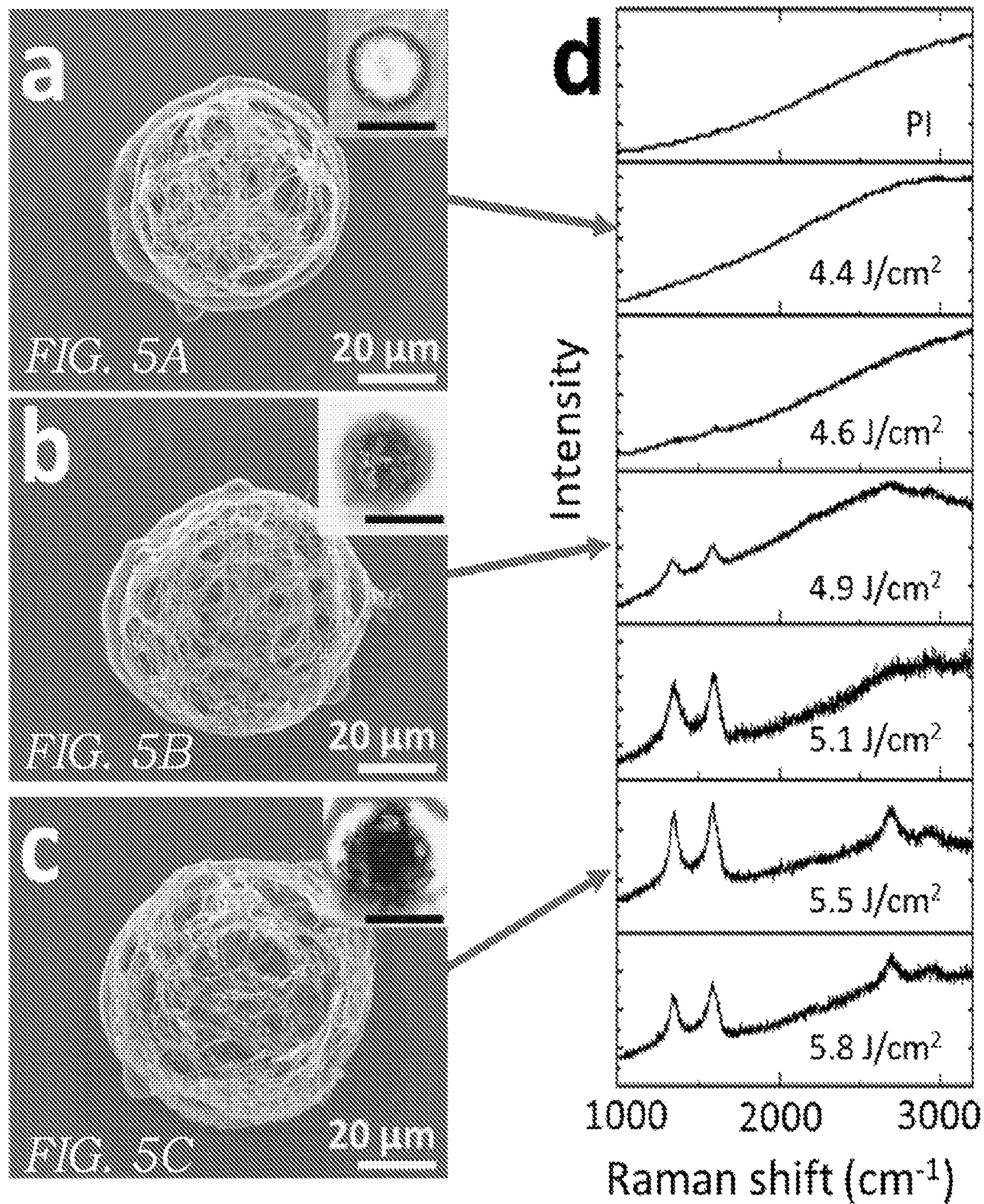
FIGS. 5A-5C are SEM images of samples with fluence set at (FIG. 5A) 4.4 J/cm$^2$, (FIG. 5B) 4.9 J/cm$^2$ and (FIG. 5C) 5.5 J/cm$^2$. The insets in each of the SEM images of FIGS. 5A-5C are optical microscope images of the same spot. The inset optical microscope scale bar is 50 μm.
FIG. 5D is a Raman spectra of the laser spot as fluence was increased (from top to bottom). The laser induction was performed with a 10.6 μm 75 W laser in vector mode.

Raman spectroscopy was used as a tool to determine when carbonization began, with confirmation from optical microscopy. In FIG. 5D, Raman spectra at a low fluence of ~4.4 J/$cm^2$ had an appearance similar to that of bulk PI, indicating that little or no carbonization occurred, which was consistent with the lack of black carbon noted in the optical image of the inset of FIG. 5A.

When the laser fluence was increased to ~4.9 J/$cm^2$, D and G peaks at ~1350 $cm^{-1}$ and ~1590 $cm^{-1}$ were visible in the Raman spectrum, indicating that carbonization had begun. The optical image of the inset of FIG. 5B confirmed carbonization with the appearance of a black spot. Note that the surface of the PI sheet is kept scratch-free during these evaluations because surface roughness can cause a fluence reduction at the carbonization point.

When the laser fluence was further increased to ~5.5 J/$cm^2$, the appearance of the 2D peak at ~2700 $cm^{-1}$, resulting from second order zone boundary phonons [Ferrari 2006], indicated more complete graphitization of PI and formation of graphene as confirmed in FIG. 5C.

Figure 6:
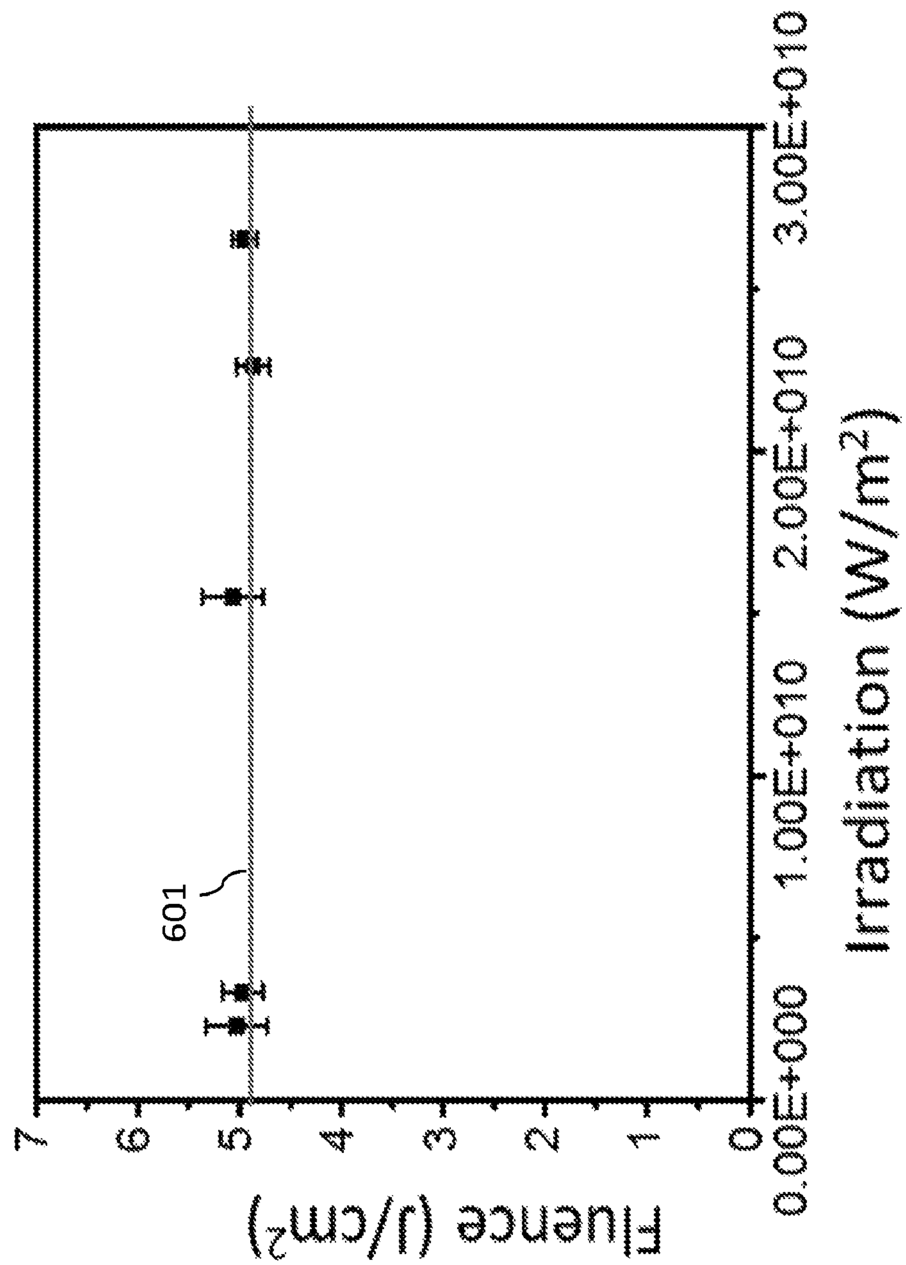
FIG. 6 is a graph showing carbonization fluence with various irradiation.

Laser irradiation (W/$m^2$) and pulse duration are not used as carbonization units because the laser pulse profile is not continuous but an exponential rise followed by exponential decay. Therefore, fluence is the better choice for determining the carbonization unit. As confirmation of this, the 75 W laser was defocused and the 10 W laser was used to vary the irradiation. With irradiation ranging from 22 to 265 GW/$m^2$, the same fluence of ~5 J/$cm^2$ was necessary for carbonization. See FIG. 6, which shows carbonization fluence with various irradiation with line 601 at 4.9 J/cm$^2$. This fluence range is well within the range for commercial $CO_2$ laser systems where the laser power is 10 to 100 W and the laser spot size is 50 to 100 μm. At this range, the heat loss by thermal conduction was found to be negligible in the process.

Examination of the fine structure generated at different fluence points revealed what is believed to be the dynamics of the carbonization process. PI is known for its oxygen and nitrogen outgassing at 550° C., followed by carbonization at 700° C. and finally graphitization at 3000° C. [Inagaki 1991; Inagaki 1989]. As a result of rapid outgassing from the PI melt, it undergoes fluid fragmentation. Evidence of PI liquefying during the laser-induced process is shown in the stress test in FIGS. 7A-7E and FIG. 8.

Figure 7A:
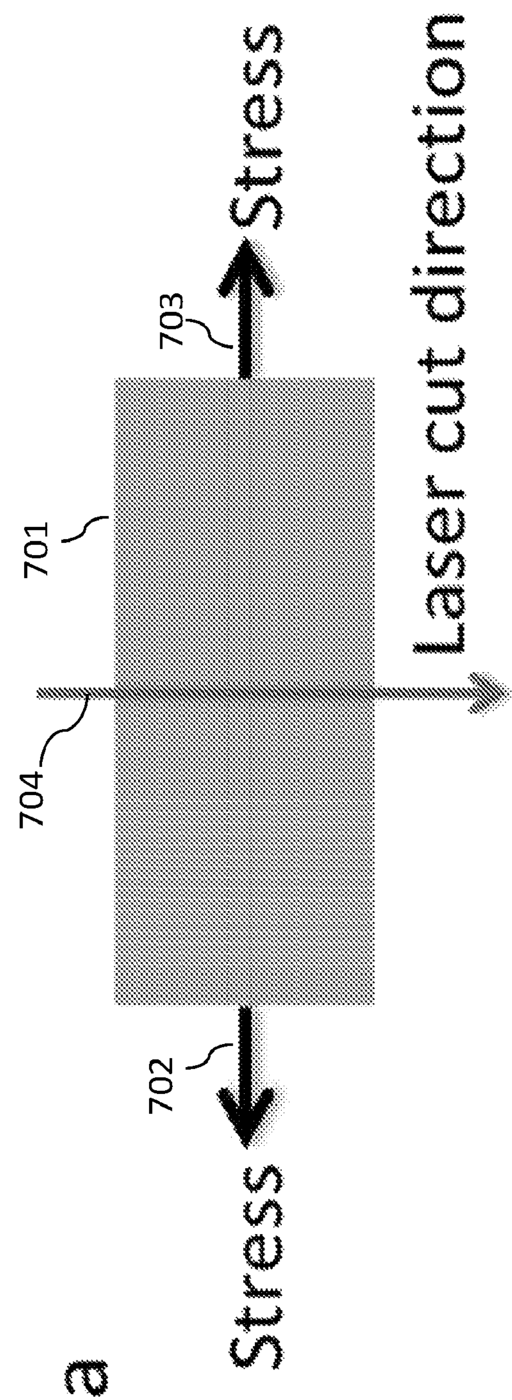
FIG. 7A is a schematic of the stress test utilized.

FIG. 7A is a schematic of the stress test in which a strip of PI 701 was stressed in the x direction (shown by arrows 702-703) and the strip 701 was cut by the laser in the y direction (shown by arrow 704). The stress test was done to establish that the PI liquefied during its conversion to LIG. As shown in FIGS. 7B-7C (SEM images of the edge of the starting cut at views z and x, respectively), at the starting point of the cut, the LIG morphology is in the z direction where there is no stress. As shown in FIGS. 7D-7E (SEM images of the edge of the ending cut at views z and x, respectively), at the end of the cut where the stress field was strong, the LIG morphology is in the x direction, parallel to the stress field.

Figure 8:
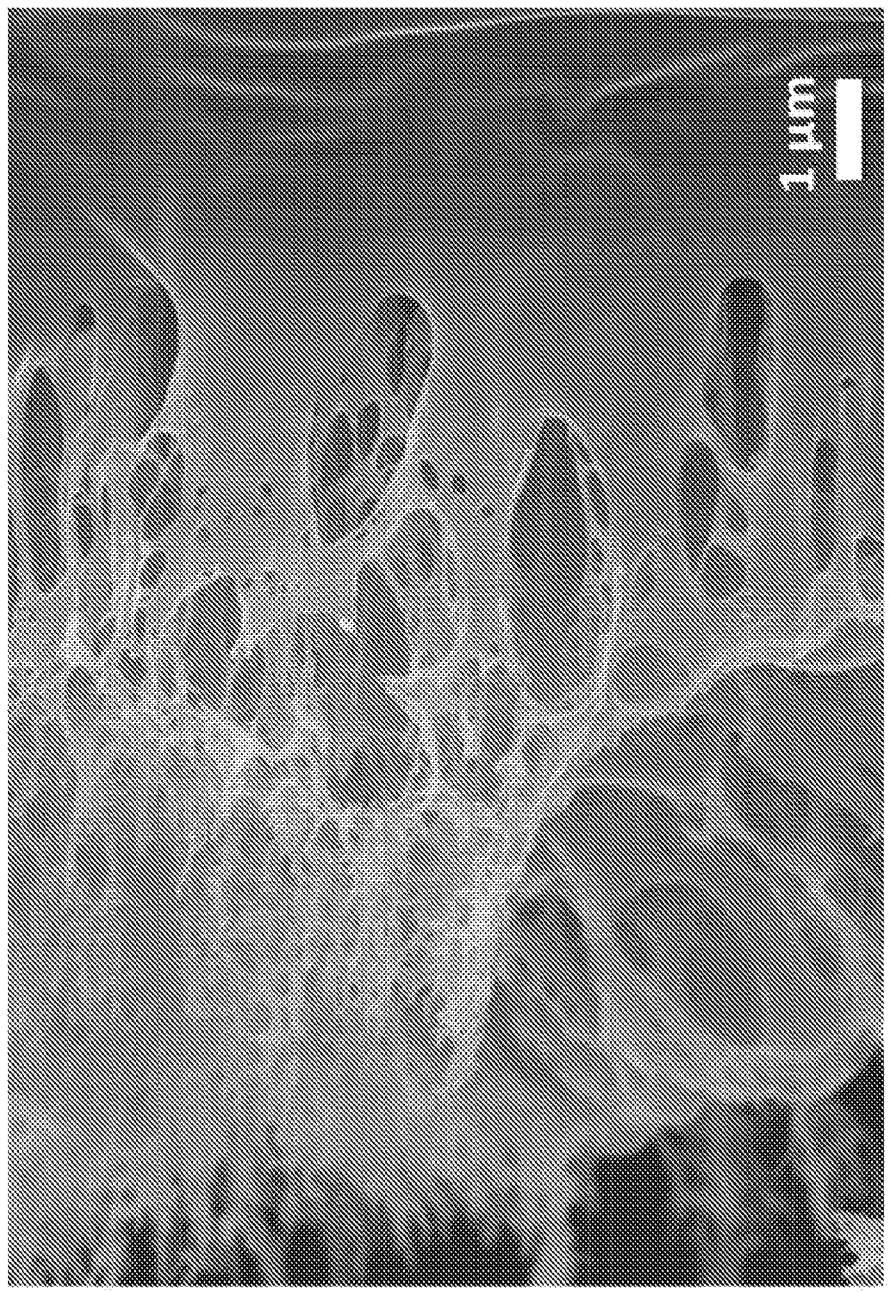
FIG. 8 is an SEM image of carbonization with stress.

FIG. 8 is an SEM image of carbonization with stress. As shown in FIG. 8, the stress is horizontal in this figure. The morphology of the LIG/LIGS is toward the stress field. The transition is from bulk PI on the right to deformed PI in the middle then to carbonized material on the left.

Figures 10A, 10B, 10C, 10D:
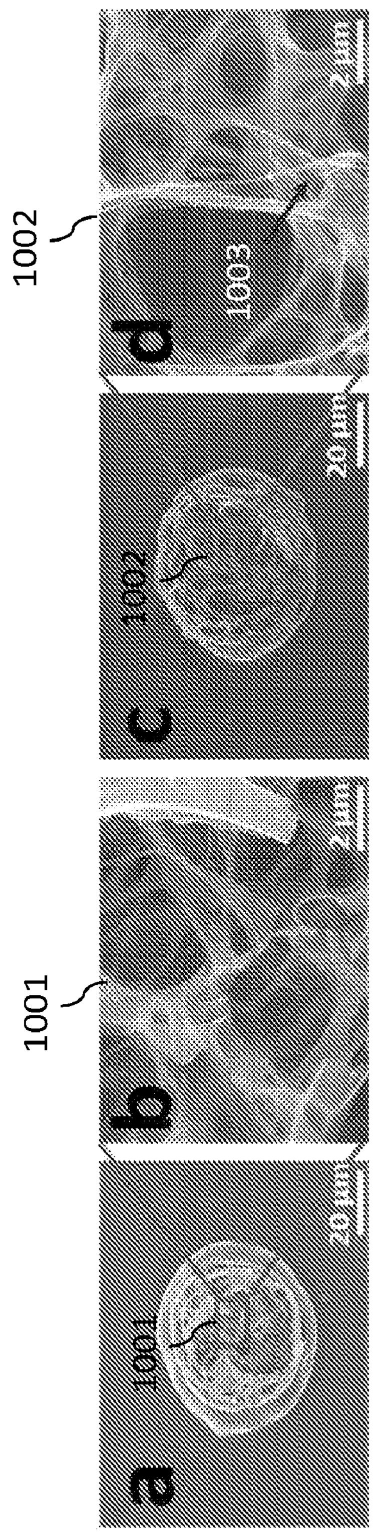
FIGS. 10A-10L are SEM images of PI samples as the laser fluence was increased, with FIGS. 10A-10B at 3.5 J/cm$^2$.

Previous studies showed the fluid dynamics of such breakup results in a cascade of sheets, ligaments and droplets [Scharfman 2016]. As shown in FIGS. 9A-9H and FIGS. 10A-10H, similar dynamics were observed in the laser induction process that can be divided into the following four stages:

(1) At low fluence (3.5 J/cm$^2$) as shown in FIGS. 9A-9B and 10A-10B, the carbonization is limited due to low energy input and a majority of the formed nanostructures are thin sheets of PI. FIG. 9B is a magnification of area 901 of FIG. 9A. FIG. 10B is a magnification of area 1001 of FIG. 10A.

Figures 10E, 10F, 10G, 10H:
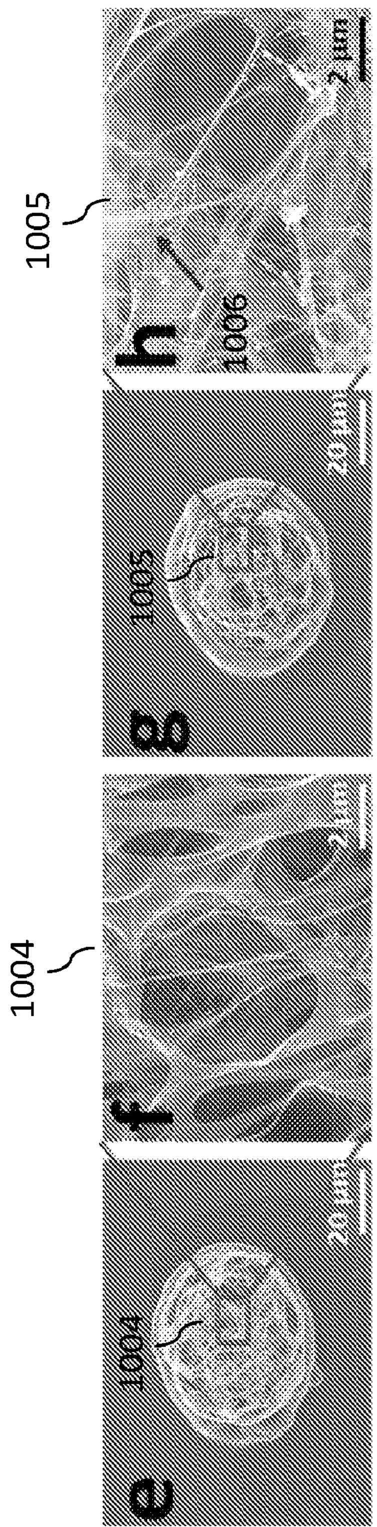

(2) At higher fluence (4.0 J/cm$^2$), as shown in FIGS. 9C-9D and FIGS. 10C-10H, the sheet nanostructure starts to break into filaments. Examples of transition from sheets to filaments is indicated with arrow 903 in FIG. 9D, arrow 1003 in FIG. 10D, and arrow 1006 in FIG. 10H. FIG. 9D is a magnification of area 902 of FIG. 9C. FIG. 10D is a magnification of area 1002 of FIG. 10C. FIG. 10F is a magnification of area 1004 of FIG. 10E. FIG. 10H is a magnification of area 1005 of FIG. 10G.

Figures 10I, 10J, 10K, 10L:
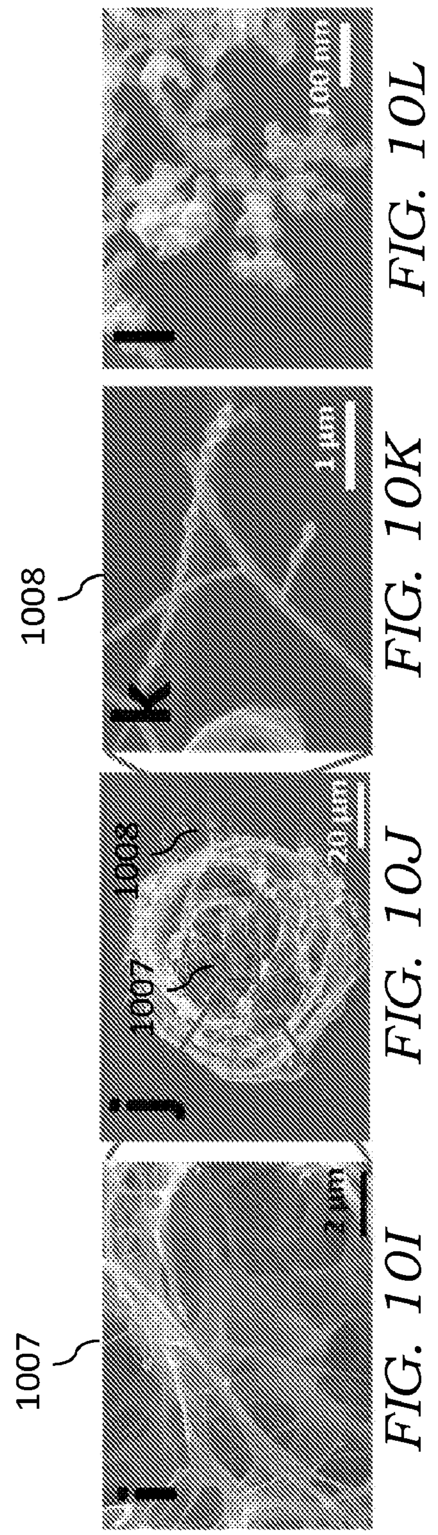

(3) At a fluence point high enough for carbonization (5.8 J/cm$^2$), as shown in FIGS. 9E-9H and FIGS. 10I-10L, sheet and filament features remain but in graphitic form as indicated by strong D and 2D peaks in the Raman spectra. See FIG. 5D. FIGS. 9E and 9G are, respectively, magnifications of areas 904 and 905 of FIG. 9F. FIGS. 10I and 10K are, respectively, magnifications of areas 1007 and 1008 of FIG. 10J.

(4) At this high fluence point, the transition from filament to carbonized droplets can be observed as shown in FIGS. 9G-9H and FIGS. 10I-10L. Based on the Raman spectral analysis of the samples of FIGS. 10A-10L, only the sample in FIGS. 10I-10L with laser fluence of 5.8 J/cm$^2$ is carbonized.

Figure 11A:
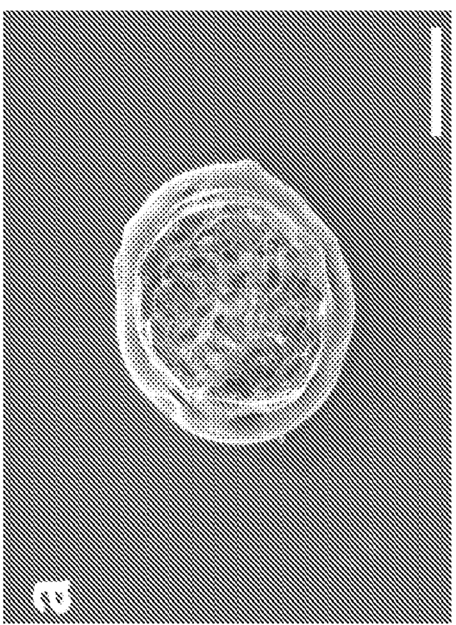
FIGS. 11A-11C are SEM images of samples with varied fluences (for laser power 10 W) FIG. 11A at 3.8 J/cm$^2$.
Figure 11B:
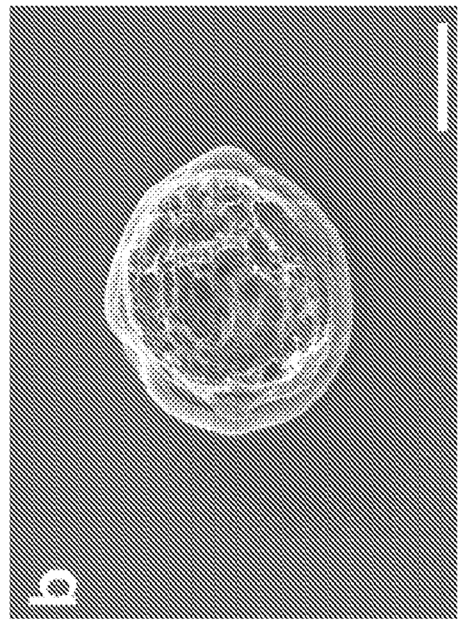
Figure 11C:
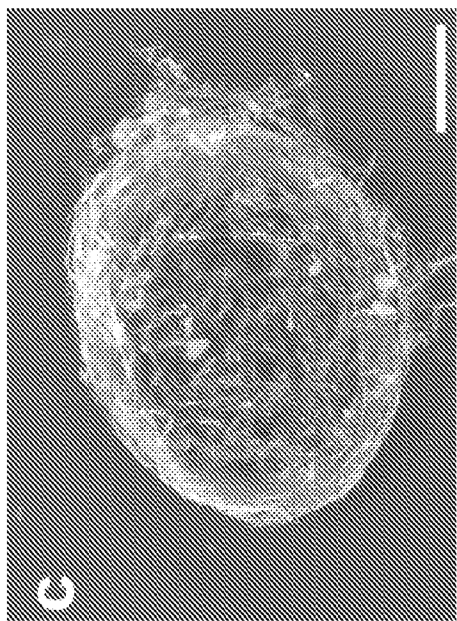

These carbonized droplets can form carbon nanoparticles (CNPs) that are mostly blown away by the laser air assist. In comparison, for samples at the same fluences but with the 10 W 10.6 μm laser, similar fluence for carbonization was observed, but the morphology is slightly favored the sheet-like structures. See FIGS. 11A-11C. When compared to the 75 W laser, the 10 W laser utilized for the samples in FIGS. 11A-11C induces the same carbonization area and has the same critical carbonization point but favors more LIG structure, as can be seen in the 5.6 J/cm$^2$ sample of FIG. 11C.

Figure 12A:
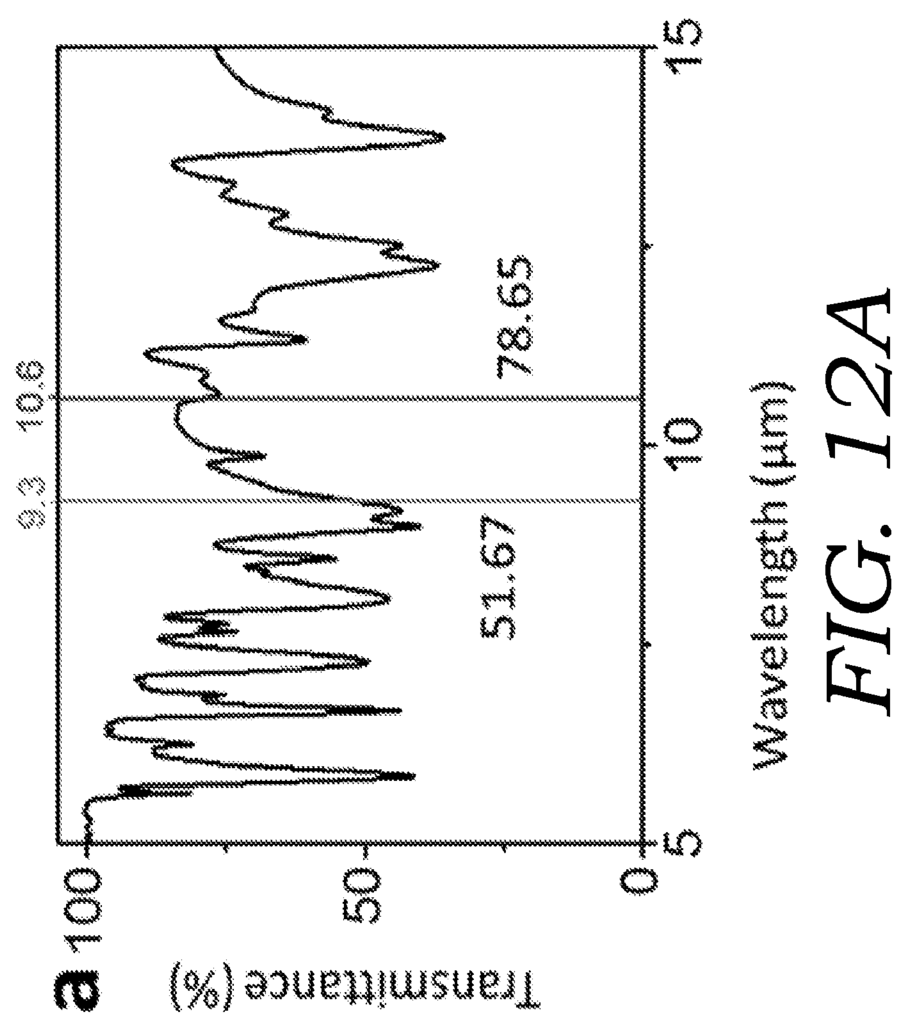
FIG. 12A is an IR transmittance spectrum of PI with ~52% transmittance at 9.3 μm and ~79% at 10.6 μm.

In prior reports by the inventors [Lin 2014], the inventors suggested that the carbonization process was induced by a photothermal process. Therefore, higher laser absorption would result in better carbonization. By Fourier transform infrared spectroscopy (FTIR), the absorption of PI at 9.3 μm is ~2.3×larger than at 10.6 μm. See FIG. 12A.

Figures 12B, 12C:
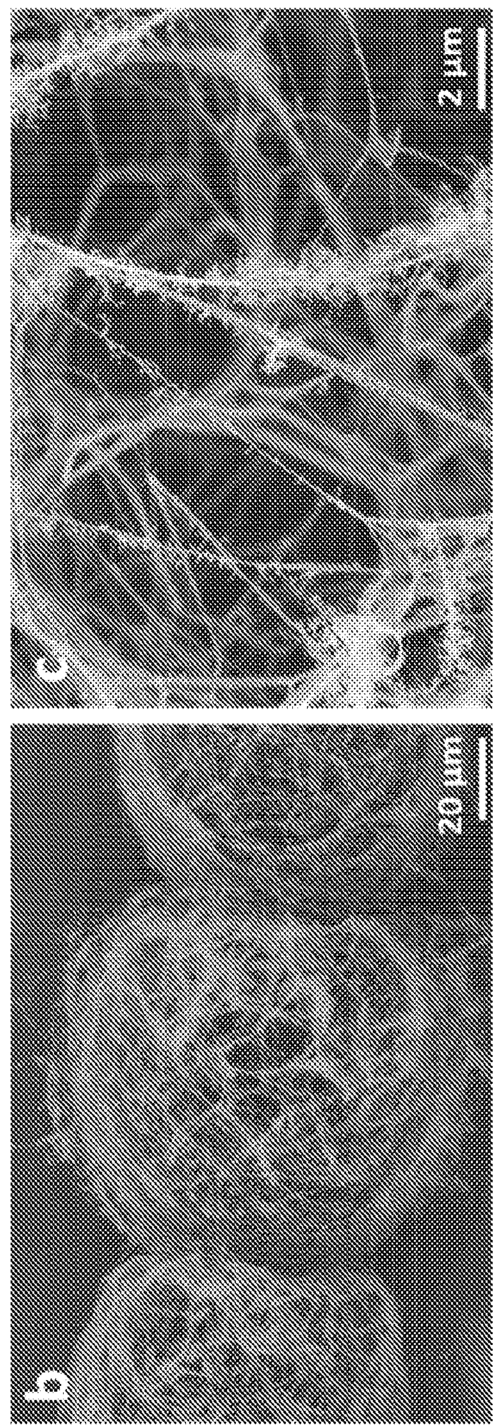
FIG. 12B-12C are SEM images of single laser pulses with a fluence of 3.2 J/cm$^2$ with many CNPs being observed.
Figure 13A:
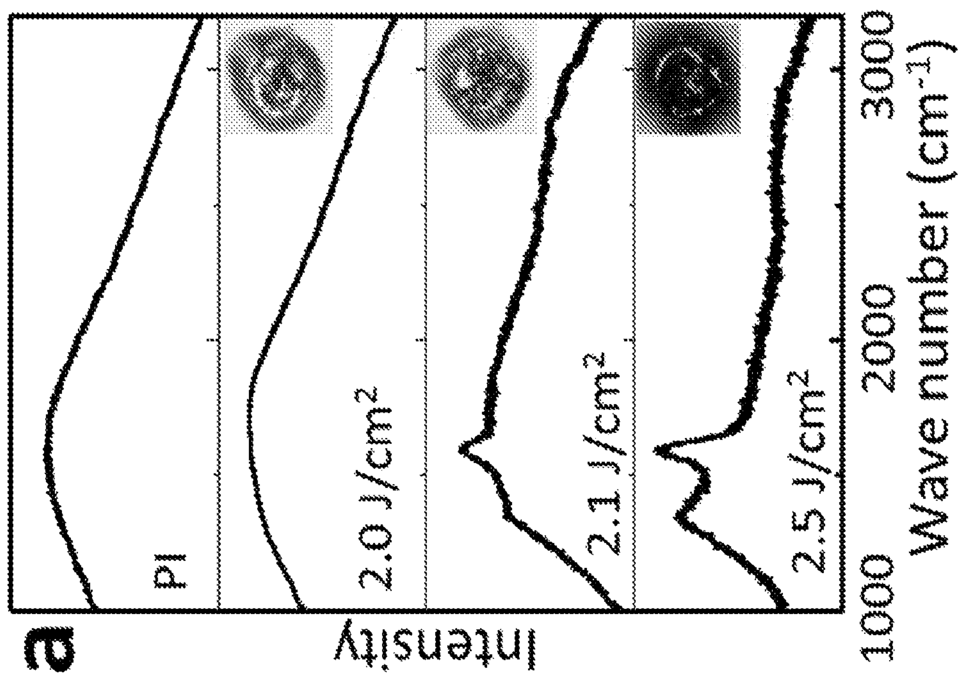
FIG. 13A is the Raman spectra of the carbon layer resulting from variable fluence lases of a 9.3 μm laser with optical image insets.
Figure 13B:
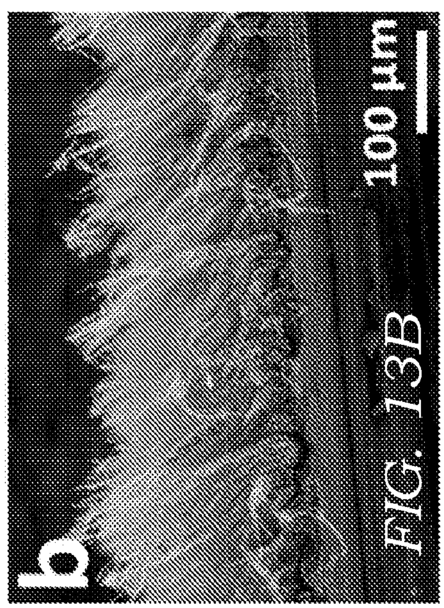
FIG. 13B is an SEM image of a LIGS forest made with a 9.3 μm laser and 25.2 J/cm$^2$ fluence.
Figure 13C:
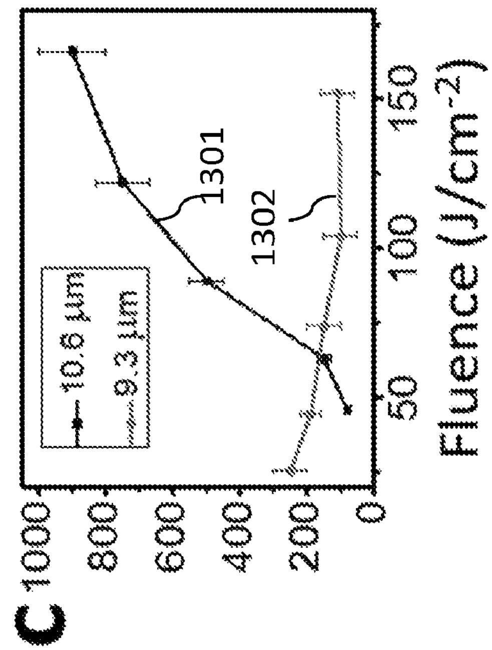
FIG. 13C is a graph showing LIGS height of both 10.6 μm and 9.3 μm lases with variable fluences (plots 1301-1302, respectively).

In FIG. 13A, the 9.3 μm laser was used for the laser induction on PI sheets, and the Raman and optical microscopy results revealed that the critical carbonization point was ~2.1 J/cm$^2$, which is ~2.3×less than the value 4.9 J/cm$^2$ when using the 10.6 μm laser. Even though the absorption and critical point of carbonization agree well with each other (the absorption of PI at the 9.3 μm wavelength infrared is 2.3×larger than that of the 10.6 μm wavelength infrared), one cannot completely attribute the fluence at carbonization only to the absorption; other factors, such as heat conductivity or changes of IR absorption at higher temperatures, could also play a rule. Nonetheless, there is a correlation. The morphology differences can be seen in FIGS. 12B-12C such that at high fluence, LIGS and CNPs are favored nanostructures because with higher absorption at 9.3 μm, only thin layers of PI receive the laser energy, possible resulting in more abrupt liquid dynamics than obtained with the 10.6 μm laser. Interestingly, as the fluence increases, the thickness of the LIGS decreases. It is believe this is because of the higher production of CNPs or vaporization of the PI. If only hundreds of microns of LIGS are needed, use of a strong absorption laser can be possible. Otherwise, if the application needs LIGS at thicknesses of about 1 mm, weak absorption lasers such as the 10.6 μm $CO_2$ laser afford these thick LIGS forests.

Laser Parameters

The commercial Universal Laser Systems instrument had three adjustable parameters: (a) speed, the percentage of maximum speed that is 120 inches/s in raster mode and 40 inches/s in vector mode; (b) power, the duty cycle of the pulse width modulation (PWM); and (c) PPI, which is the density of the laser pulses. A Sciencetech 365 Power and Energy Meter was used to measure the fluence in the two modes, vector and raster mode.

Vector Mode.

Figures 14A, 14B:
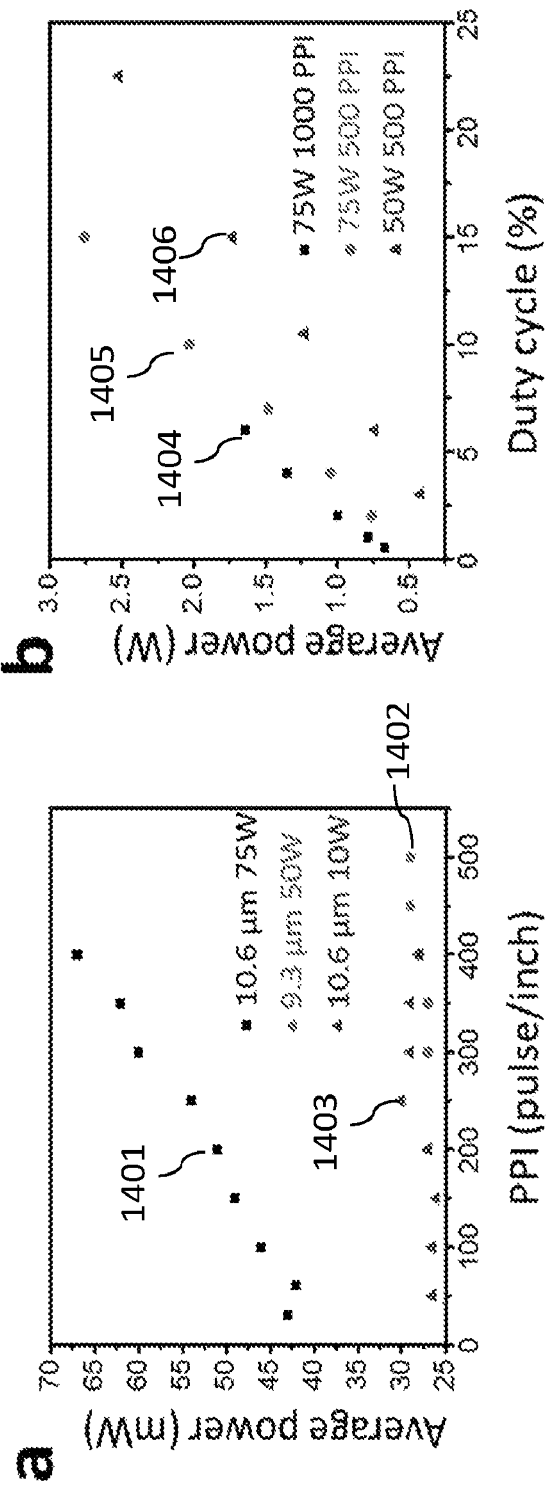
FIGS. 14A-14B are graphs showing average power of each laser that were used to calculate the fluence.
Figure 15A:
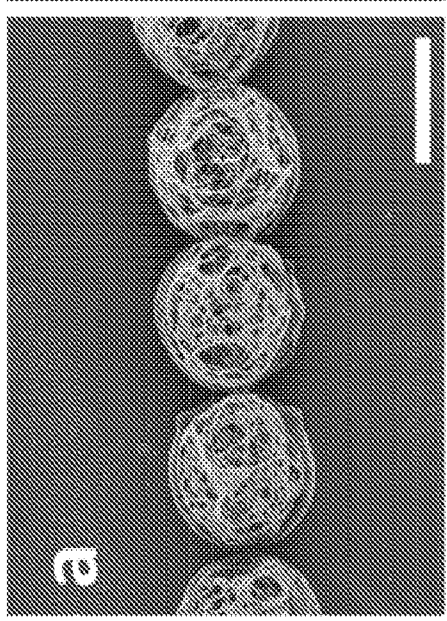
FIGS. 15A-15D are SEM images of 10.6 μm 75 W laser spot at carbonization point.
Figure 15B:
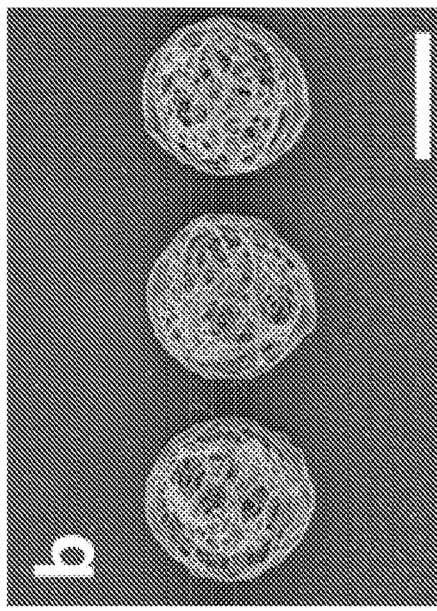
Figure 15C:
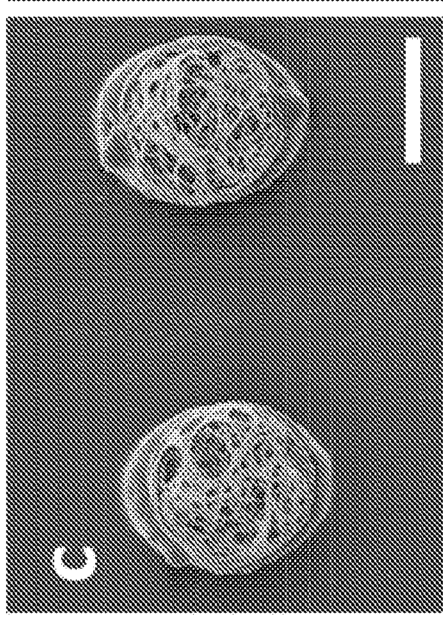
Figure 15D:
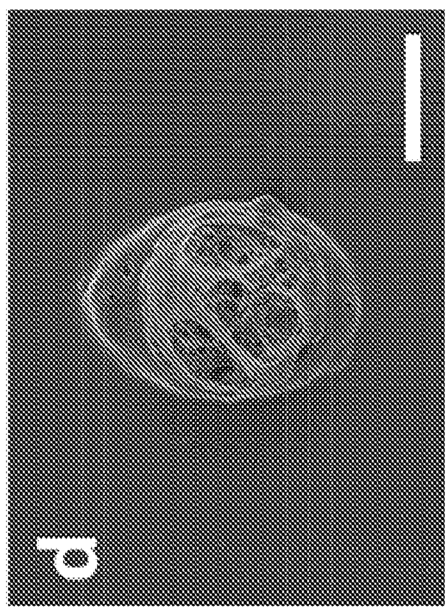
Figure 16B:
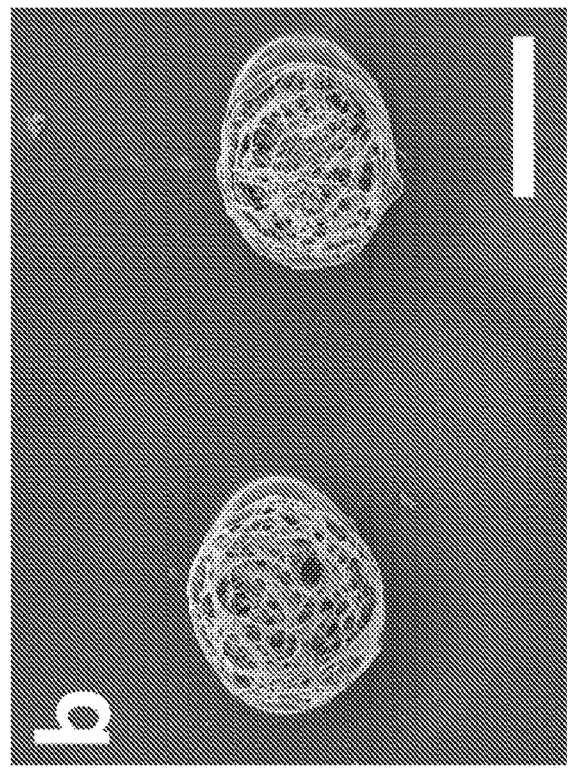
FIGS. 16A-16B are SEM images of 10.6 μm 10 W laser spot at carbonization point.
Figure 16A:
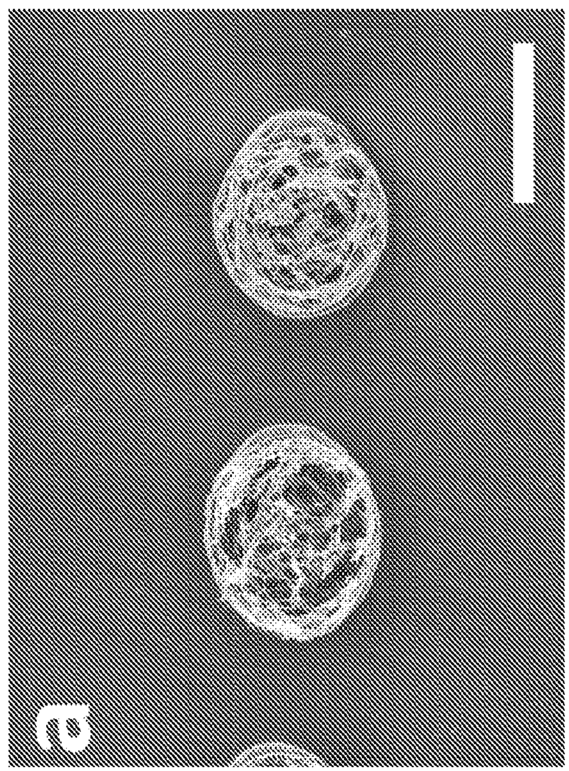

The vector mode was used to measure individual fluence of each laser pulse. The speed was set at 1% (0.4 inches/s). The duty cycle was set up at 0.1% for both the 75 W 10.6 μm and 50 W 9.3 μm laser and 1% for 10 W the 10.6 μm laser. The fluence was changed by changing the PPI. The laser fire within an infinite circle pattern around the energy meter disk and average power is measured after reaching equilibrium at ~1 min. FIG. 14A shows the various PPI in vector mode with laser parameter: 1% speed, 0.1% duty cycle for 10.6 μm 75 W laser (plot 1401), 0.1% duty cycle for 9.3 μm 50 W laser (plot 1402), and 1% duty cycle for 10.6 μm 10 W laser (plot 1403).

Fluence of the laser was then calculated using Eq 1:

$$H = \frac{1}{PPI \times 0.4}\frac{P_V}{S} \quad \text{(Eq 1)}$$

where the first term is the duration time for each cycle with $P_V$ being the average power of the laser taken from FIG. 14A. S is the area of the round laser spot taken from SEM image (FIGS. 15A-15D and 16A-16B).

Raster Mode.

The raster mode was used to measure the fluence of LIGS forest. The laser runs a pattern of 1 $cm^2$ square with fixed speed at 5% (6 inches/s), 500 PPI for LIGS and 1000 PPI for LIG. Average power $P_R$ is read at the end of the pattern in FIG. 14B, after ~1 min. FIG. 8B shows the raster mode with various duty cycle and fixed 5% speed, with 75 W 1000 ((plot 1404), 75W 500 PPI (plot 1405), and 50W 500 PPI (plot 1406).

Accumulated fluence (J/$cm^2$) of each laser spot is then calculated using Eq 2:

$$H = t \times P_R \quad \text{(eq 2)}$$

where t is the time for the laser to complete the square pattern (60 sec for 500 PPI and 117 sec for 1000 PPI).

LIGS Applications

The LIGS of the present invention can be utilized in a variety of utilities. Due to the high surface areas disorders within LIGS, Applicants expect improvements in such LIG applications. With higher yield and surface area, LIGS could serve as enhanced materials for numerous applications. Moreover, the fabrication of LIGS can be performed in ambient air with existing commercial laser systems and precursor materials (e.g., polyimides). Therefore, the fabrication methods are effective in terms of time and costs.

For instance, the LIGS can be utilized as components of energy storage devices, such as microsupercapacitors MSCs with in-plane interdigitated shape. The capacitance of the first generation of LIG-MSCs reaches to 4 mF/$cm^2$ [Lin 2014], comparable to other carbon based MSCs. Follow-up studies increased it to 16 mF/$cm^2$ by the use of solid-state electrolyte and boron doping [Peng 2015 B]. Additional research introduced pseudocapacitive materials into LIG devices by electrochemical deposition, and the capacitance value further increased to 950 mF/$cm^2$ [Li 2016].

The LIGS can also be utilized in the field of oxygen reduction reaction catalysts by in situ formation of metal oxide nanoparticles (as previously used on LIG [Ye 2015]).

Figure 17B:
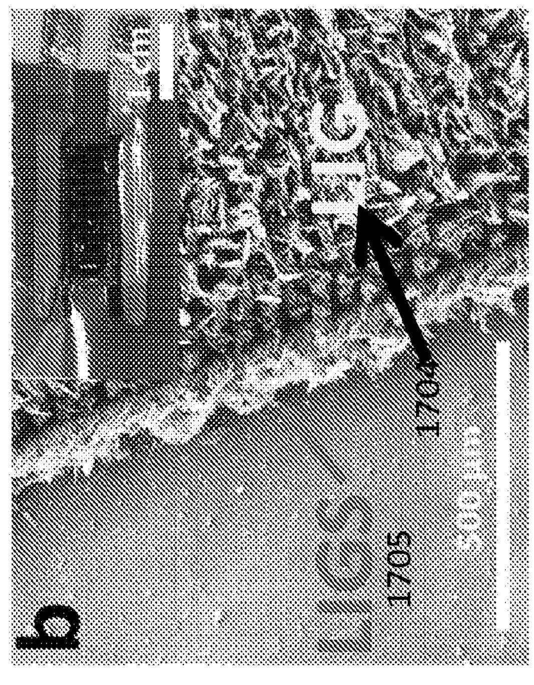
FIG. 17B is an SEM image of the edge of the LIG-LIGS-MSC showed the incorporated ~50 μm of LIGS.

Representative of an application of LIGS, in-plane interdigitated solid state MSC was fabricated from LIGS and compared it to MSCs fabricated from LIG alone. The interdigitated device size with neighboring electrode distances of 300 μm was kept the same as previously report [Lin 2014]. FIG. 17B is an SEM image of the edge of LIG-LIGS-MSC showed the incorporated ~50 μm of LIGS (with arrows pointing to LIG 1704 and LIGS 1705).

To fabrication the flexible all-solid-state MSCs, PVA/$H_2SO_4$ was used as the solid electrolyte for all of the devices. It was made by stirring 10 mL of DI water, 1.0 mL of sulfuric acid (98%, Sigma-Aldrich), and 1.0 g of PVA at 80° C. overnight. Approximately 0.25 mL of the electrolyte was applied to the active area of the devices, and was dried under ambient conditions for 4 h. The all-solid-state MSCs were obtained after drying in a vacuum desiccator (~120 mm Hg) overnight for further solidification of the electrolyte.

The electrochemical performances of the flexible all-solid-state MSCs were characterized by CV, galvanostatic charge-discharge experiments, and EIS using an electrochemical station (CHI 660D). The areal specific capacitance ($C_A$) and volumetric specific capacitance ($C_V$) of electrode materials were calculated from galvanostatic charge-discharge curves according to eq 3 and eq 4, respectively:

$$C_A = 4I/(A_{Device} \times (dV/dt)) \quad \text{(eq 3)}$$

$$C_V = 4I/(V_{Device}(dV/dt)) \quad \text{(eq 4)}$$

where I is the current applied, $A_{Device}$ is the total area of the device, $V_{Device}$ is the total volume of the device, and dV/dt is the slope of the discharge curve.

The areal capacitance ($C_{Device,\ A}$) and volumetric capacitance ($C_{Device,\ v}$) of the MSCs were calculated by using eqs 5 and 6, respectively:

$$C_{Device,A} = C_A/4 \quad \text{(eq 5)}$$

$$C_{Device,V} = C_V/4 \quad \text{(eq 6)}$$

Figure 17A:
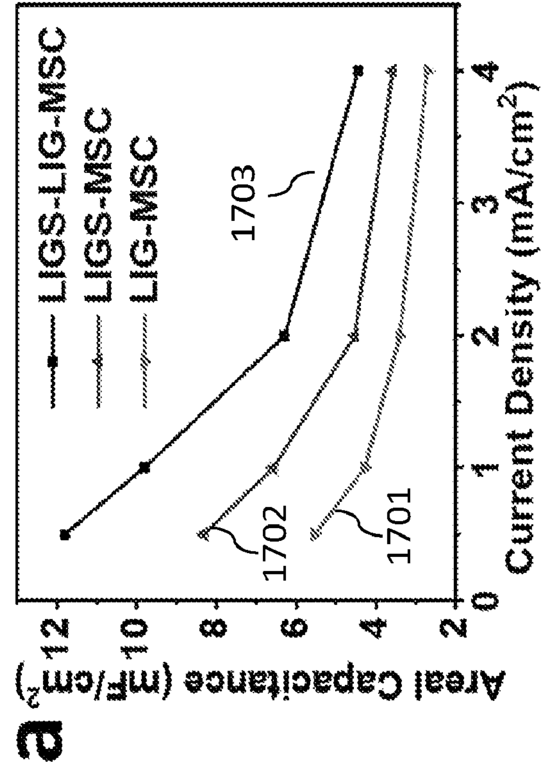
FIG. 17A is a specific area capacitance comparison of microsupercapacitor made with LIG, LIGS, and LIG-LIGS.

FIG. 17A is a specific area capacitance comparison of microsupercapacitor made with LIG (plot 1701), LIGS (plot 1702), and LIG-LIGS (plot 1703). As seen in FIG. 17A, the fabricated LIGS-MSC has a specific area capacitance higher than LIG-MSC by 50%.

One of the key elements of the MSC is the low sheet resistance. I.e., sheet resistivity is a key characteristic that indicates how the LIGS will perform in a device.

FIGS. 18A-18D are graphs that reflect sheet resistance with respect to various functions. For FIG. 18A, this shows sheet resistance as a function of laser duty cycle at various laser speeds (2%, 3% 4%, 5% 10% and 20% for plots 1801-1806, respectively), laser power 10 W, 500 PPI. For FIG. 18B, this shows sheet resistance as a function of laser duty cycle at various PPI, laser power 75 W (500 PPI at 2% and 5% speed for plots 1807-1808, respectively, and 1000 PPI at 2% and 5% speed for plots 1809-1810, respectively). For FIG. 18C, this shows sheet resistance as a function of fluence at 10 or 75 W laser power (plots 1811-1812, respectively). For FIG. 18D, this shows sheet resistance as a function of laser focus (which determines the laser spot size) (plot 1803).

Figure 18B:
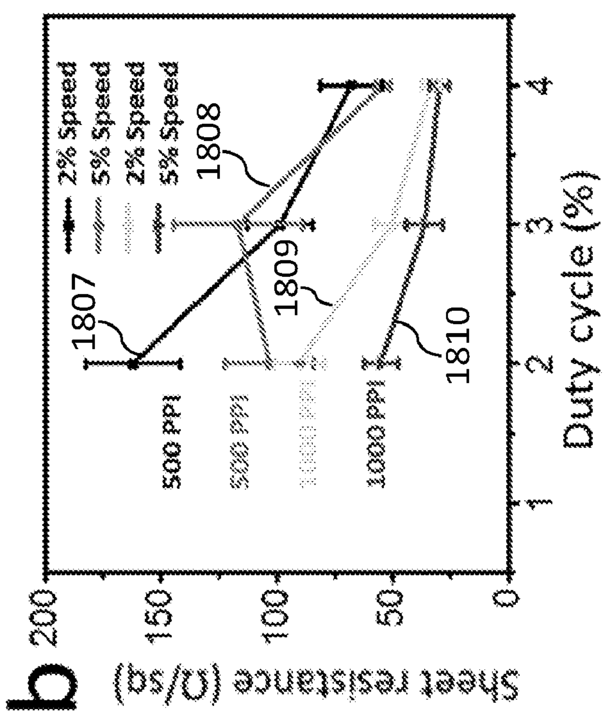
FIGS. 18A-18D are graphs that reflect sheet resistance with respect to various functions, which functions are: for FIG. 18A, laser duty cycle at various laser speeds, laser power 10 W, 500 PPI; for FIG. 18B, laser duty cycle at various PPI, laser power 75 W; for FIG. 18C, fluence at 10 or 75 W laser power; and for FIG. 18D, for laser focus (which determines the laser spot size).
Figure 18A:
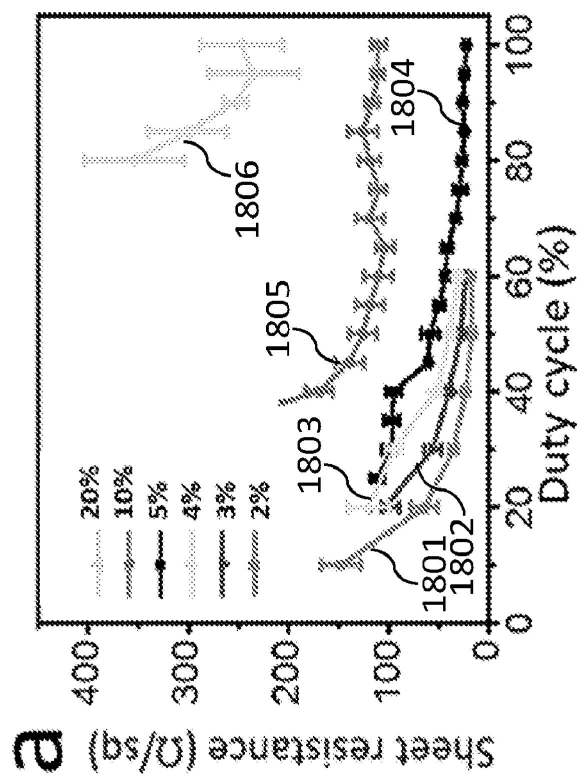
Figures 18C, 18D:
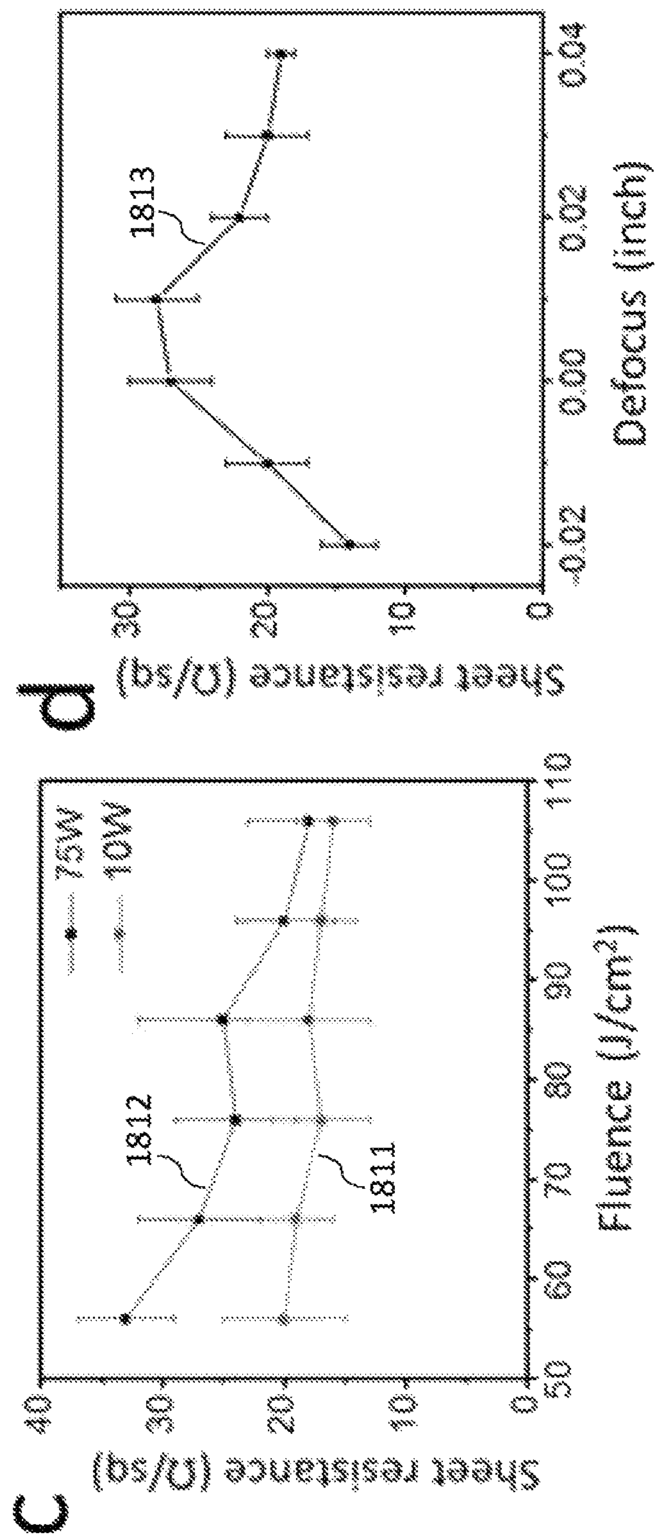

As shown in FIG. 18A, the LIGS sheet resistance is 100 to 200 Ω/sq, five times that reported for LIG at 20 Ω/sq. LIG that is fabricated with 1000 PPI (FIG. 1C inset) has more overlapping of laser pulses than the LIGS that is fabricated with 500 PPI (FIG. 1F inset). Thus, LIG is made with more electrical conductive pathways, resulting in lower sheet resistance when compared with LIGS. Therefore, to incorporate LIGS into LIG-MSC, the LIG-MSC was supplemented with a line of 50 μm LIGS. The specific area capacitance increased 2 times when compared to that from LIG. Hence, a small amount of LIGS introduced a large amount of charge storage capacity into the MSC.

Additional variations to the LIGS can be as follows:

For instance, the starting polymer to make the LIGS can be selected from a group consisting of polymer films, polymer fibers, polymer monoliths, polymer powders, polymer blocks, optically transparent polymers, homopolymers, vinyl polymers, chain-growth polymers, step-growth polymers, condensation polymers, random polymers, ladder polymers, semi-ladder polymers, block co-polymers, carbonized polymers, aromatic polymers, cyclic polymers, doped polymers, polyimide (PI), polyetherimide (PEI), polyether ether ketone (PEEK), polyamide (PA), polybenzoxazole (PBO), polyaramids, and polymer composites and combinations thereof. For instance, the polyamide (PA) can be Kevlar (and thus can encompass uses for the resulting LIGS materials of protection, armor, cryogenics, etc.)

The LIGS can be doped with one or more dopants. The dopants can include, without limitation, heteroatoms, metals (e.g., metal salts), and combinations thereof. The dopant can be boron. The dopant can be a metal nanoparticle that forms as metal nanoparticle-doped structure.

Different kinds of environments may be used in the fabrication of LIGS. For instance, different laser conditions may be utilized in the fabrication of LIGS.

LIGS can have lower surface resistance than LIG due to laser pulses that do not overlap effectively. Larger laser spot sizes with the same radiation density may be utilized with more overlapping between each pulses in order to enhance surface resistance.

LIGS can be combined with LIG.

Various gases may be introduced into the LIGS fabrication environment.

Laser-Induced Removal of LIG and LIGS

Embodiments of the present invention further include a laser-induced removal process to remove LIG from a LIG material (or LIGS from a LIGS material). While the discussion below focuses primarily on laser-induced removal of LIG, the present invention also applies to LIGS.

PI films can be converted into LIG by treatment with a 10.6 μm $CO_2$ laser. The minimum line width that could be fabricated was ~100 μm. A laser-induced removal process has been discovered to etch away the LIG, such as using a 1.06 μm fiber laser. This provides the ability to make 10 times finer patterns, and to use it as an etching process, to either selectively thin the LIG or to etch it all the way down to the base PI layer. In this manner, 3D control can be obtained in patterning of the LIG thickness and resistivity. This permits far great dynamic control of the LIG process. This also permits the more controlled patterning of LIG designs in electronics and water purification platforms devices.

The laser-induced removal process can include that the wavelengths of the lasers for the two laser-induction steps are not the same, i.e., the wavelength of the laser used to create the LIG is different than the wavelength of the laser used to perform the laser-induced removal of the LIG.

The laser-induced removal process can also and/or alternatively include that the laser-induced removal step is performed in predetermined patterns.

The laser-induced removal process can also and/or alternatively include that the laser-induced removal step is repeated over the same area of the LIG to result in deepening of successive laser-induced removal depths.

For instance, in embodiments of the present invention, a laser system (Universal laser system XLS10MWH) was utilized with the substrate being commercial Kapton polyimide sheet, 0.005" thickness. The conditions to make the LIG sheet (to be used for removal) were 75 W 10.6 μm laser operating at 6 kHz and 2% duty cycle with 1000 pulses/inch image density and patterning speed of 6 inches/s. The initial LIG sheet resistance: 40 Ω/sq., thickness: 40 μm. The fiber laser conditions (for the removal scans) were a 50 W 1.06 μm laser operating at 30 kHz and varying duty cycle with 1000 pulses/inch image density and patterning speed of 6 inches/sec.

Figure 19A:
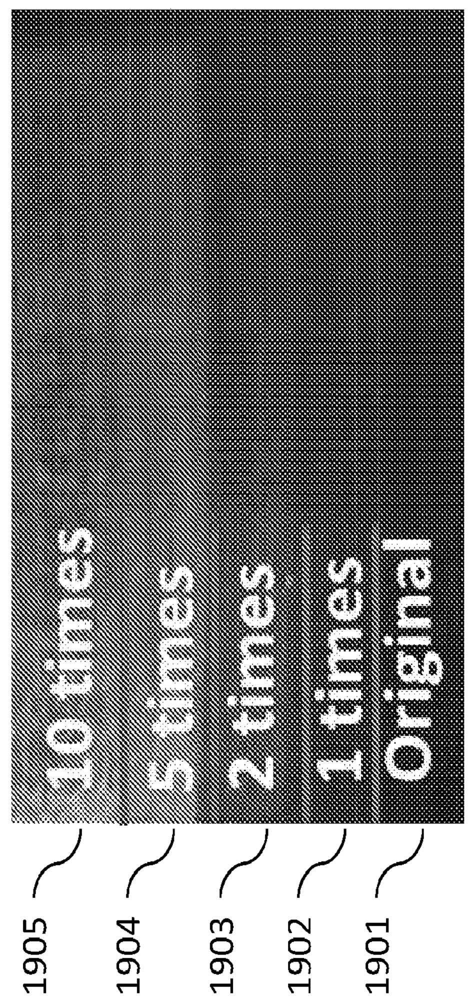
FIGS. 19A-19B are optical images (reflectance and transmittance, respectively) of LIG with noting the number of times (scans) for its removal using a 1.06 μm laser.
Figure 19B:
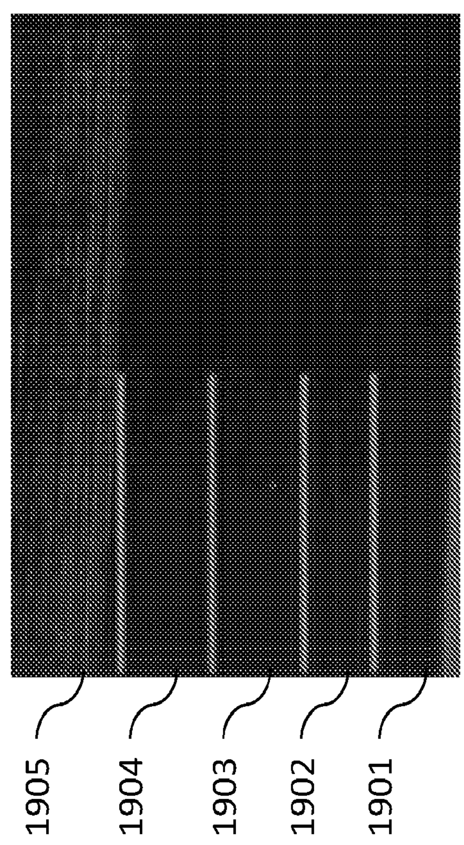

FIGS. 19A-19B are optical images (reflectance and transmittance, respectively) of the LIG sheet. These figures note the number of times (scans) for such removal using the 1.06 μm laser, which number of scans 1901-1905 are original (0), 1, 2, 5, and 10 scans, respectively. As shown in FIGS. 19A-19B, the fiber laser removed LIG with each successive scan. After ten scans, the bare polyimide appears with small light transmittance, the LIG becoming discrete.

Figure 20:
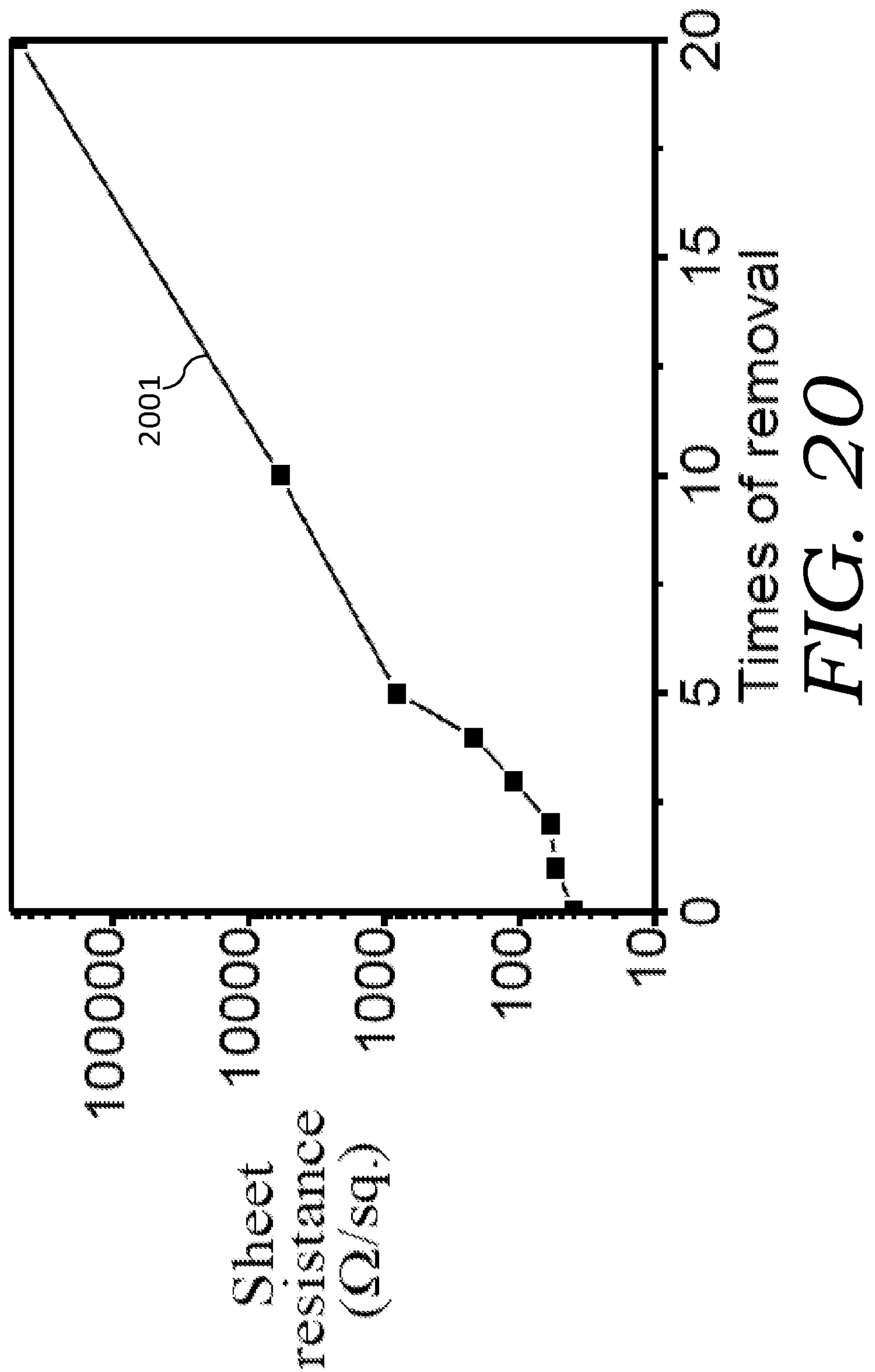
FIG. 20 is a graph showing sheet resistance of a LIG material versus the number of removing scans of the material.
Figure 21A:
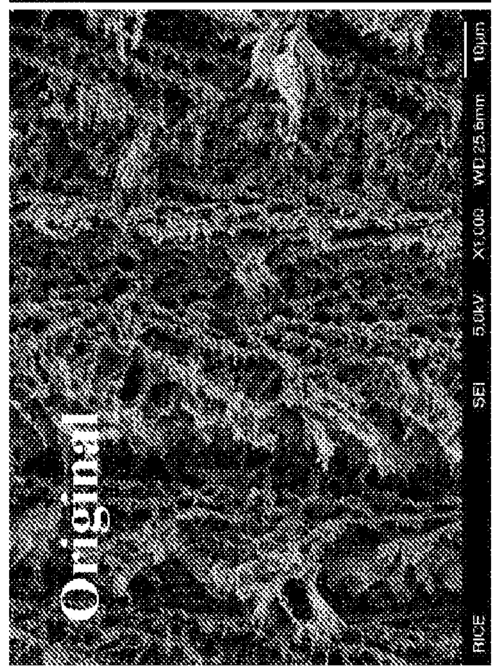
FIGS. 21A-21B are SEM images of an original sample of LIG at the surface and cross-section, respectively.
Figure 21B:
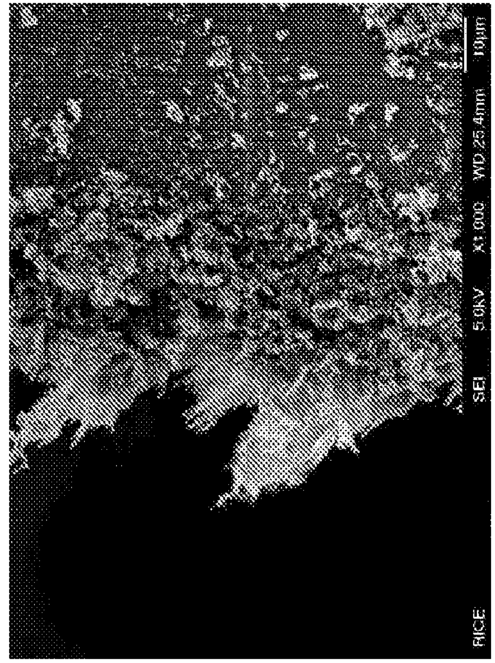
Figure 21C:
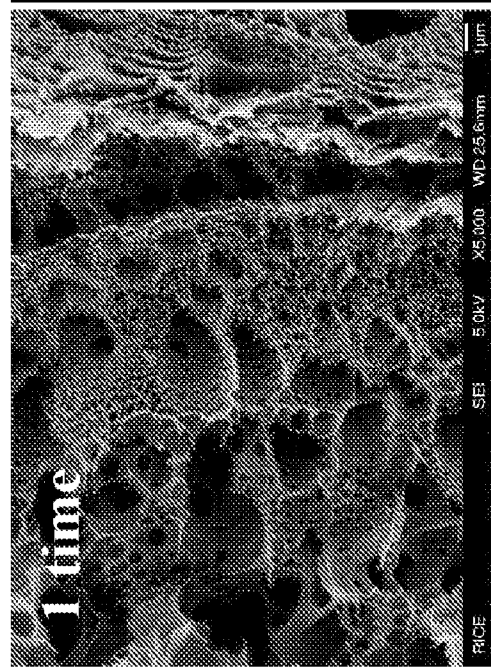
FIGS. 21C-21D are SEM images of the sample of LIG at the surface and a cross-section, respectively, after one removal scan.
Figure 21D:
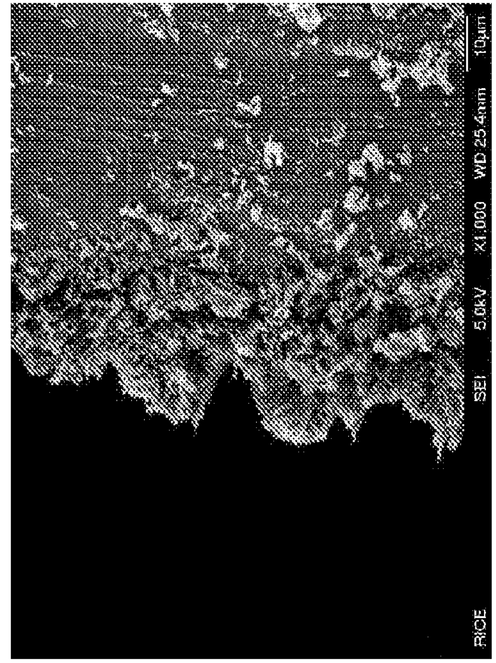
Figure 21E:
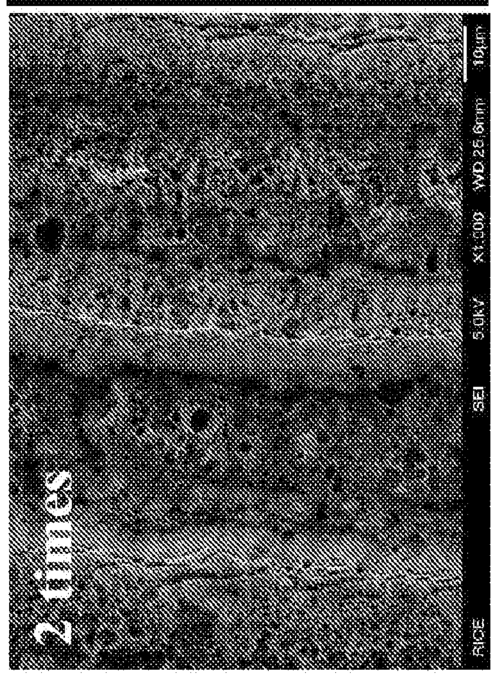
FIGS. 21E-21F are SEM images of the sample of LIG at the surface and a cross-section, respectively, after two removal scans.
Figure 21F:
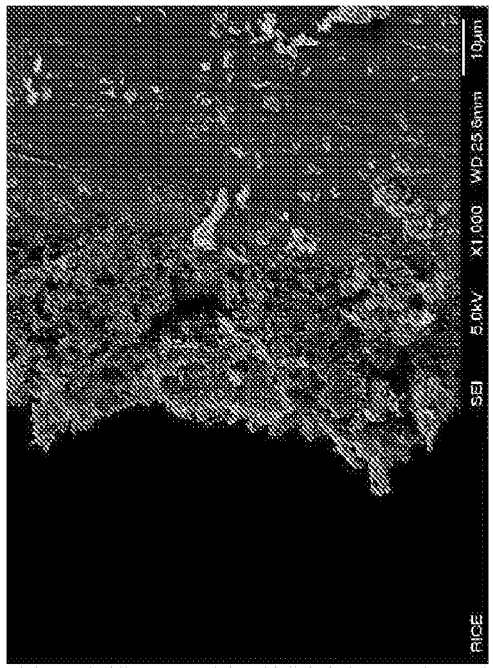
Figure 21G:
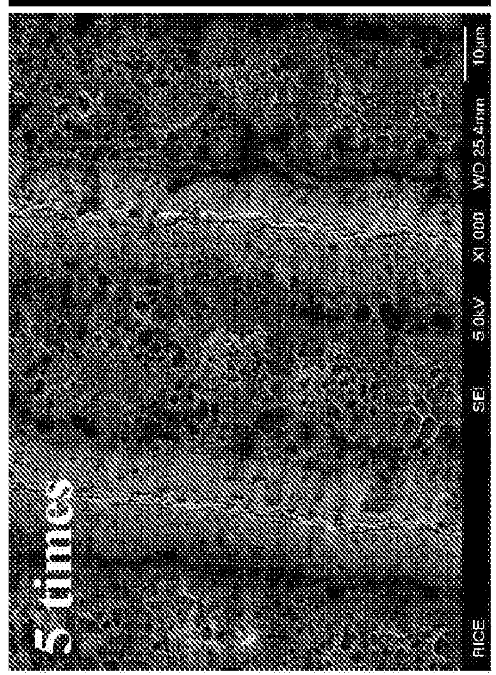
FIGS. 21G-21H are SEM images of the sample of LIG at the surface and a cross-section, respectively, after five removal scans.
Figure 21H:
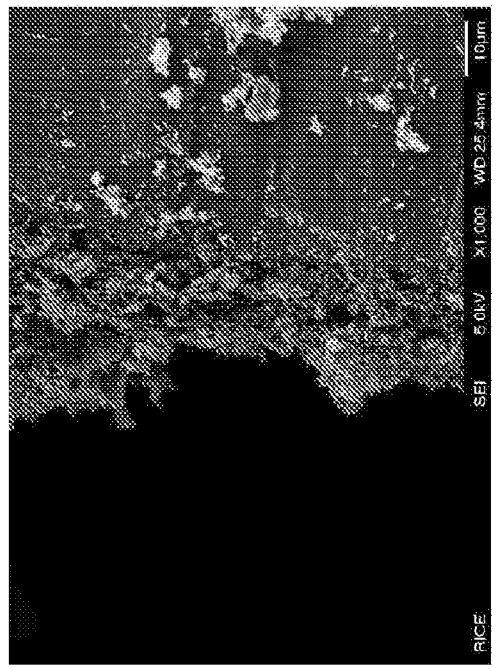
Figures 21I, 21J:
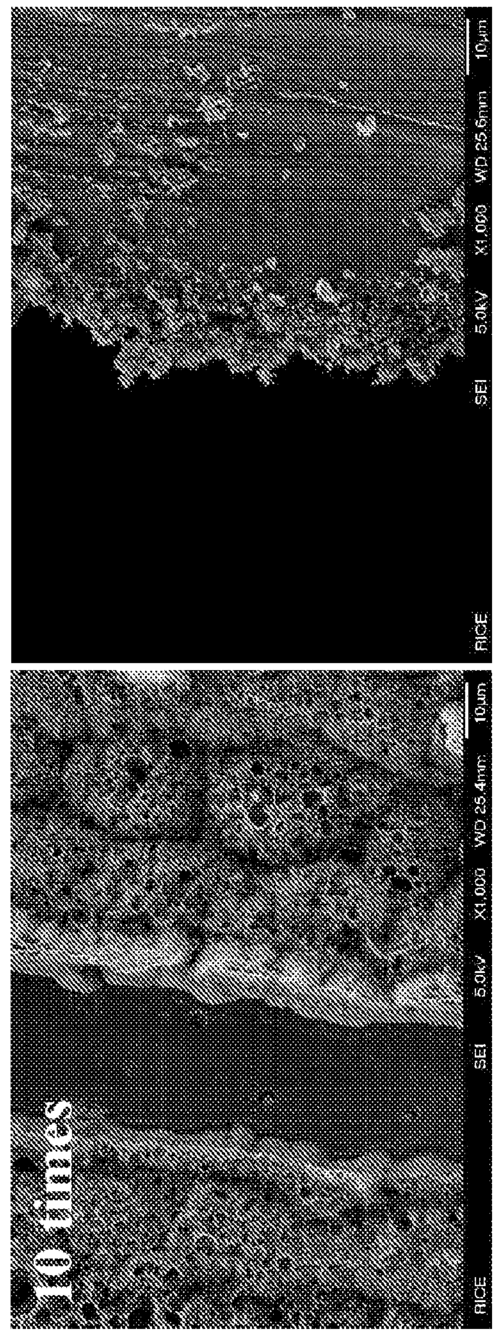
FIGS. 21I-21J are SEM images of the sample of LIG at the surface and a cross-section, respectively, after ten removal scans.

FIG. 20 is a graph showing plot 2001 of sheet resistance of a LIG material versus the number of removing scans of the material. As shown in FIG. 20, under 5 times of removal, the LIG still maintained good sheet resistance. However, after 10 times, the discrete LIG become non-conductive.

This is further confirmed by the SEM images of FIGS. 21A-21J, which shown the effect of the fiber laser on the LIG sheet. After the first scan (shown in FIGS. 21C-21D), the fiber laser scan only removed the top layer of LIG resulting in only small change in the sheet as compared to the original sheet shown in FIGS. 21A-21B (which small change is consistent with the small change sheet resistance reflected in FIG. 20). The LIG layer after ten times was considerable thin and discrete result in very high sheet resistance. At ten times of removal (shown in FIGS. 21I-21J), the bare PI can be seen in SEM, i.e., FIGS. 21I-21J reveal that, after ten scans, the entire central line of LIG has been removed down to the polyimide surface. This is consistent with what was seen in the optical images in FIGS. 19A-19B.

Figure 22:
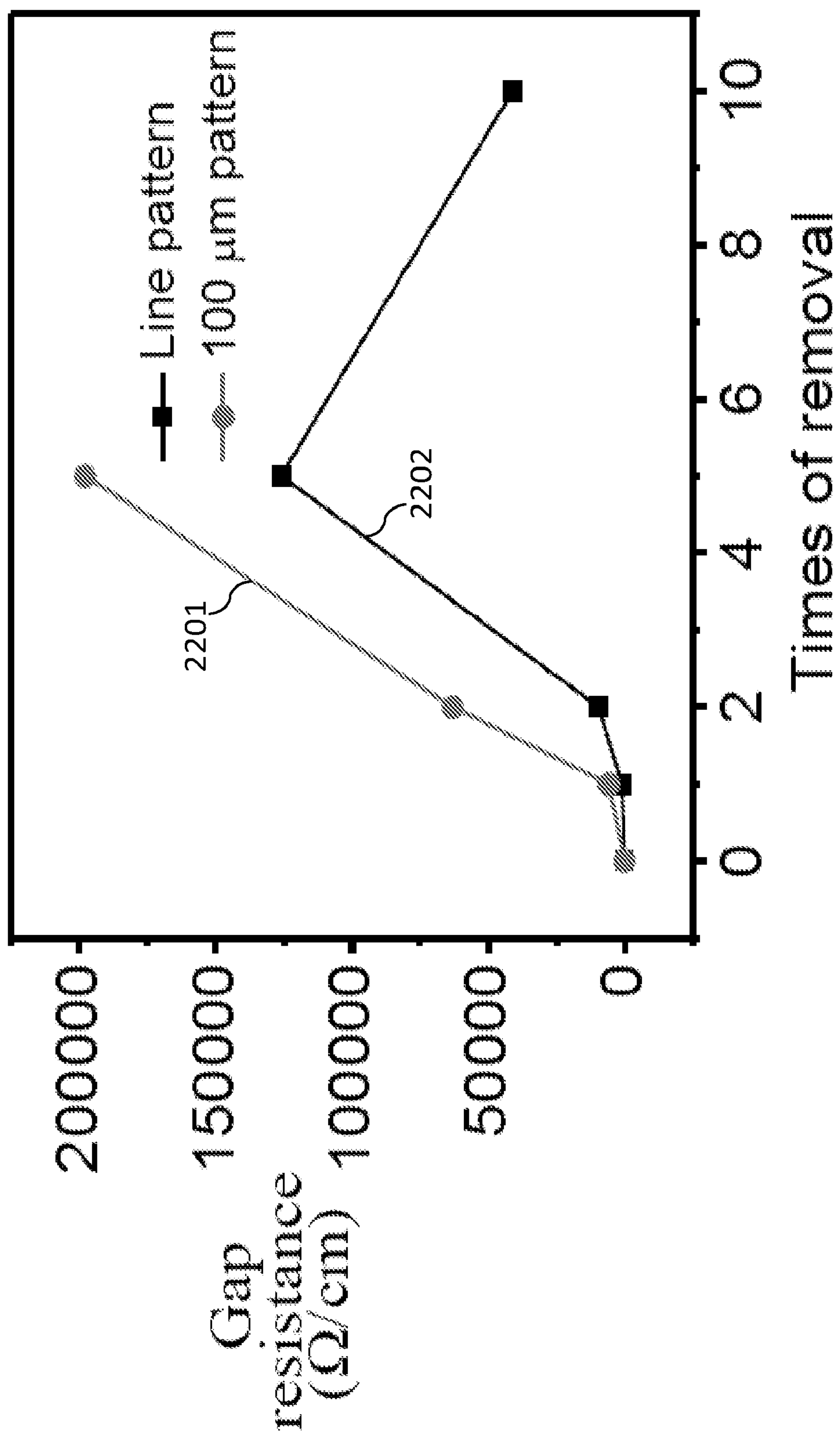
FIG. 22 is a graph showing sheet resistance of a LIG material having a 1 cm gap created by line pattern and 100 μm width pattern.

In embodiments of the present invention, gaps in the LIG can be removed with the laser-induced removal process. For instance, complete removal of the LIG in a gap can be obtained with 15% duty cycle fiber laser of 1.06 μm. A laser-induced removal process was utilized to form a 1 cm gap created by line pattern and 100 μm width pattern. A pattern of a line of 100 μm width was made 1 cm long as a gap between LIG. The gap increased resistance between two LIG portions separated by this gap. FIG. 22 is a graph showing sheet resistance of this LIG material with plots 2201-2201 corresponding, respectively, to the line pattern and 100 μm width pattern. As shown in FIG. 22, increased resistance was created by the two gaps with increased number of removing laser-induced removal scans.

Figures 23A, 23B:
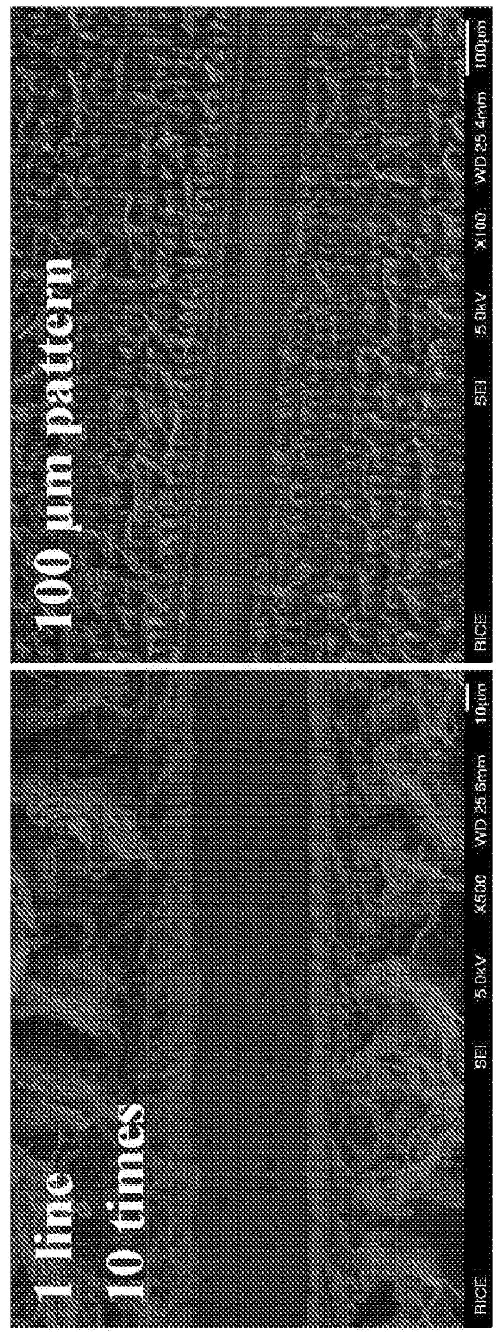
FIGS. 23A-23B are SEM images of a LIG material having, respectively, a line pattern and 100 μm width pattern after ten removal scans.

FIGS. 23A-23B are SEM images of this LIG material having, respectively, a line pattern and 100 μm width pattern after ten removal scans. From the SEM images, it was determined that the gap width created by the line pattern is the, which is the thinnest gap that can be made by fiber laser. The resistance of the gap is basically the resistance of PI itself. Precise gap widths can thus be made by calibrating the computer pattern 40 μm less than desired gap width.

Figures 24E, 24F:
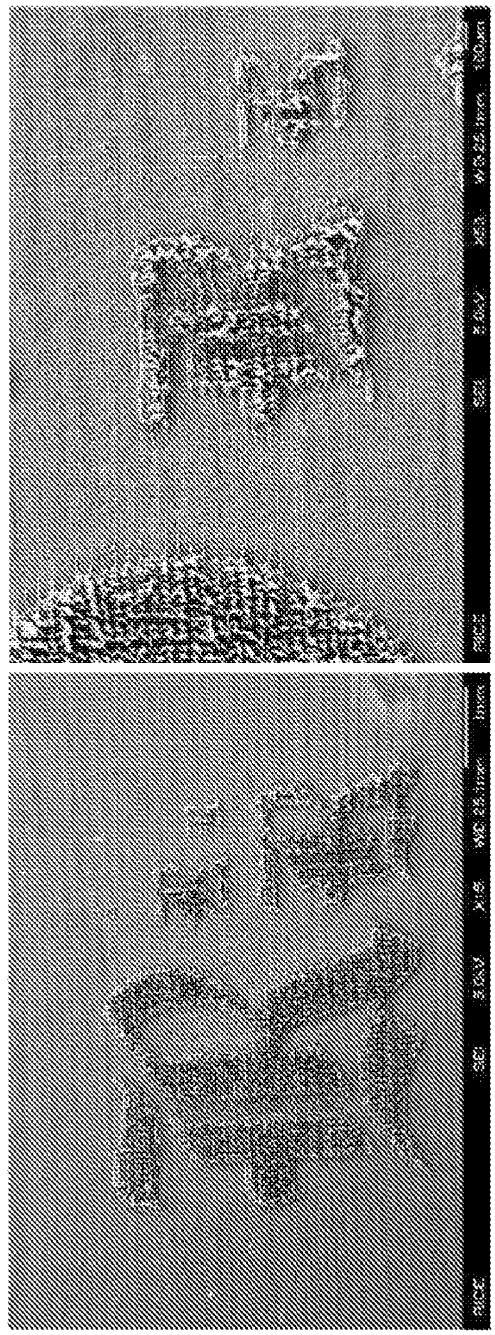

To further confirm this "R" letters from LIG on a PI substrate were generated by three different approaches. FIGS. 24A-24B are images of "R" letters made by a normal laser scribing LIG process with a 10.6 μm laser interacting with a PI film in the shape of the letters "R". FIGS. 24C-24D are images of "R" letters made by starting with the entire area coated by LIG and then selectively removing LIG regions using the 1.06 μm laser to have the letters "R" shown directly on the PI base surrounded by LIG. FIGS. 24E-24F are "R" letters made from LIG, which were made by first coating the entire surface with LIG using the 10.6 μm laser, then removing most of the surrounding LIG using the 1.06 μm fiber laser.

This process thus provides improved resolution and control. The ability to remove the conductive LIG and change it back to insulator if desired adds enormously to the control of the LIG protocol. In this process, the resolution of the fiber laser is much higher than $CO_2$ laser (by at least an order of magnitude). Therefore, precise LIG patterning with micron-scale resolution can be attainable with this technique. For instance, micro-supercapacitor performance can be improved using smaller gaps available by fiber laser for electrode separation.

Implementations of this laser-induced removal process also include:

Precise removal thickness can be accomplished by optimizing laser condition.

Thinner gap can be fabricated with better fiber laser optics.

Use of shorter wavelength lasers for more selective etching.

Different laser wavelengths can be used for this removal process. Just as multiple wavelengths laser can be used to make LIG from multiple different starting polymers, multiple lasers can be used to remove LIG, including lasers having wavelengths other than 1.06 μm.

For instance, the starting polymer can be selected from a group consisting of polymer films, polymer fibers, polymer monoliths, polymer powders, polymer blocks, optically transparent polymers, homopolymers, vinyl polymers, chain-growth polymers, step-growth polymers, condensation polymers, random polymers, ladder polymers, semi-ladder polymers, block co-polymers, carbonized polymers, aromatic polymers, cyclic polymers, doped polymers, polyimide (PI), polyetherimide (PEI), polyether ether ketone (PEEK), polyamide (PA), polybenzoxazole (PBO), polyaramids, and polymer composites and combinations thereof.

The thickness of the polyimide (or other materials utilized when forming the LIG) can be varied.

The LIG can vary in thickness and density.

The laser-induced removal process can vary in depth and width.

The laser-induced removal process can be utilized on LIGS.

3D Printing of LIG and LIGS Using LOM Process 2D graphene cannot meet the mass and volume demands of current-day energy storage devices nor sustain exceptional electrical properties under intense mechanical stress. Thus, in order to pursue high mass and volume demanding applications, it is necessary to integrate the properties of 2D graphene into macroscopic, three-dimensional (3D) structures.

Several different prior art methods have been developed to produce 3D graphene macrostructures, dubbed graphene foams (GF). The current fabrication process of graphene foam can be categorized in one of two categories: (1) growth of graphene in porous metal foam and (2) printing and reduction of graphene oxide (GO) dispersion. The former method uses metal foam as the growth substrate to grow monolayer or few-layers graphene on the surface of the porous foam. Then the metal is etched in aqueous solution. In that case, the shape of the graphene foam is defined by the original metal foam. The latter method used concentrated GO dispersion as overhead printing material; the printed samples were then freeze dried and reduced to rGO foam.

Embodiments of the present invention further include processes for 3D printing of LIG and LIGS using a laminated object manufacturing (LOM) process. LOM is a rapid prototyping system. In general terms, in a LOM process, layers of adhesive-coated paper, plastic, metal laminates, or other materials, are successively adhered together and cut to shape, such as with a knife or laser cutter. 3D objects printed with this technique may be additionally modified, such as by machining or drilling after printing. Embodiments of the present invention is an LOM process that can be utilized to fabricate layer by layer to build up graphene objects in a printing mode operation Inventors of the present invention believe that the present invention is the first known process that can be utilized to 3D print graphene objects.

LIG and LIGS can be utilized alone or in combination in the present invention. Such LIG and LIGS can be those materials described above, as well as the materials described in Lin 2014, the Tour '351 PCT Application, and the Tour '060 PCT Application.

For instance, in embodiments of the present invention, a laser system (Universal laser system XLS10MWH) was utilized with the substrate being commercial Kapton Polyimide sheet, 0.005 inch thickness. The printing layer was a thin commercial Kapton Polyimide sheet, with 0.001 inch thickness for the LIG and commercial Kapton Polyimide sheet, 0.005 inch thickness for the LIGS. The laser parameters were 75 W 10.6 μm laser operating at 3 kHz and varying duty cycle according to the process with 500 pulses/inch image density and patterning speed of 6 inches/sec.

Figure 25A:
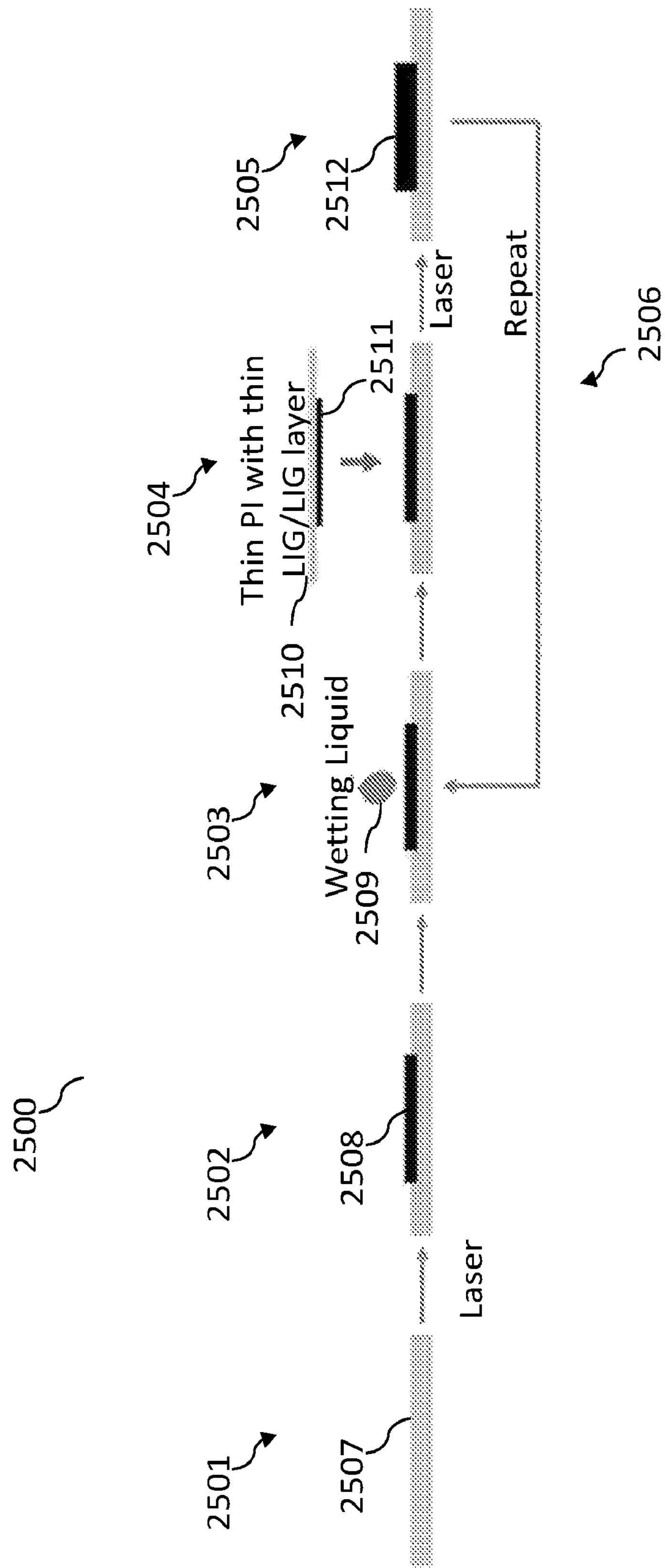
FIG. 25A is schematic of a 3D printing process of embodiments of the present invention.
Figures 25B, 25C:
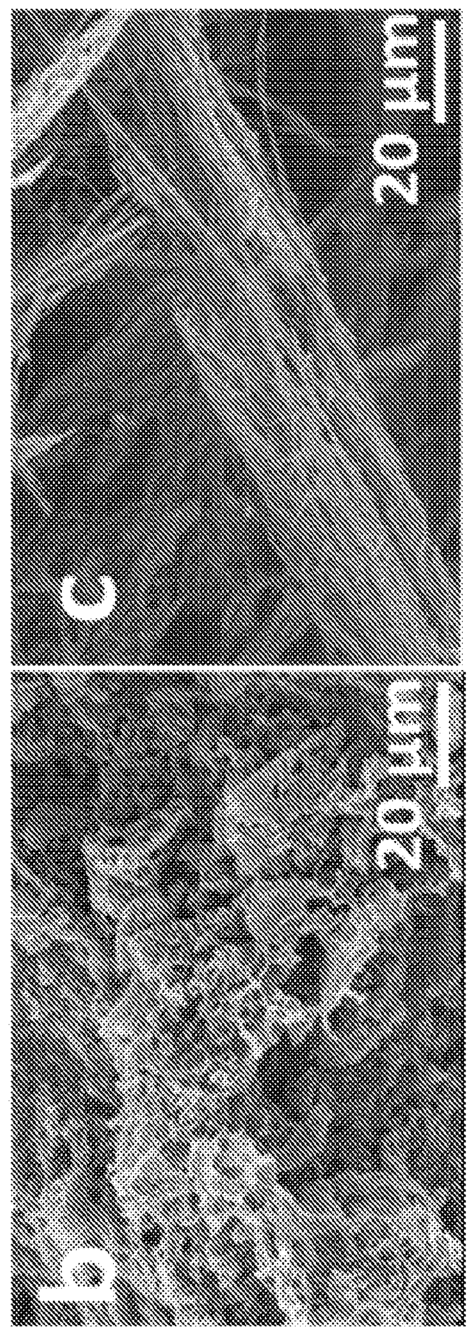
FIGS. 25B-25C are SEM images of the 3D printed LIG and 3D printed LIGS, respectively.

FIG. 25A is schematic of a 3D printing process 2500 of the present invention. While the 3D printing process 2500 can be used for LIG and LIGS, individually or in combination, the process will first be described with respect to LIG.

In step 2501, a pre-LIG substrate 2507 is selected (such as polyimide substrate).

In step 2502, a laser is used to generate LIG 2508 on one side of substrate 2507. For instance, the printing polyimide substrate is pre-LIG with one side with 0% duty cycle and is LIG with 2% duty cycle. This first layer is laid out as a foundation or base.

In step 2503, a wetting liquid 2509 (such as ethylene glycol/water at a 1:4 ratio) is used to wet the LIG 2508 on the one side of substrate 2507.

In step 2504, a second substrate 2510 (such as a thin polyimide substrate, e.g., as described above) that has a thin layer of LIG 2511 are then brought into contact with sides having the LIG 2508 and the LIG 2511 facing one another (i.e., the LIG 2508 and the LIG 2511 are brought into contact with each other). This can be done by hand or by an automated process.

In step 2505, a laser is refocused on the other side of the second substrate 2510 (i.e., the side opposite the side with the thin layer of LIG 2511). The lasering of step 2505 can be performed, for example for LIG, with a 2% duty cycle.

The role of the wetting liquid 2509 is to adhere the LIG 2508 and the thin layer of LIG 2511 to each other and to protect the LIG 2508 from excessive laser. Ethylene glycol can be used as the binding agent due to its ease of wetting the LIG 2508, acting as an adhesive through capillary force between layers, as well as its high boiling point so it can protect the LIG from the excessive lasing.

From this step 2505, the resulting thicker LIG 2512 is now formed on substrate 2507. I.e., the sandwiched layers are then lased, fusing together the LIG sheets. Such step is referred to as adding a layer of the LIG.

In step 2506, the substrate 2507 having LIG 2512 is then returned to step 2503 and the process is then repeated to add additional layers of LIG.

In some embodiments no wetting liquid 2509 is needed to adhere the first and second substrates, so step 2503 can be eliminated. In such case, the process goes from step 2502 directly to step 2504, and, in step 2506, the substrate is then returned to step 2504 for adding additional layers.

In some embodiments, the second substrate 2510 is a thin precursor graphene material that does not have LIG (or LIGS). The second substrate 2510 is then adhered to the substrate 2507 (on the side with LIG 2508) and then the process is performed.

It should be noted that, for LIG, utilizing a duty cycle greater than 2% will generally mill the LIG, and utilizing a duty cycle lower than 1.5% or a defocused laser will typically result in layer of LIG that will not properly adhere to the other LIG substrate.

Furthermore, to evaporate the wetting liquid (such as after the LOM process is complete or during an intermediary stage), the printed LIG can be is annealed, such as 170° C. for 30 minutes in air.

Figure 26A:
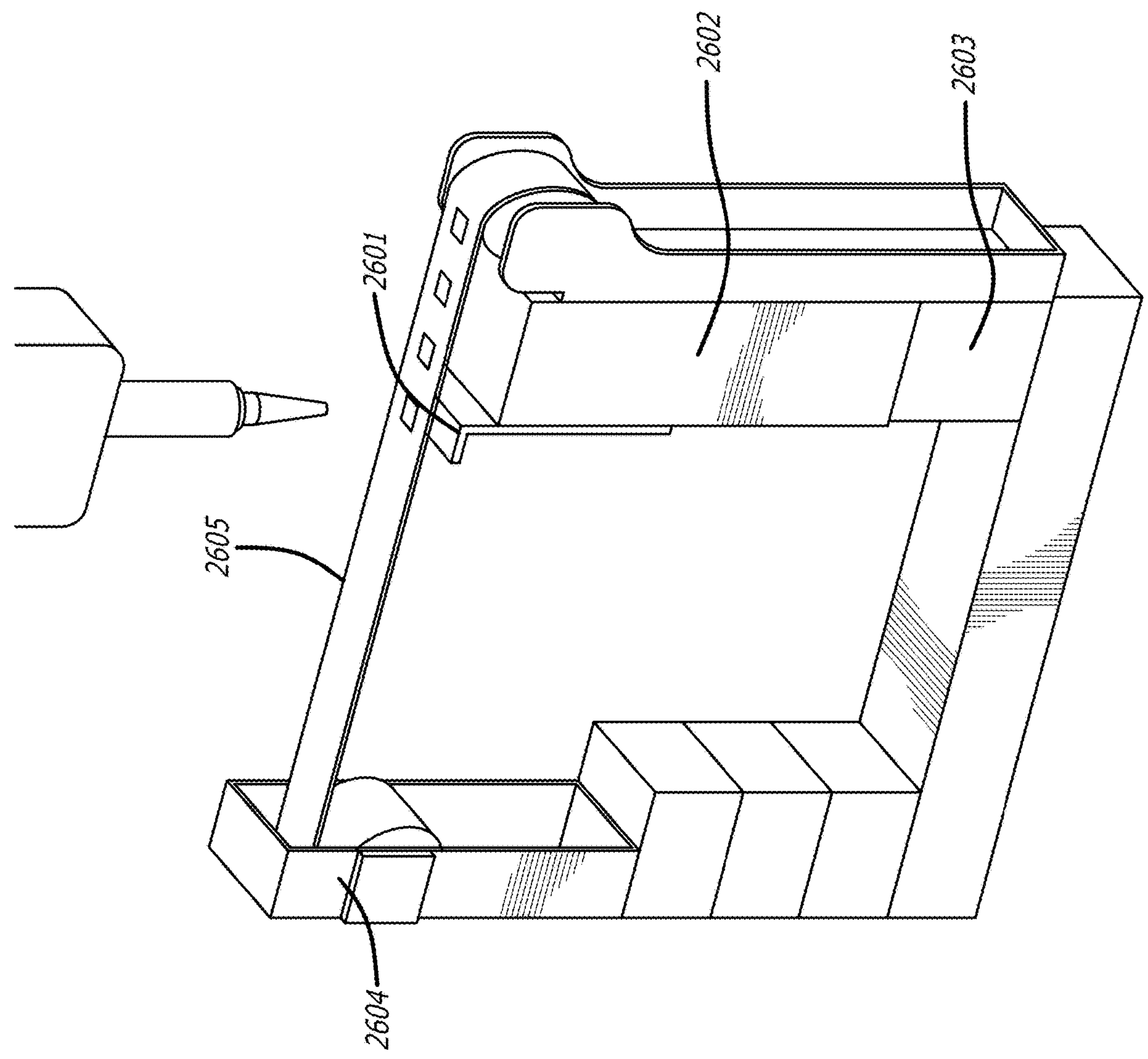
FIGS. 26A-26B are different perspective views of a schematic of an automated LOM process to make 3D LIG or LIGS.
Figure 26B:
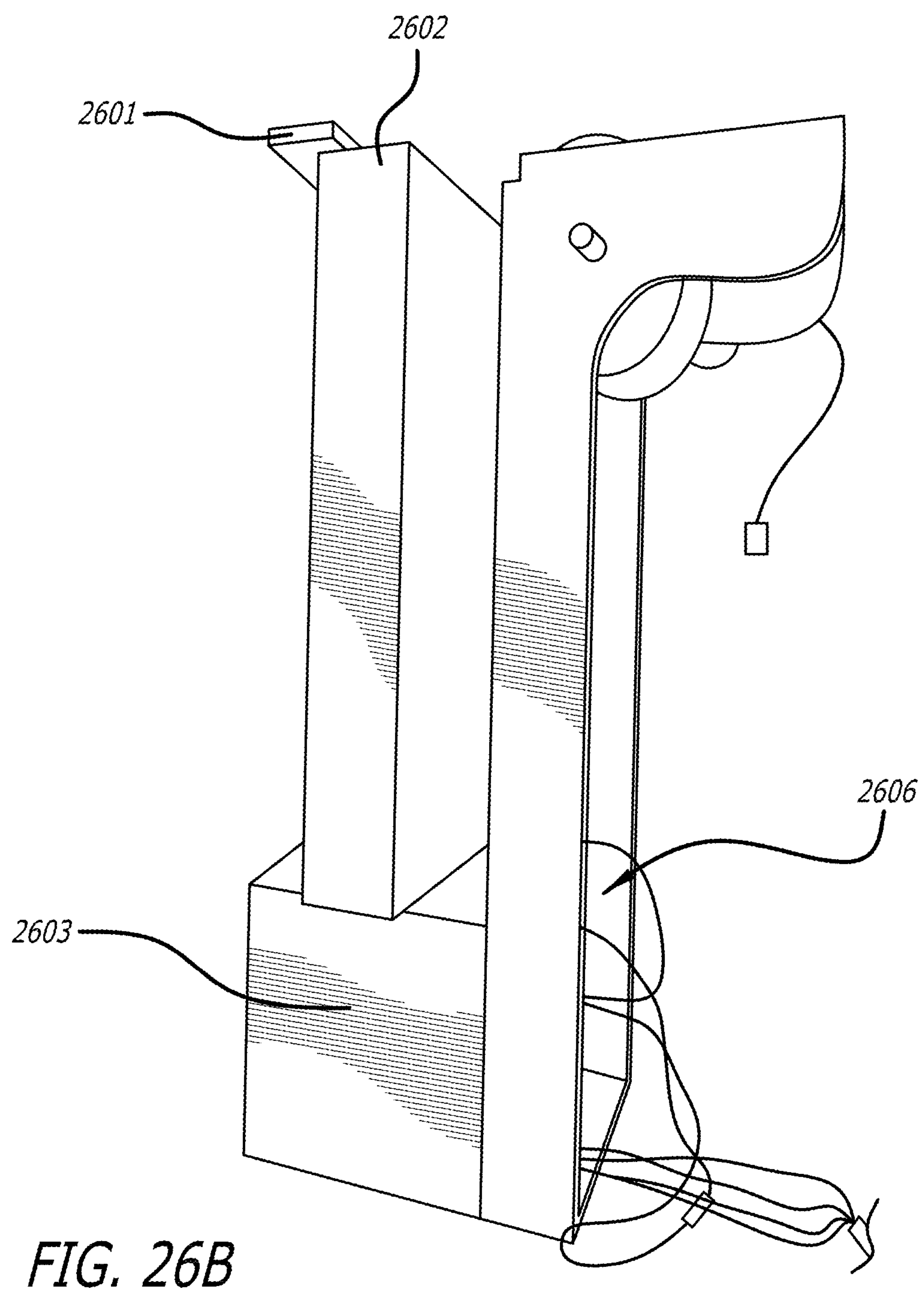
Figure 26C:
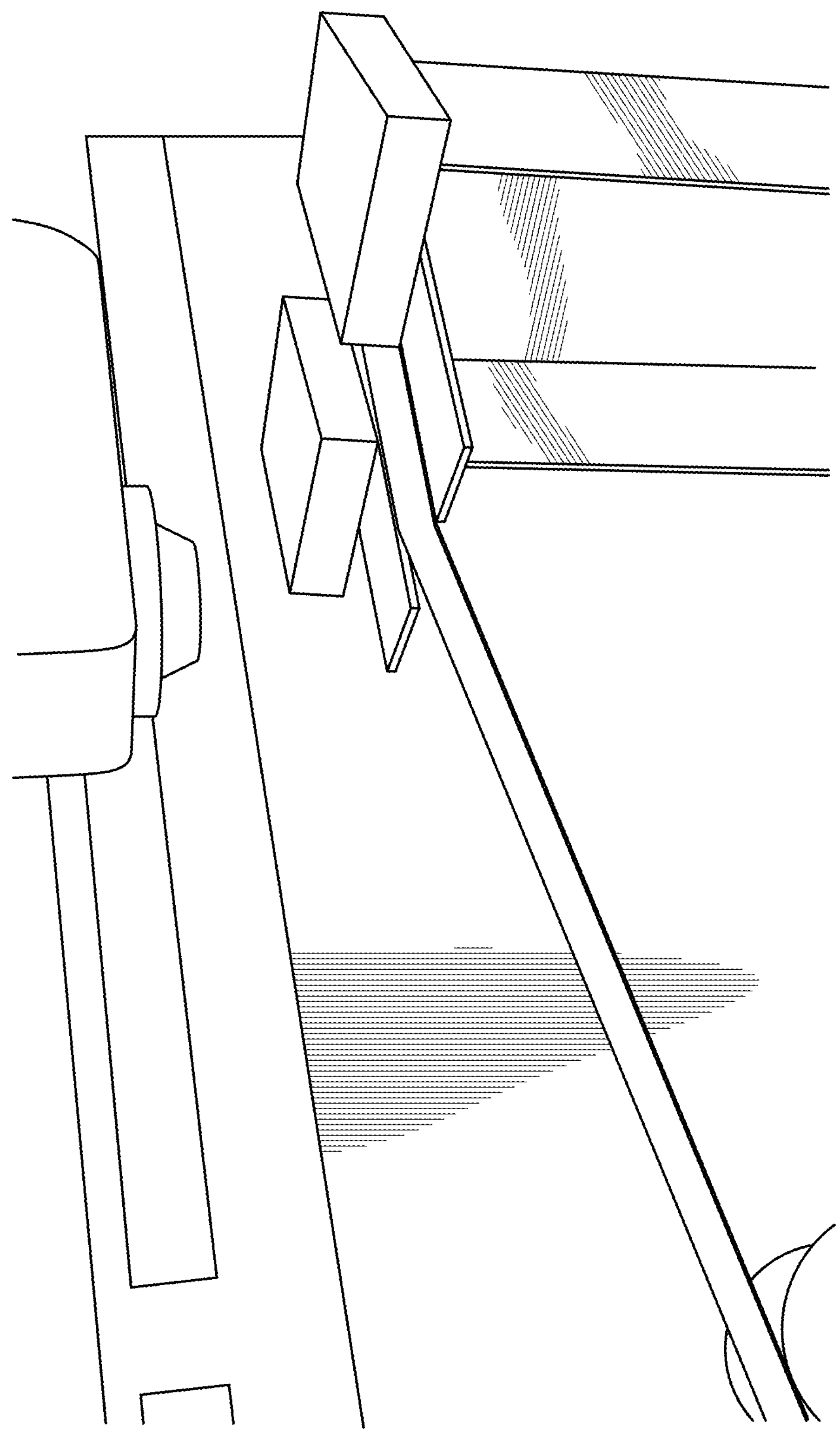
FIG. 26C is an image of an automated LOM process to make 3D LIG or LIGS.
Figure 27F:
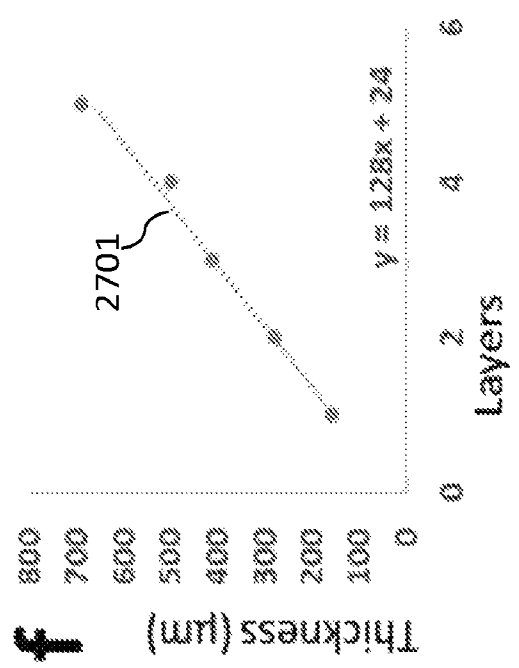
FIG. 27F is a graph showing the thickness of the 3D printed LIG versus the number of 3D printed layers.

An embodiment of an automated LOM system that interfaces with a laser system is shown in FIGS. 26A-26C. The automated LOM system includes of a sample platform 2601 attached to a linear stage 2602 in z-axis driven by a stepper motor 2603 (located inside the box), rollers 2604 to feed PFLIG layers 2605, and a control board 2606 (such as an Arduino control board), which is attached to, and drives, the stepper motor 2603.

The automated LOM process of the system shown in FIGS. 26A-26C is:

(1) A roll of PI with LIG embedded is made with the LIG pattern equally spaced apart.

(2) Base LIG is made manually and placed on the sample platform.

(3) The roll of LIG-embedded PI is coated with ethylene glycol and fed into the roller.

(4) The platform is raised so the roll is sandwiched to the base.

(5) The laser focuses and is applied to the sandwiched PI.

(6) After the layer is completely converted to LIG, the platform is lower by z-axis linear stage, the roller moves to the next pattern, and the platform is raised to a new height, adjusting to the new3D structure.

(7) The laser starts again and repeats the automation to desire layer number.

3D LIG and 3D LIGS

Referring to FIGS. 25B-25J, 3D LIG was prepared from three increasing thicknesses of PI films (25.4 μm, 50.8 μm, and 128 μm) and the different LIG structure was analyzed for each thickness. With the thinnest PI (25.4 μm), the converted LIG had a graphitic, sheet-like structure, similar to previously 2D LIG structures. See FIG. 25B. Use of the thickest PI (128 μm) resulted in LIGS dominated morphology, indicated by the fibrous structure. See FIG. 25C. The middle thickness PI (50.8 μm) resulted in a hybrid LIG/LIGS structure, where there were short but fibrous structures.

Figure 25D:
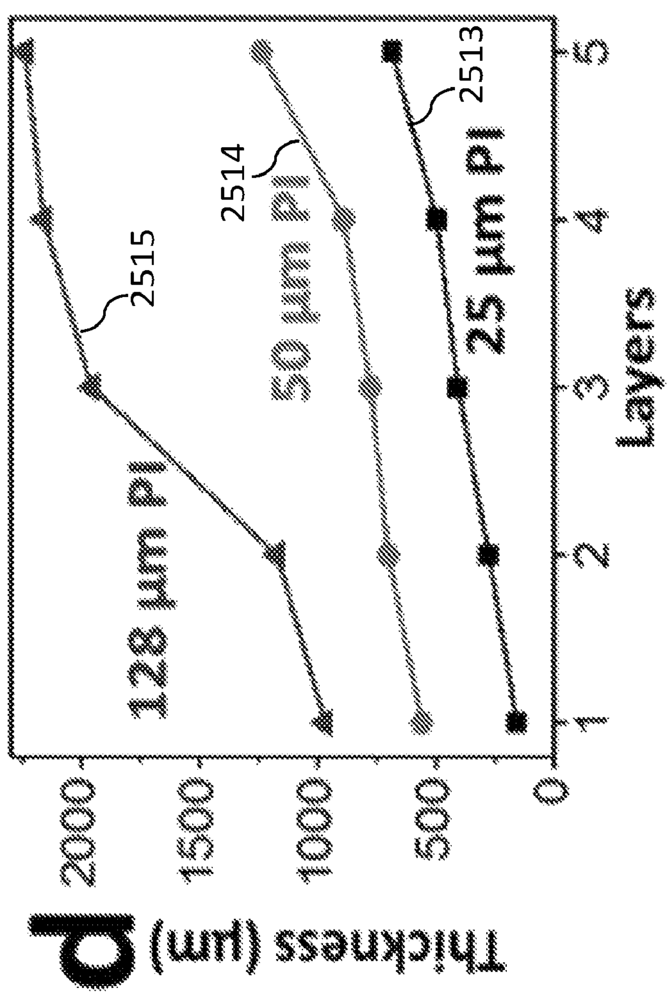
FIG. 25D is a graph showing the thickness of printed LIG/LIGS with various PI layers.
Figures 25E, 25F:
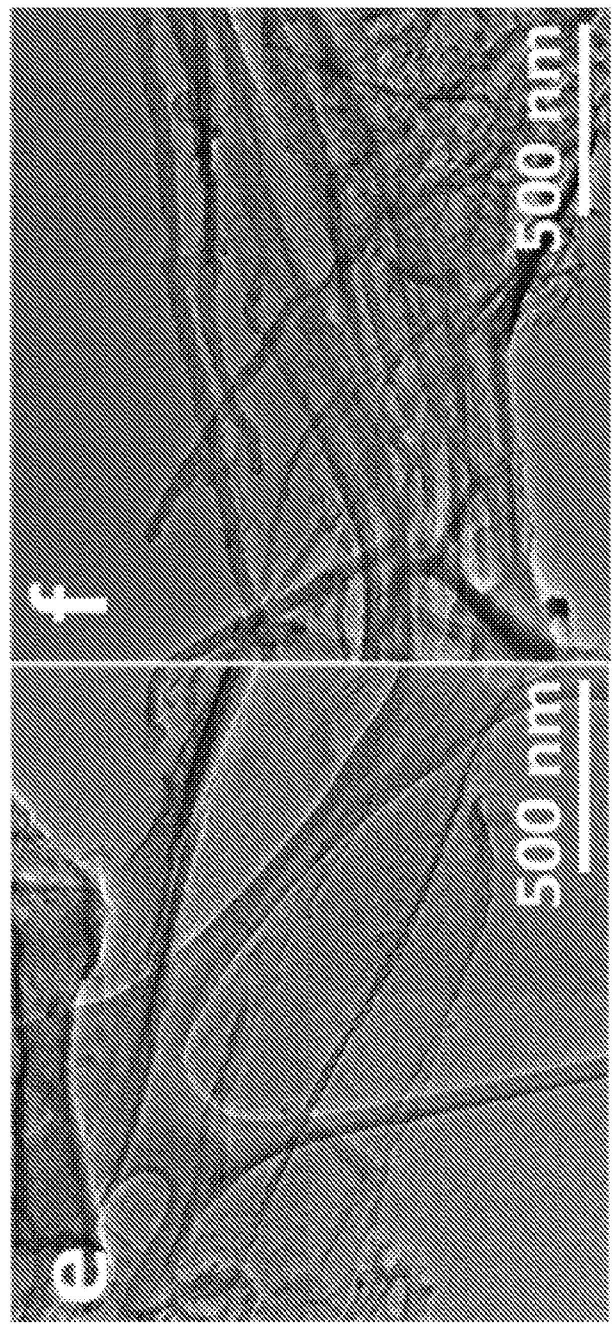
FIGS. 25E-25F are TEM images of 3D printed LIG and 3D printed LIGS, respectively.

The three different PI thicknesses also resulted in increasing thicknesses of resultant structures. FIG. 25D shows that the thicker PI generated thicker structure per layer. Per plots 2513-2515 (for increasing thickness by layers for the 25.4 μm PI, 50.8 μm PI, and 128 μm PI, respectively) the increase of thickness per layer was (a) ~130 μm for the 25.4 μm PI, (b) ~150 μm for the 50.8 μm PI, and (c) ~350 μm for the 128 μm PI. (For 256 μm PI, thicker formation of LIGS could not be made since the laser consumes the printed LIGS product quicker than the laser conversion of PI into LIGS).

Figure 25G:
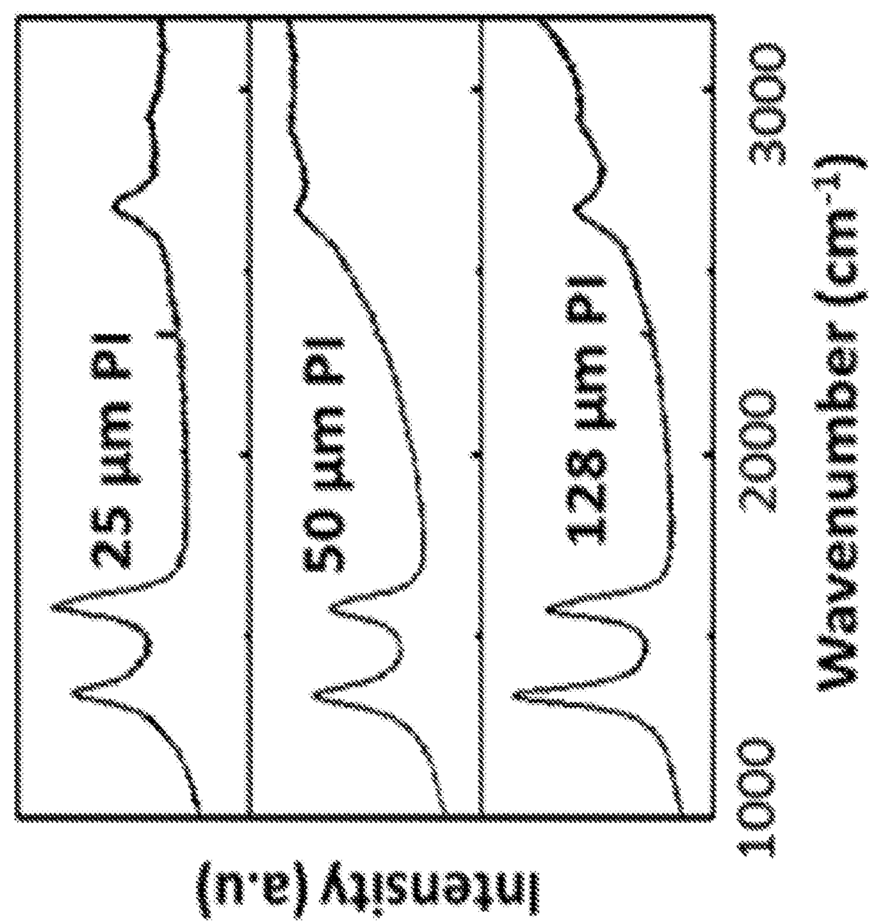
FIG. 25G are Raman spectra of various 3D printed LIG/LIGS.

To further confirm the graphitic structure of 3D printed LIG and LIGS, TEM and Raman are employed, which are shown in FIGS. 25E-25I. In the TEM images of FIG. 25E-25F, LIG and LIGS were respectively observed with sheet-like structure and fibrous structure that agree well with the corresponding SEM images of FIGS. 25B-25C. In FIG. 25G, the Raman spectra show strong 2D peak with high D/G ratio, indicating the graphene structure with defects.

Figures 25H, 25I:
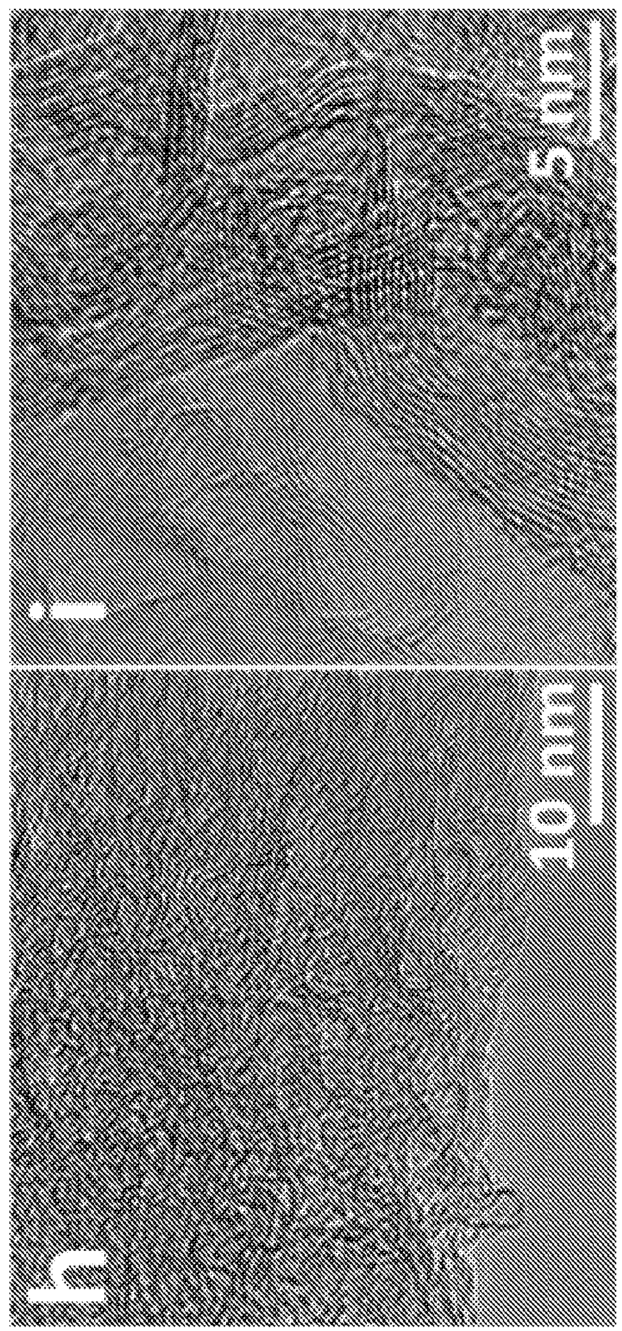
FIGS. 25H-25I are HRTEM images of 3D printed LIG. And 3D printed LIGS.

The HRTEM image of FIG. 25H shows that the LIG structure is full of folds. The HRTEM image of FIG. 25I shows that LIGS has a graphitic ordered or "scroll-like" structure that agrees with the SEM image of FIG. 25C.

Figure 25J:
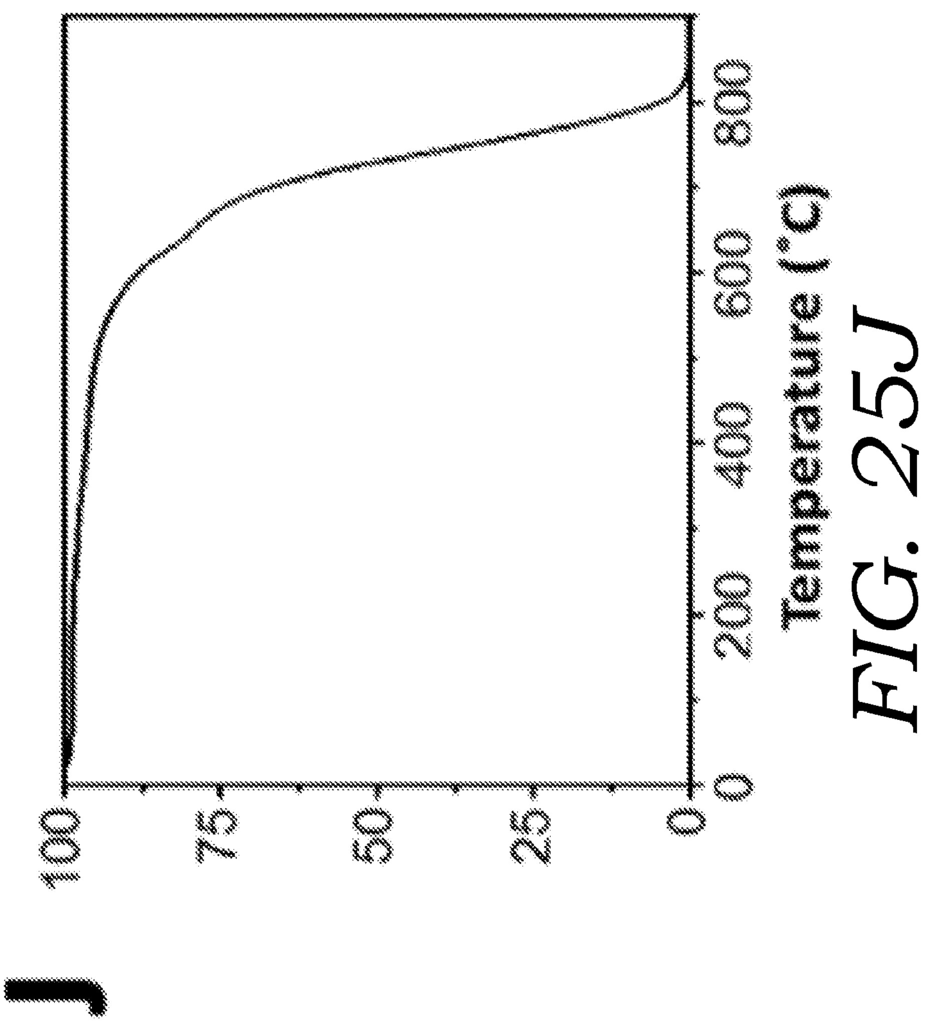
FIG. 25J is a thermal gravimetric analysis (TGA) of 3D LIG.

Purity of the printed LIG was analyzed using thermal gravimetric analysis. In FIG. 25J, there was no dip at ~200° C. or ~700° C., which indicates neither the presence of ethylene glycol nor PI was left in the LIG. XPS showed a high content of N and O doping from vaporized ethylene glycol in 3D LIG and higher in 3D LIGS.

Figures 28A, 28B:
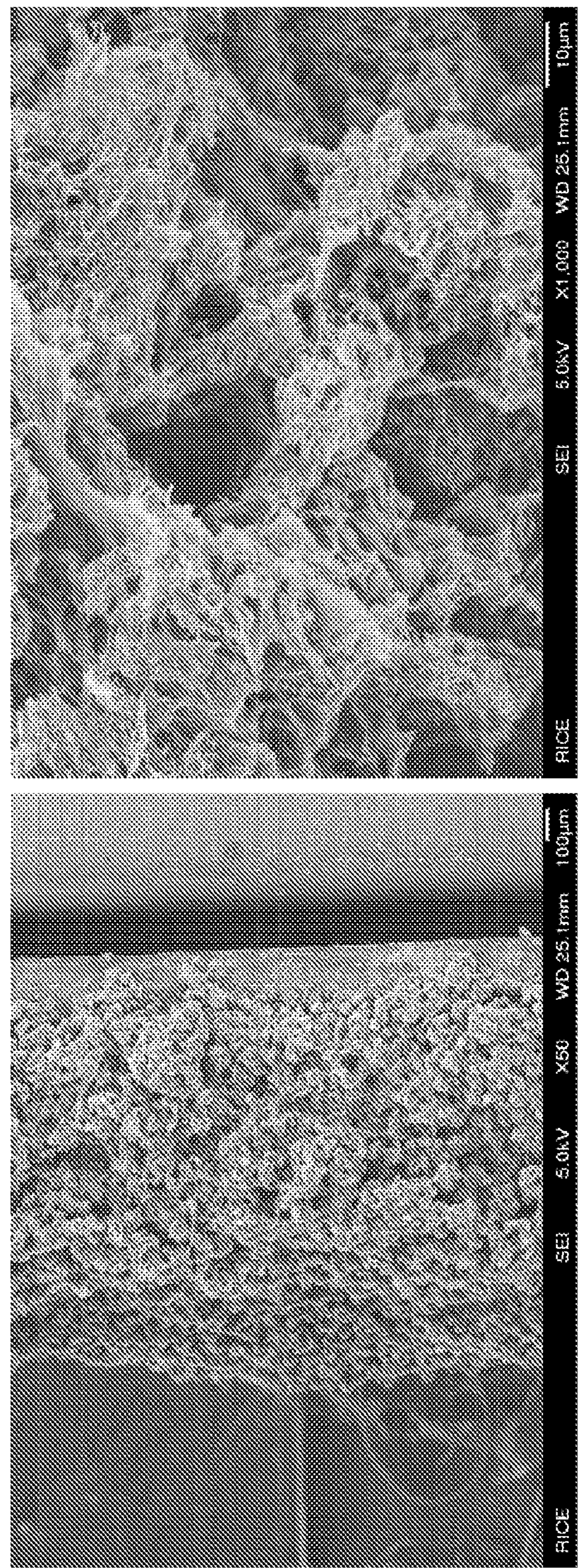
FIG. 28A-28B are SEM images of 3D printed LIG.
Figure 29F:
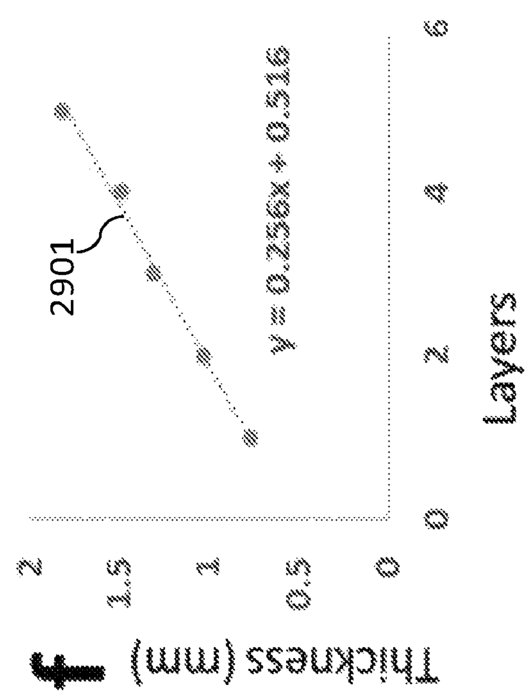
FIG. 29F is a graph showing the thickness of the 3D printed LIGS versus the number of 3D printed layers

FIGS. 27A-27E are SEM images of cross-sections of 3D printed LIG with, respectively, 1-5 3D printed layers (utilizing the LOM process described above). Each of these layers added approximately 130 μm, which is shown by the slope of plot 2701 in FIG. 27F. As shown in FIG. 28A, with nine layers, the 3D printed LIG was able to achieve a thickness of greater than 1 mm. FIG. 28B reflects that the LIG of this 3D printed LIG maintained its porous structure.

As discussed above, the 3D printing process 2500 can also be used utilizing LIGS alternatively or in addition to LIG. For example, for LIGS, the process 2500 can be the same as described above with the following changes:

The scheme process 2500 with LIGS only with different laser parameter.

Printing polyimide substrate 2507 is pre-LIGS on one side with 10% duty cycle.

The polyimide substrate 2507 is LIGS with 11% duty cycle.

The laser is refocused on the other side of the thin substrate 2510 and the thin layer of LIGS 2511 with an 11% duty cycle.

It should also be noted that, for LIGS, a duty cycle greater than 15% will mill the LIGS, and utilizing a duty cycle lower than 10% or a defocused laser will typically result in layer of LIGS that will not properly adhere to the other LIGS substrate.

Figure 30B:
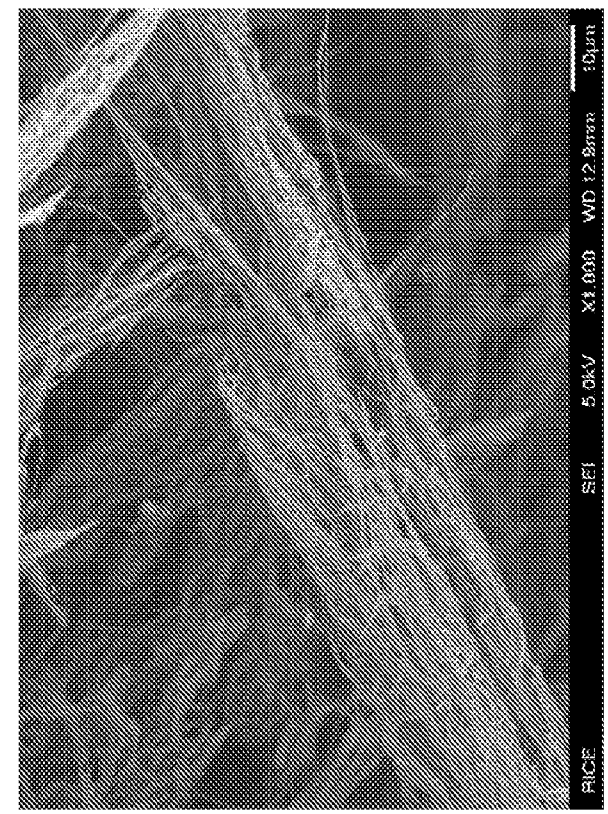
FIG. 30A-30B are SEM images of 3D printed LIG.
Figure 30A:
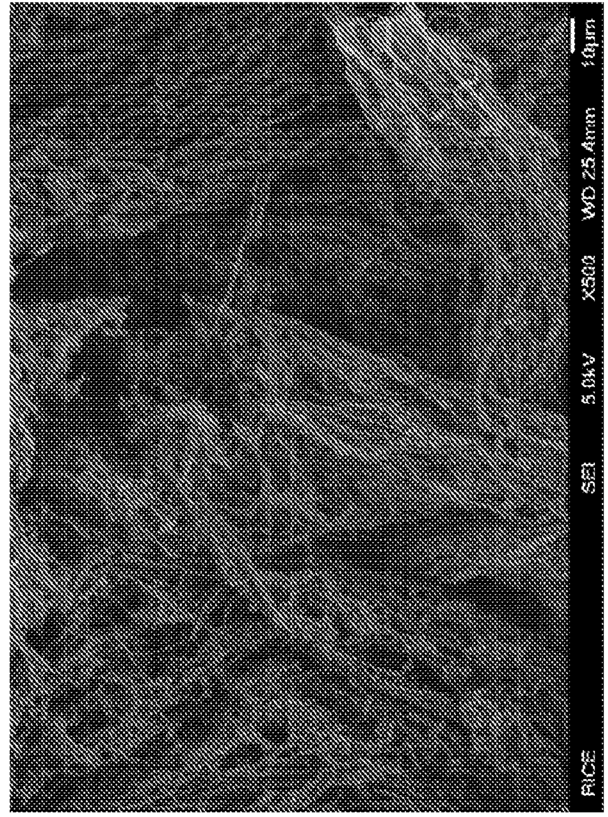

FIGS. 29A-29E are SEM images of cross-sections of 3D printed LIGS with, respectively, 1-5 3D printed layers (utilizing the LOM process described above). Each of these layers added approximately 250 μm (to an original approximate 500 μm base), which is shown by the slope of plot 2901 in FIG. 29F. As shown in FIG. 30A the 3D structure of LIGS included vertical growth of LIGS bundles supporting each other. FIG. 30B reflects that the LIGS of this 3D printed LIGS maintained its original porous structure.

Mechanical Properties

The mechanical properties of the LIG and LIGS produced from the 3D printing process was analyzed. Upon drying the LIG showed no perceptible shrinkage and was free-standing even with a porosity of 98%. The LIG could be picked up with tweezers without breaking and was flexible even when large and thin.

Using such process to print 3D LIGS, a 5×5×4 mm LIGS cube was fabricated. The mass, density, and porosity of this LIGS cubes was ~2.7 mg, ~30 mg/cm$^3$, and ~1.3%, respectively. FIGS. 31A-31E are optical images taken during a stress test for the LIGS cube. As shown in FIGS. 31A-31C, upon application of a 20 kPa (50 g) weight, there was little to no deformation, i.e., after the 20 kPa was applied and removed, the LIGS cube returned to its original shape. As shown in FIGS. 31D-31E, upon application and removal of a 40 kPa (100 g) weight, the cube had permanent deformation, which was approximately 1 mm of permanent compression in the same direction as the applied forces.

Figure 31F:
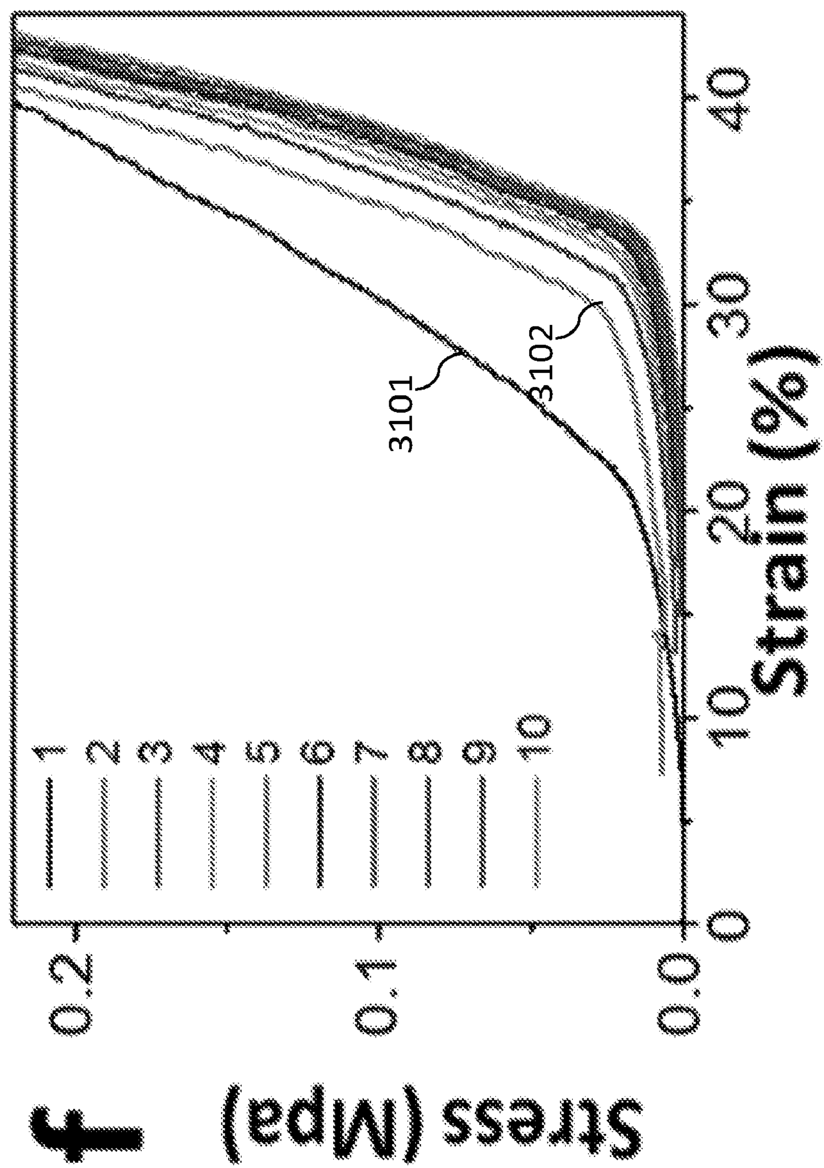
FIG. 31F is a stress-strain test for a LIG/PDMS composite.

As shown in FIG. 31F, after the first cycle of the compression test (plot 3101), the LIG reshaped itself in the compressing direction. From the second cycle (plot 3102) and thereafter, every cycle had the same shape. This indicated good elasticity property with the elastic modulus of 0.4 MPa. Compared to other graphene foams from CVD or GO printing, this elastic modulus number is quite superior.

Thus the 3D printing process of the present invention was shown to maintain the high porosity and stable mechanical properties of the LIG and LIGS.

Coupling Process with Laser Removal/Milling Processes

The LOM manufacturing process of the present invention is robust and allows for complex cross-sectional geometries to be printed. Moreover, the process to make 3D objects from LIG and LIGS can be further improved by combining it with the different approaches to form 3D objects discussed above with respect to FIGS. 23A-23F above, including the laser-induced removal of LIG described above. Such laser-induced removal of LIG or other milling techniques can be used for example to address the edge of printed LIG patterns that may have relatively poor resolution.

Figure 32B:
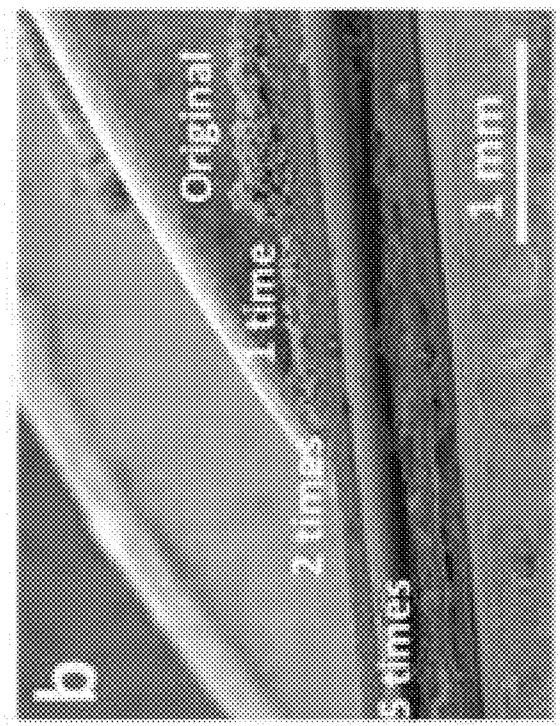
FIG. 32B is an SEM image of a cross-section of the LIG with multiple milling.
Figure 32A:
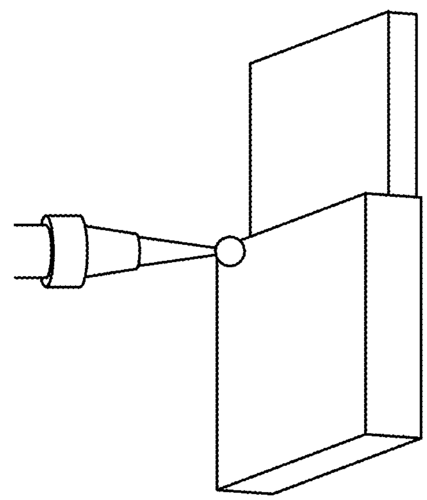
FIG. 32A is a schematic for the milling with fiber laser used to mill LIG made by 3D printing process.

For high resolution of printing, fiber lasing was employed to mill (or ablate) the bulk LIG produced using the 3D printing process. FIG. 32A is a schematic for the milling with a fiber laser. The fiber laser utilized had a 1.06 μm wavelength and peak power of 50 W. As discussed above, LIG has high absorption at 1.06 μm resulting in the local heating and ablation of LIG. However, PI is transparent to 1.06 μm, so the applied laser neither destroyed nor carbonized the substrate. Thus, the fiber laser milled the LIG structure to the desired thickness by tuning the output average power.

Figure 32C:
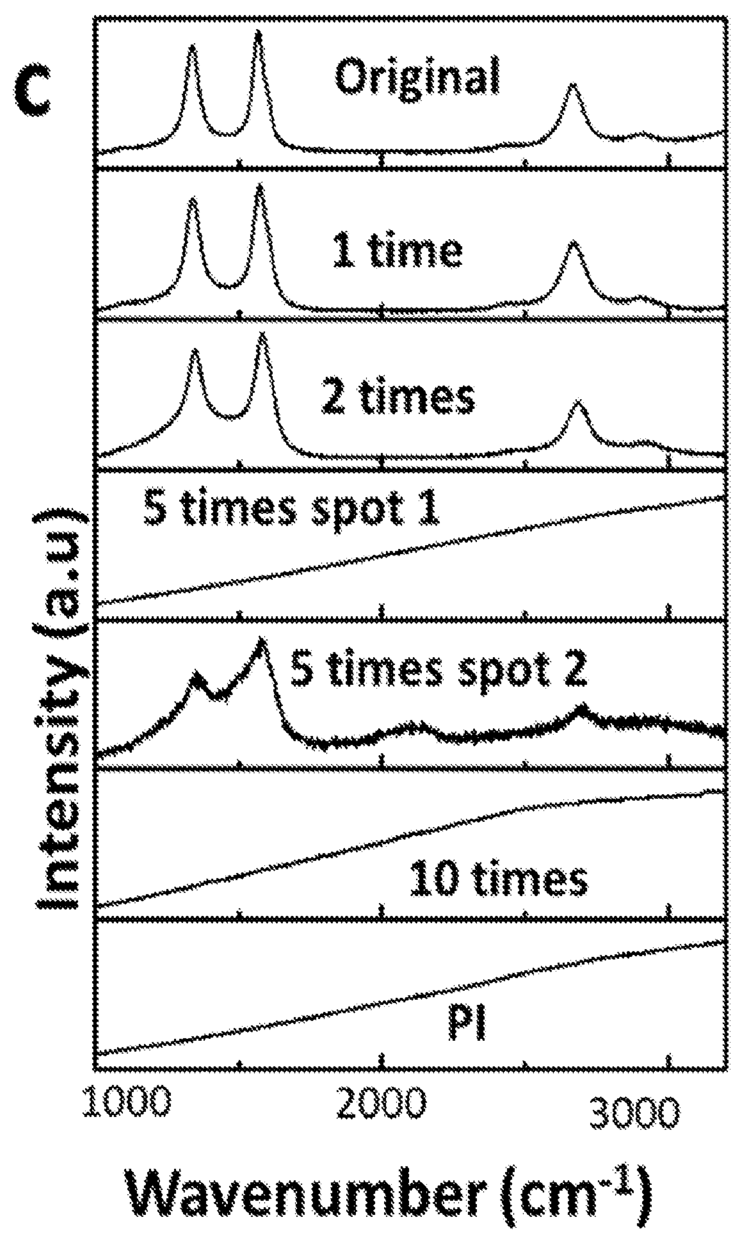
FIG. 32C is a Raman spectra of the LIG with multiple milling.

The fluence and the ablation thickness nearly increased linearly with respect to each other with the rate of 2.5 μl/J. As shown in FIG. 32B, using the fluence of 6 $J/cm^2$, LIG is gradually thinned by multiple laser milling scans. These results are shown by the Raman spectra of FIG. 32C, which shows that at 5 times of milling, the PI starts to appear and, at 10 times milling, the completion of LIG removal is reached. Interestingly, the Raman spectra show no difference between a single application and multiple applications of laser milling. This indicates that the fiber laser only locally ablates the LIG while keeping its disordered graphene structure.

Figures 32D, 32E:
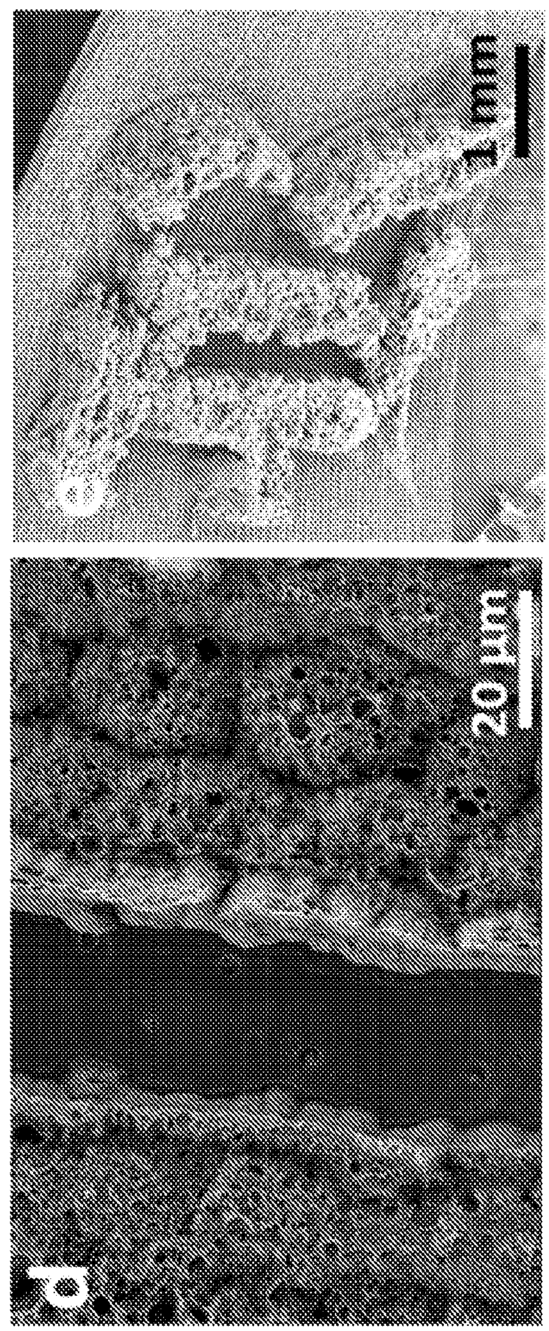
FIG. 32D is an SEM image after complete removal of the LIG with single line of fiber laser (resolution is observed with 20 μm).
FIG. 32E is an SEM image of an "R" letter made from 3D LIG with fiber laser tailoring.

This 1.06 μm fiber laser has a theoretical resolution limit 10 times better than the 10.6 μm laser. In the system being utilized, the LIG fabricated through the $CO_2$ laser process had a resolution of ~75 μm. Both the fiber laser and the $CO_2$ laser share the same commercial optic system that was optimized for the $CO_2$ laser. To determine the resolution of the fiber laser, LIG was removed by a single raster line. After multiple laser treatment, the LIG was completely removed, revealing the PI substrate, as shown in FIG. 32D. The width of the line was the resolution of the fiber laser, which was found to be ~30 μm. Resolution can be further focused with adjustment to the optical system.

Figure 33:
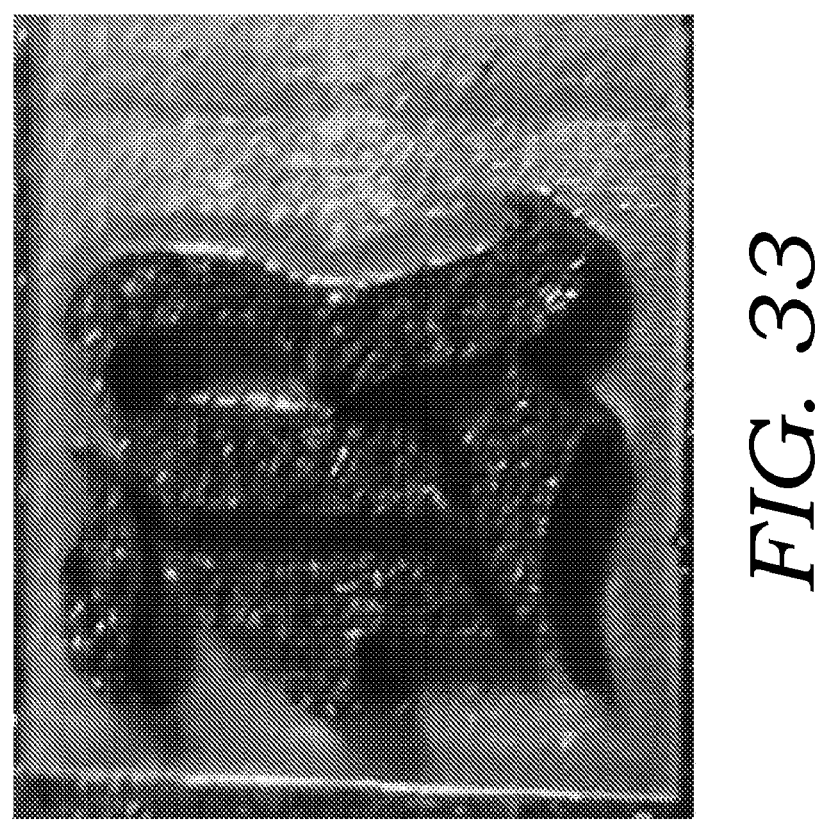

FIG. 32E is an SEM image of an "R" letter made from 3D LIG with fiber laser tailoring. FIG. 33 is an optical image of an "R" letter of LIG made by 3D printing that was combined with precise removal of LIG/LIGS structure with high resolution.

3D printing of LIG and/or LIGS using a LOM process is important as previous LIG thickness has been limited to 50 μm. Hence, these 3D printing techniques increase the thickness of LIG with available commercial methods to build thick 3D objects of any size and shape. Moreover, this process does not require a vacuum or special environment and can be based upon available commercial materials and systems.

Conductivity

Figure 34B:
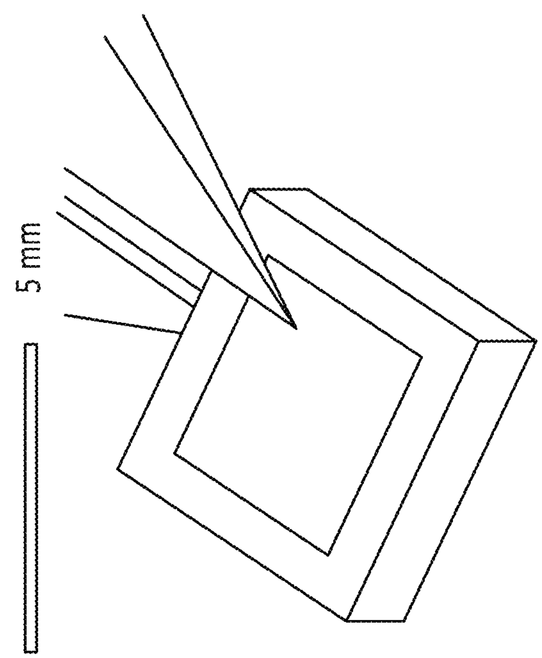
FIGS. 34A-34B are, respectively, a schematic and image of a surface conductivity measurement utilizing LIG made by 3D printing process.
Figure 34A:
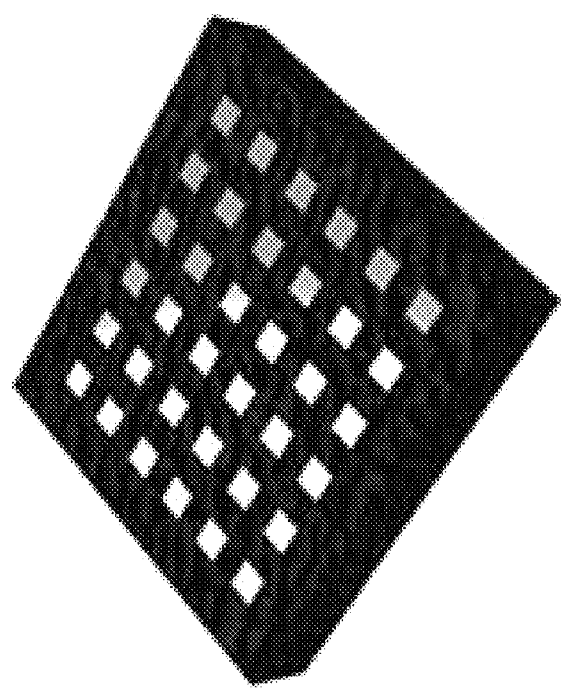

The in-plane conductivity of the 3D LIG was investigated. Platinum contact pads (200 μm·200 μm) were directly deposited on them using a shadow mask by DC sputter (Desk V sputter system, Denton Vacuum). These are shown in FIGS. 34A-34B. 3D LIG that had been fabricated on PI substrates with different layer thickness (25, 50, and 125 μm) were measured using a semiconductor device analyzer (B1500A, Agilent Technologies).

Figure 34C:
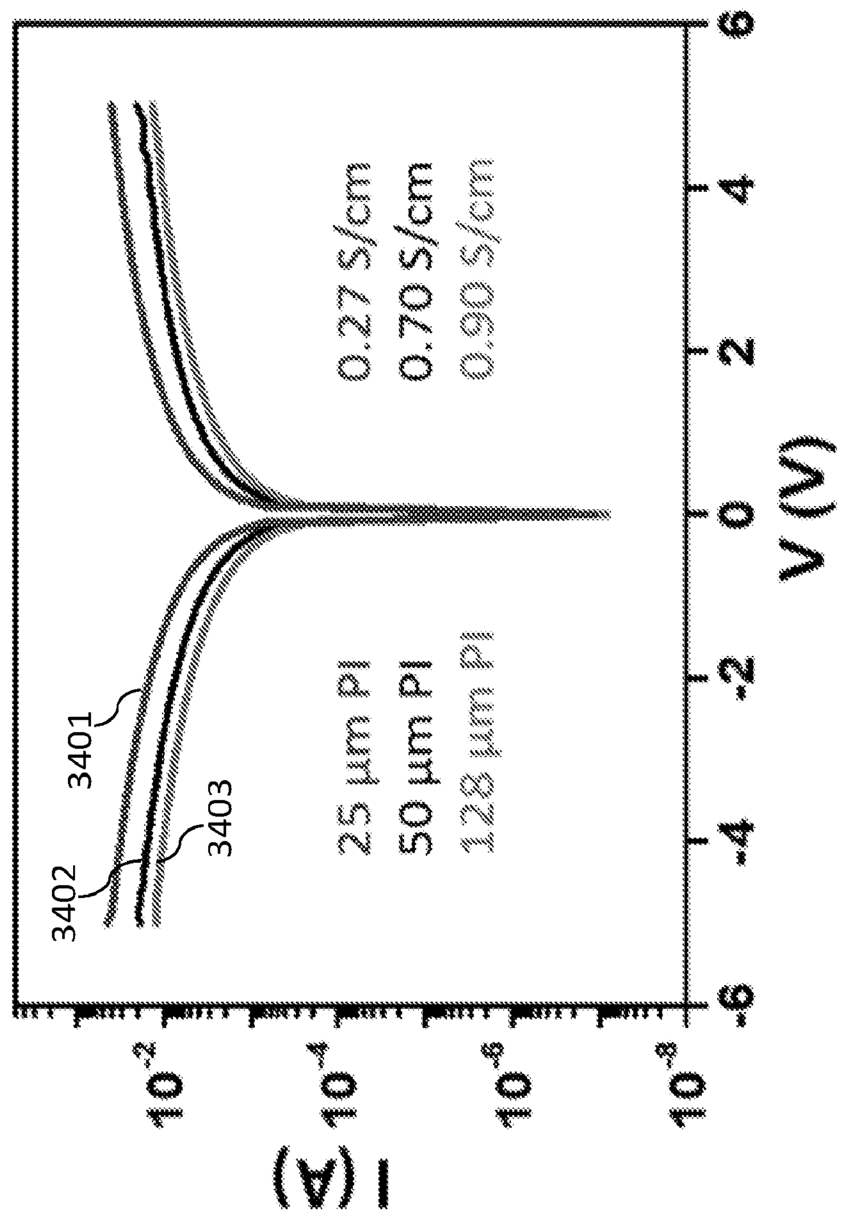
FIG. 34C is an I-V curve for 3D printed LIG with various PI layer thickness.

The conductivity ($\sigma = I\sigma l/V \cdot A$) was calculated from total 30 different points of the sample, where l and A are the distance and cross-sectional area between the contact pads, respectively. As shown in plots 3401-3403 of FIG. 34C, the average conductivities of the samples with the PI thicknesses of 25, 50, and 125 μm were 0.27±0.15, 0.70±0.20, and 0.90±0.19 S $cm^{-1}$, respectively. This conductivity is comparable to other graphene aerogels that fabricated specifically for high conductivity.

Performance

The 3D LIG performance was tested as a lithium ion supercapacitor (LIC) electrode. The electrochemical characterizations of LIG electrodes as Li-ion capacitors were made using 2032 coin cells for the half-cells (Li foil used as reference and counter electrode). The cells were tested using a MTI Battery Analyzer. Electrodes were prepared from 3D LIG foams, without the use of binders or current collectors. Celgard 2400 membranes were used as separators and 1.0 M $LiPF_6$ (lithium hexafluorophosphate) in a mixture 50/50 (v/v) of ethylene carbonate:diethyl carbonate (EC:DEC) as the electrolyte. The half cells were tested between 1 and 4.3 V for the cathode and 0.01 and 3 V for the anode. All the cells were assembled in a Ar-filled glovebox with $O_2$ and $H_2O$ content below 2 ppm. To assemble the full supercapacitor, 3D LIG anode and cathode with mass ratio of 5.6:1 were selected.

Figure 35A:
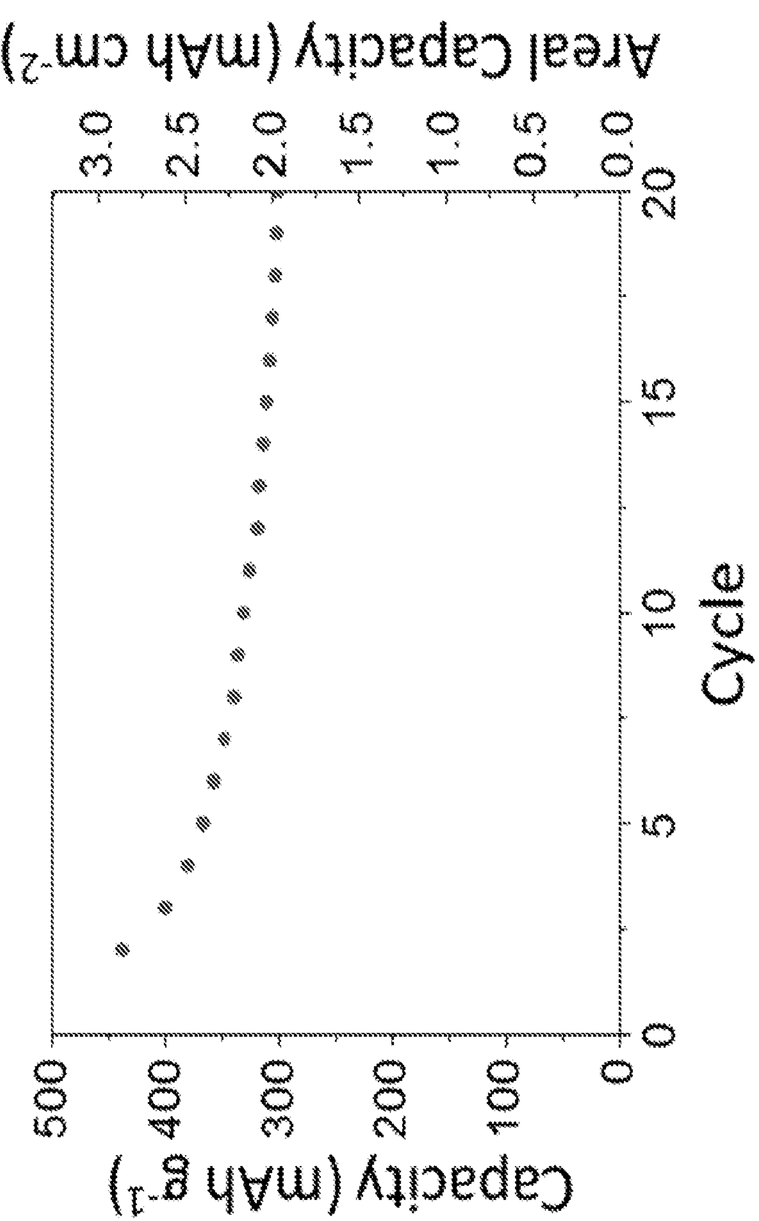
FIGS. 35A-35B are graphs showing cycle performance of a lithium ion supercapacitor half-cell utilizing LIG made by 3D printing process.
Figure 35B:
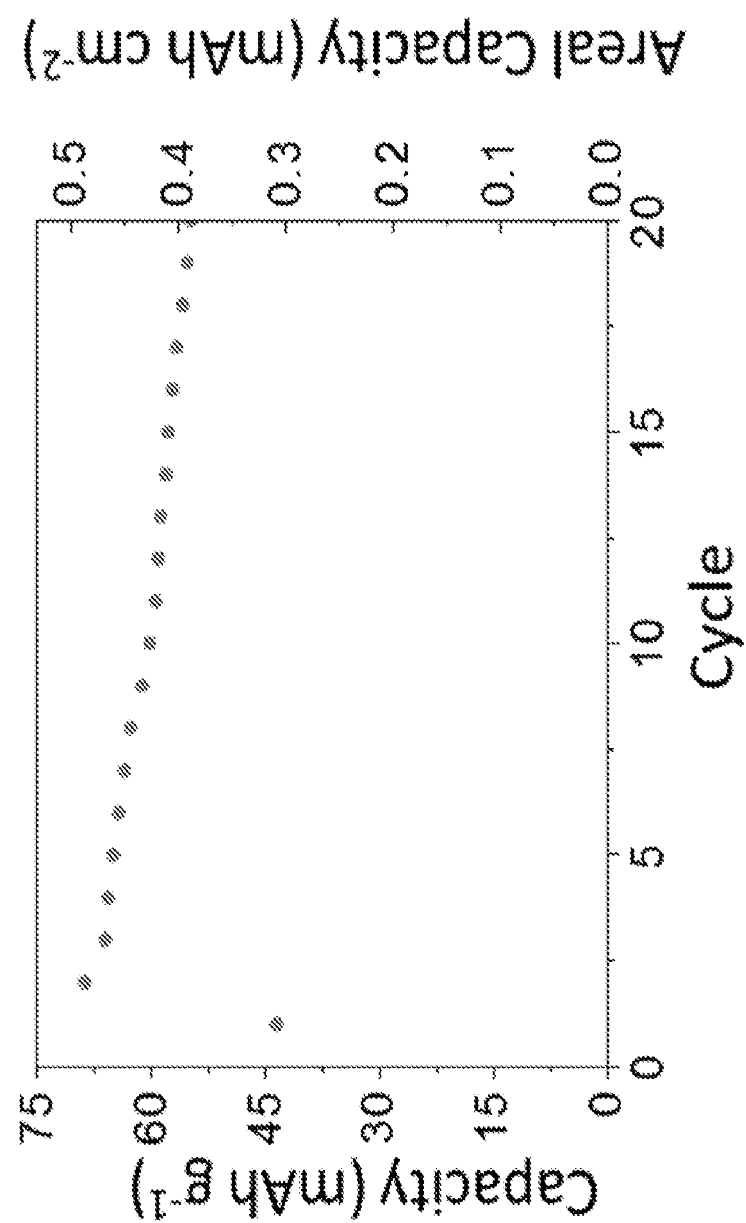

As shown in FIGS. 35A-35B, the anode shows the average capacity close to the theoretical capacity of graphite of 372 mAh/g. Both anode and cathode show stable retention and reversible Li storage.

PDMS/LIG and PDMS/LIGS Composite

Graphene/polymer composite has many potential applications. The present invention further includes composites of a polymer with one or both of LIG and LIGS. A 3D LIG/PDMS composite was fabricated by pouring uncured silicone elastomer and curing agent on top of the LIG. The uncured mixture wet the LIG well. To remove the air inside the LIG, the sample was put inside a vacuum chamber and a vacuum was applied. Air bubbles quickly evolved while the elastomer mixture infiltrated the LIG. After 1 hour, all of the remaining mixture was drained, and then the composite was cured at 60° C. overnight. After curing, the 3D LIG was filled with PDMS.

Figure 36A:
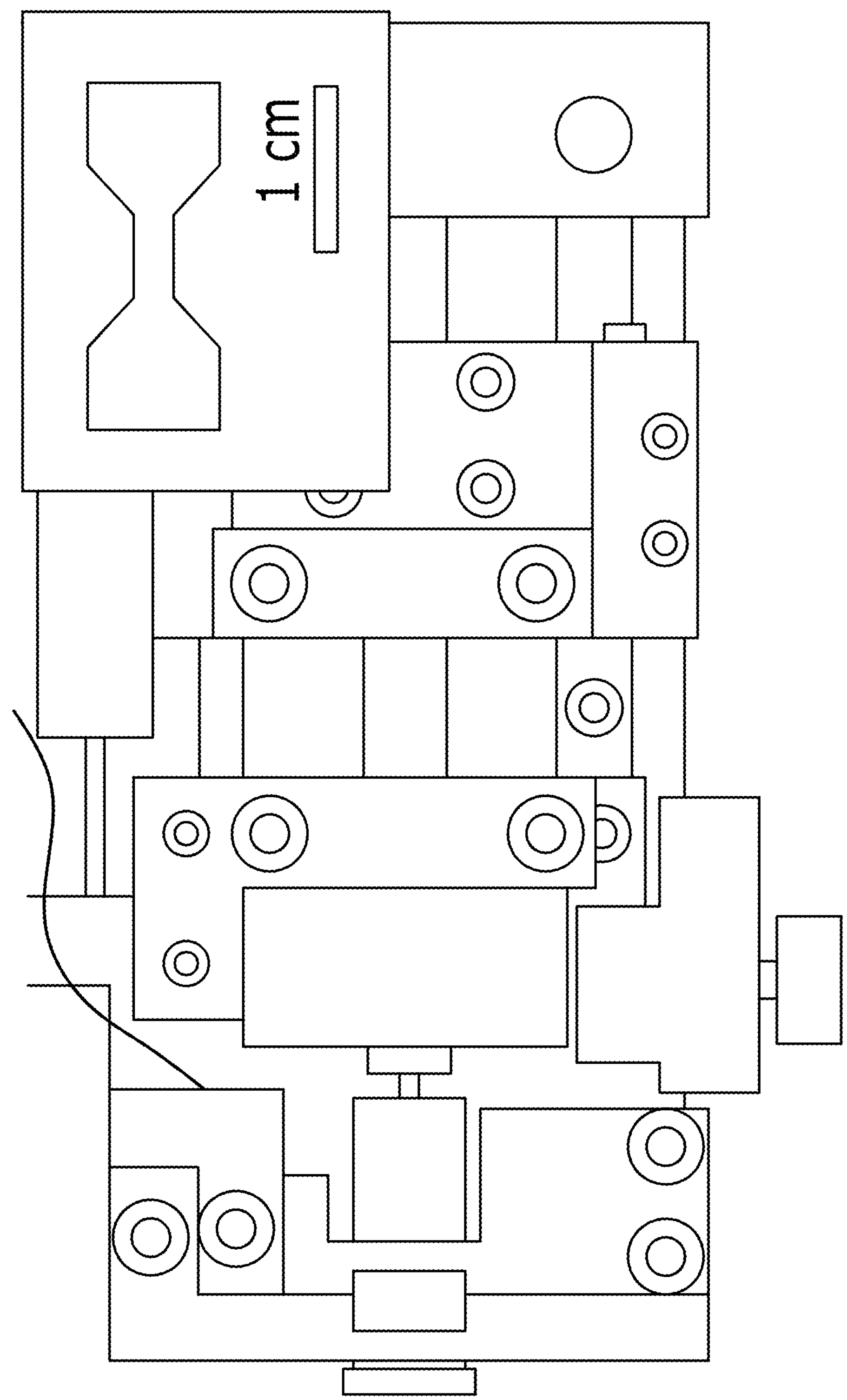
FIG. 36A is an image of stress-strain testing apparatus for the PDMS/LIG composite. The inset is an image of the LIG/PDMS composite (dog-bone shape sample).

The PDMS/LIG composite maintained the shape of the initial 3D LIG. The PDMS/LIG composite was cut into a dog-bone shape (as shown in the inset of FIG. 36A) for the stress-strain test. FIG. 36A is an image of stress-strain testing apparatus for the LIG/PDMS composite.

Figure 36B:
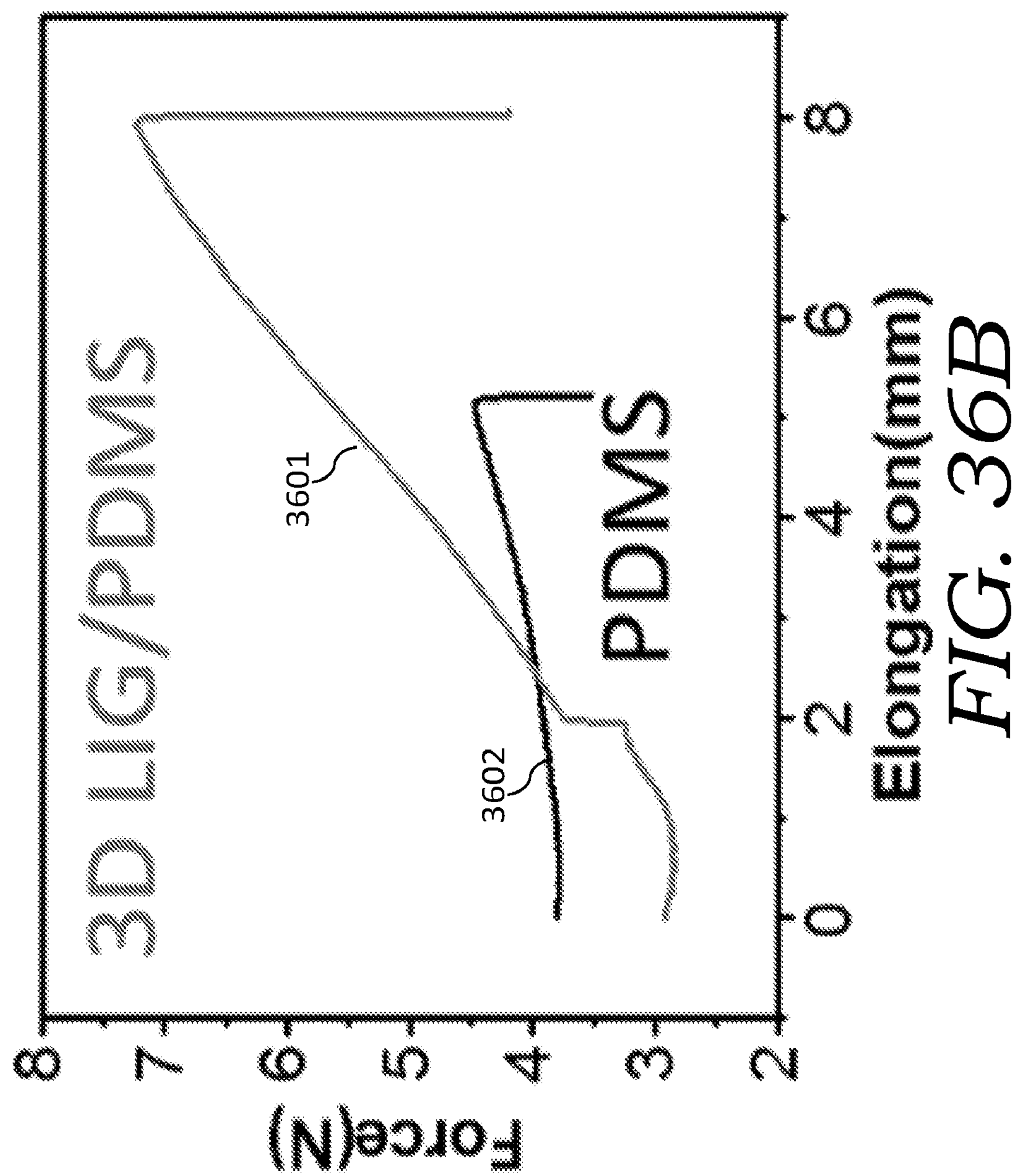
FIG. 36B is a graph comparing the elongation property of the PDMS/LIG composite and PDMS.

The results are shown graphically in FIG. 36B with plots 3601-3602 for the PDMS/LIG composite and PDMS, respectively. These results showed a 7 times increasing in elastic modulus. This further reflects that the utility of the present invention fabrication process for direct printing and infiltration of strength-enhanced polymer composite with 3D LIG (and LIGS).

Further Controls for the LOM Process

Implementations of this 3D printing LOM process can also include:

Use of different polymers (such as for stronger structure).

The use of a controlled atmosphere box to adjust/alter the properties of the final graphene structures.

The use of other gases in the process, such as $O_2$, $SbF_5$, N2, Ar, $H_2$, or mixtures thereof.

The use of thicker PI (or other substrates) can be used.

The process can further include lasing the bottom of the applied PI (or not lasing the bottom), before applying it as the new layer. One can also alternate between such lasing/non-lasing techniques.

Alternating the process with LIG and LIGS.

Adding carbon nanotubes to the graphene precursor materials. For example, carbon nanotubes can be added to the polyimide, which carbon nanotubes can reinforce the 3D printed object. [See Sha 2017 regarding other types of graphene materials].

The starting polymer to make the LIG and LIGS can be selected from a group consisting of polymer films, polymer fibers, polymer monoliths, polymer powders, polymer blocks, optically transparent polymers, homopolymers, vinyl polymers, chain-growth polymers, step-growth polymers, condensation polymers, random polymers, ladder polymers, semi-ladder polymers, block co-polymers, carbonized polymers, aromatic polymers, cyclic polymers, doped polymers, polyimide (PI), polyetherimide (PEI), polyether ether ketone (PEEK), polyamide (PA), polybenzoxazole (PBO), polyaramids, and polymer composites and combinations thereof. For instance, the polyamide (PA) can be Kevlar (and thus can encompass uses for the resulting LIG and LIGS of protection, armor, cryogenics, etc.).

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. Accordingly, other embodiments are within the scope of the following claims. The scope of protection is not limited by the description set out above.

The disclosures of all patents, patent applications, and publications cited herein are hereby incorporated herein by reference in their entirety, to the extent that they provide exemplary, procedural, or other details supplementary to those set forth herein.

Concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of approximately 1 to approximately 4.5 should be interpreted to include not only the explicitly recited limits of 1 to approximately 4.5, but also to include individual numerals such as 2, 3, 4, and sub-ranges such as 1 to 3, 2 to 4, etc. The same principle applies to ranges reciting only one numerical value, such as "less than approximately 4.5," which should be interpreted to include all of the above-recited values and ranges. Further, such an interpretation should apply regardless of the breadth of the range or the characteristic being described.

Unless defined otherwise, all technical and scientific terms used herein have the same meaning as commonly understood to one of ordinary skill in the art to which the presently disclosed subject matter belongs. Although any methods, devices, and materials similar or equivalent to those described herein can be used in the practice or testing of the presently disclosed subject matter, representative methods, devices, and materials are now described.

Following long-standing patent law convention, the terms "a" and "an" mean "one or more" when used in this application, including the claims.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that can vary depending upon the desired properties sought to be obtained by the presently disclosed subject matter.

As used herein, the term "about," when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

REFERENCES

Allen, M. J. et al. Honeycomb Carbon: A Review of Graphene. *Chem. Rev.* 2009, 110, 132-145 ("Allen 2009").

Baughman, R. H. et al. Carbon Nanotubes—the Route toward Applications. *Science.* 2002, 297, 787-792 ("Baughman 2002").

Bonaccorso, F. et al. Graphene, Related Two-Dimensional Crystals, and Hybrid Systems for Energy Conversion and Storage. *Science.* 2015, 347 ("Bonaccorso 2015").

Cao, Q. et al. Arrays of Single-Walled Carbon Nanotubes with Full Surface Coverage for High-Performance Electronics. *Nat Nano* 2013, 8, 180-186 ("Cao 2013").

De Volder, M. F. L. et al. Carbon Nanotubes: Present and Future Commercial Applications. *Science.* 2013, 339, 535 LP-539 ("De Volder 2013").

El-Kady, M. F. et al. Scalable Fabrication of High-Power Graphene Micro-Supercapacitors for Flexible and on-Chip Energy Storage. *Nat. Commun.* 2013, 4, 1475 ("El-Kady 2013").

Ferrari, A. Raman Spectroscopy of Graphene and Graphite. *Solid State Commun.* 2007, 143, 47-57 ("Ferrari 2007").

Ferrari, A. C. et al. Raman Spectrum of Graphene and Graphene Layers. *Phys. Rev. Lett.* 2006, 97, 1-4 ("Ferrari 2006").

Habisreutinger, S. N. et al. Carbon Nanotube/Polymer Composites as a Highly Stable Hole Collection Layer in Perovskite Solar Cells. *Nano Lett.* 2014, 14, 5561-5568 ("Habisreutinger 2014").

Hata, K.; Futaba et al. Water-Assisted Highly Efficient Synthesis of Impurity-Free Single-Walled Carbon Nanotubes. *Science.* 2004, 306, 1362-1364 ("Hata 2004").

Heinze, S. et al. Carbon Nanotubes as Schottky Barrier Transistors. *Phys. Rev. Lett.* 2002, 89, 106801 ("Heinze 2002").

Hu, K. et al. Graphene-Polymer Nanocomposites for Structural and Functional Applications. *Prog. Polym. Sci.* 2014, 39, 1934-1972 ("Hu 2014").

Iijima, S. Helical Microtubules of Graphitic Carbon. *Nature* 1991, 354, 56-58 ("Iijima 1991").

Inagaki, M. et al. Carbonization and Graphitization of Polyimide Film "Novax." *Carbon N. Y.* 1991, 29, 1239-1243 ("Inagaki 1991").

Inagaki, M. et al. Carbonization of Polyimide Film "Kapton." *Carbon N. Y.* 1989, 27, 253-257 ("Inagaki 1989").

Jariwala, D. et al. Carbon Nanomaterials for Electronics, Optoelectronics, Photovoltaics, and Sensing. *Chem. Soc. Rev.* 2013, 42, 2824-2860 ("Jariwala 2013").

Kaempgen, M. et al. Printable Thin Film Supercapacitors Using Single-Walled Carbon Nanotubes. *Nano Lett.* 2009, 9, 1872-1876 ("Kaempgen 2009").

Kosynkin, D. V et al. Longitudinal Unzipping of Carbon Nanotubes to Form Graphene Nanoribbons. *Nature* 2009, 458, 872-876 ("Kosynkin 2009").

Kroto, H. W. et al. C60: Buckminsterfullerene. *Nature* 1985, 318, 162-163 ("Kroto 1985").

Li, L. et al. High-Performance Pseudocapacitive Microsupercapacitors from Laser-Induced Graphene. *Adv. Mater.* 2016, 28, 838-845 ("Li 2016").

Li, Y et al. Laser-Induced Graphene in Controlled Atmospheres: From Superhydrophilic to Superhydrophobic Surfaces. *Adv. Mater.* 2017, 201700496—n/a ("Li 2017").

Lin, J. et al. Laser-Induced Porous Graphene Films from Commercial Polymers. *Nat. Commun.* 2014, 5, 1-8 ("Lin 2014").

Liu, C.-H. et al. Graphene Photodetectors with Ultra-Broadband and High Responsivity at Room Temperature. *Nat Nano* 2014, 9, 273-278 ("Liu 2014").

Marcano, D. C. et al. Improved Synthesis of Graphene Oxide. *ACS Nano* 2010, 4, 4806-4814 ("Marcano 2010").

Mittal, G. et al. A Review on Carbon Nanotubes and Graphene as Fillers in Reinforced Polymer Nanocomposites. *J. Ind. Eng. Chem.* 2015, 21,11-25 ("Mittal 2015").

Novoselov, A. K. et al. Electric Field Effect in Atomically Thin Carbon Films. *Science.* 2013, 666, 666-669 ("Novoselov 2013").

Palejwala, A. H. et al. Biocompatibility of Reduced Graphene Oxide Nanoscaffolds Following Acute Spinal Cord Injury in Rats. *Surg. Neurol. Int.* 2016, 7, 75 ("Palejwala 2016").

Peng, Z. et al. Flexible and Stackable Laser-Induced Graphene Supercapacitors. *ACS Appl. Mater. Interfaces* 2015, 7, 3414-3419 ("Peng 2015 A").

Peng, Z. et al. Flexible Boron-Doped Laser Induced Graphene Microsupercapacitors. *ACS Nano* 2015, 9, 1-17 ("Peng 2015 B").

Ren, J. et al. Twisting Carbon Nanotube Fibers for Both Wire-Shaped Micro-Supercapacitor and Micro-Battery. *Adv. Mater.* 2013, 25,1155-1159 ("Ren 2013").

Rodrigo, D. et al. Mid-Infrared Plasmonic Biosensing with Graphene. *Science.* 2015, 349, 165 LP-168 ("Rodrigo 2015").

Sahni, D. et al. Biocompatibility of Pristine Graphene for Neuronal Interface *J. Neurosurg. Pediatrics.* 2013, 11, 575-583 ("Sahni 2013").

Scharfman, B. E et al. Visualization of Sneeze Ejecta: Steps of Fluid Fragmentation Leading to Respiratory Droplets. *Exp. Fluids* 2016, 57, 1-9 ("Scharfman 2016").

Schumann, M. et al. Permanent Increase of the Electrical Conductivity of Polymers Induced by Ultraviolet Laser Radiation. *Appl. Phys. Lett.* 1991, 58, 428-430 ("Schumann 1991").

Schwierz, F. Graphene Transistors. *Nat. Nanotechnol.* 2010, 5, 487-496 ("Schweirz 2010").

Sha, J. et al. Three-Dimensional Rebar Graphene. *ACS Appl. Mater. Interf.* 2017, 9, 7376-7384 ("Sha 2017").

Shao, Y. et al. Graphene Based Electrochemical Sensors and Biosensors: A Review. *Electroanalysis* 2010, 22, 1027-1036 ("Shao 2010").

Smith, M. K. et al. Thermal Conductivity Enhancement of Laser Induced Graphene Foam upon P3HT Infiltration. *Appl. Phys. Lett.* 2016, 109, 253107 ("Smith 2016").

Srinivasan et al. Ultraviolet Laser Irradiation of the Polyimide, PMDA-ODA (Kapton™), to Yield a Patternable, Porous, Electrically Conducting Carbon Network. *Synth. Met.* 1994, 66, 301-307 ("Srinivasan 1994").

Sun, Z. et al. Large-Area Bernal-Stacked Bi-, Tri-, and Tetralayer Graphene. *ACS Nano* 2012, 6, 9790-9796 ("Sun 2012").

Yan, Z. et al. Toward the Synthesis of Wafer-Scale Single-Crystal Graphene on Copper Foils. *ACS Nano* 2012, 6, 9110-9117 ("Yan 2012").

Yan, Z. et al. Growth of Bilayer Graphene on Insulating Substrates. *ACS Nano* 2011, 5, 8187-8192 ("Yan 2011").

Ye, R. et al. In Situ Formation of Metal Oxide Nanocrystals Embedded in Laser-Induced Graphene. *ACS Nano* 2015, 9, 9244-9251 ("Ye 2015").

Yoo, E. et al. Large Reversible Li Storage of Graphene Nanosheet Families for Use in Rechargeable Lithium Ion Batteries. *Nano Lett.* 2008, 8, 2277-2282 ("Yoo 2008").

Zhang, Y. et al. Review of Chemical Vapor Deposition of Graphene and Related Applications. *Acc. Chem. Res.* 2013, 46, 2329-2339 ("Zhang 2013").

What is claimed is:

1. A method comprising exposing a graphene precursor material to a laser source to form laser-induced graphene scrolls (LIGS) material, wherein (a) the LIGS material comprises scrolls of graphene;

(b) the LIGS material is derived from the graphene precursor material; and (c) the graphene precursor material comprises a polymer.

2. The method of claim 1, wherein the polymer is selected from a group consisting of polymer films, polymer fibers, polymer monoliths, polymer powders, polymer blocks, optically transparent polymers, homopolymers, vinyl polymers, chain-growth polymers, step-growth polymers, condensation polymers, random polymers, ladder polymers, semiladder polymers, block co-polymers, carbonized polymers, aromatic polymers, cyclic polymers, doped polymers, polyimide (PI), polyetherimide (PEI), polyether ether ketone (PEEK), polyamide (PA), polybenzoxazole (PBO), polyaramids, and polymer composites and combinations thereof.

3. The method of claim 1, wherein the polymer comprises polyimide.

4. The method of claim 1, wherein (a) the step of exposing comprises tuning one or more parameters of the laser source; and (b) the tuning of the one or more parameters of the laser source comprises modifying the laser wavelength so that the laser wavelength is at an absorption band of the graphene precursor material.

5. The method of claim 1, wherein (a) the step of exposing comprises tuning one or more parameters of the laser source; and (b) the one or more parameters of the laser source are selected from a group consisting of laser wavelength, laser power, laser energy density, laser pulse width, gas environment, gas pressure, gas flow rate, direction of gas flow relative to the lasing head, and combinations thereof.

6. The method of claim 1, wherein the laser source has a wavelength ranging from about 20 nm to about 100 μm.

7. The method of claim 1, wherein the laser source comprises near-field scanning optical microscopy.

8. The method of claim 1, wherein the laser source comprises a laser having a beam that is diffused with a lens or series of lenses.

9. The method of claim 8, wherein the laser has a high powered beam that can cover an exposed area that is a large area or line such that the diffused energy has a fluence capable to form the LIGS over the entire exposed area.

10. The method of claim 1, wherein the laser source has a power ranging from about 1 W to about 100 W.

11. The method of claim 1, wherein the polymer comprises a doped polymer.

12. The method of claim 11, wherein the doped polymer comprises a dopant selected from a group consisting of heteroatoms, metals, metal oxides, metal chalcogenides, metal nanoparticles, metal salts, organic additives, inorganic additives, metal organic compounds, and combinations thereof.

13. The method of claim 1, wherein the LIGS material comprises a doped LIGS material.

14. The method of claim 13, wherein the doped graphene comprises a dopant selected from a group consisting of heteroatoms, metals, metal oxides, metal nanoparticles, metal chalcogenides, metal salts, organic additives, inorganic additives, and combinations thereof.

15. The method of claim 1, wherein (a) the laser source has a laser fluence of at least about 20 $J/cm^2$, and (b) the laser source has a wavelength of at least about 9.3 μm.

16. The method of claim 1, wherein the laser source has a laser fluence of more than about 40 $J/cm^2$.

17. The method of claim 1, wherein the LIGS material has a thickness of at least about 20 μm.

18. The method of claim 1, wherein the LIGS material are formed in a one-step laser thermolysis process at a radiation level of at least about 20 $J/cm^2$.

19. The method of claim 1, wherein (a) the laser source is operable above a critical fluence point needed to initiate carbonization of the graphene precursor material; and (b) the critical fluence point of the laser is at least about 5 $J/cm^2$.

20. The method of claim 1, wherein the laser source is a laser that is being operated in raster mode.

21. The method of claim 1, wherein the laser source is a laser that is being operated in vector mode.

22. The method of claim 1, wherein the laser source has a pulse density such that the pulses do not overlap.

23. A method comprising exposing a graphene precursor material to a laser source to form laser-induced graphene scrolls (LIGS) material, wherein (a) the LIGS material comprises scrolls of graphene;

(b) the LIGS material is derived from the graphene precursor material; and (c) the LIGS material comprises nanoscrolls of graphene having an average diameter in a range from about 10 nm to about 500 nm.

24. A method comprising:

(i) exposing a graphene precursor material to a laser source to form laser-induced graphene scrolls (LIGS) material, wherein (a) the LIGS material comprises scrolls of graphene, and (b) the LIGS material is derived from the graphene precursor material; and (ii) incorporating the LIGS material into an electronic device.

25. The method of claim 24, wherein the electronic device comprises an electrode comprising the LIGS material.

26. The method of claim 24, wherein the electronic device is a flexible electronic device.

27. The method of claim 24, wherein the electronic device is an energy storage device or an energy generation device.

28. The method of claim 24, wherein the electronic device is selected from a group consisting of supercapacitors, micro-supercapacitors, pseudo capacitors, batteries, micro batteries, lithium-ion batteries, sodium-ion batteries, magnesium-ion batteries, electrodes, conductive electrodes, sensors, lithium ion capacitors, photovoltaic devices, electronic circuits, fuel cell devices, thermal management devices, biomedical devices, and combinations thereof.

29. The method of claim 24 further comprising a step of associating the electronic device with an electrolyte.

* * * * *